United States Patent
Philips et al.

(10) Patent No.: US 6,597,727 B2
(45) Date of Patent: Jul. 22, 2003

(54) PROGRAMMABLE MODEM APPARATUS FOR TRANSMITTING AND RECEIVING DIGITAL DATA, DESIGN METHOD AND USE METHOD FOR THE MODEM

(75) Inventors: Lieven Philips, Aarschot (BE); Jan Vanhoof, Wijgmaal (BE); Maryse Wouters, Heverlee (BE); Rik De Wulf, Kessel-Lo (BE); Veerle Derudder, Kessel-Lo (BE); Carl Van Himbeeck, Zottegem (BE); Ivo Bolsens, Schoten (BE); Hugo De Man, Kessel-Lo (BE); Bert Gyselinckx, Heverlee (BE)

(73) Assignees: IMEC vzw, Leuven (BE); SAIT Systems, Brussels (BE)

( * ) Notice: Subject to any disclaimer, the term of this patent is extended or adjusted under 35 U.S.C. 154(b) by 0 days.

(21) Appl. No.: 09/972,060

(22) Filed: Oct. 5, 2001

(65) Prior Publication Data

US 2002/0067757 A1 Jun. 6, 2002

Related U.S. Application Data

(60) Continuation of application No. 09/138,162, filed on Aug. 21, 1998, now Pat. No. 6,308,877, which is a division of application No. 08/592,700, filed on Jan. 26, 1996, now Pat. No. 5,872,810.
(60) Provisional application No. 60/066,012, filed on Oct. 23, 1995, and provisional application No. 60/004,785, filed on Oct. 4, 1995.

(51) Int. Cl.[7] .................................................. H04B 1/69
(52) U.S. Cl. ........................ 375/147; 375/316; 375/222
(58) Field of Search ................................. 375/130, 140, 375/147, 222, 316, 324, 345

(56) References Cited

U.S. PATENT DOCUMENTS

| 5,022,047 A | 6/1991 | Dixon et al. |
| 5,144,641 A | 9/1992 | Akazawa et al. |
| 5,235,615 A | 8/1993 | Omura |
| 5,309,474 A | 5/1994 | Gilhousen et al. |
| 5,357,541 A | 10/1994 | Cowart |
| 5,359,625 A | 10/1994 | Vander Mey et al. |

(List continued on next page.)

OTHER PUBLICATIONS

Van Himbeeck, C., et al., "Silicon Integration of a Flexible CDMA/QPSK Mobile Communication Modem", SYMP. DELFT, 1993.

(List continued on next page.)

*Primary Examiner*—Temesghen Ghebretinsae
(74) *Attorney, Agent, or Firm*—Knobbe Martens Olson & Bear LLP

(57) ABSTRACT

The programmable modem for digital data of the present invention provides a highly programmable, digital modem implemented in an integrated circuit which can be customized to specific applications. The programmable modem uses spread spectrum techniques and is specifically programmable to alter the parameters of the modem to improve performance. The present invention also provides a systematic method and development kit to provide rapid customization of a modem for a particular application or for rapid specification of a high-performance application specific integrated circuit mode.

27 Claims, 28 Drawing Sheets

U.S. PATENT DOCUMENTS

| | | | |
|---|---|---|---|
| 5,363,401 A | | 11/1994 | Lucas et al. |
| 5,375,140 A | | 12/1994 | Bustamante et al. |
| 5,414,728 A | | 5/1995 | Zehavi |
| 5,414,730 A | * | 5/1995 | Lundquist et al. .......... 375/130 |
| 5,548,613 A | | 8/1996 | Kaku et al. |
| 5,596,601 A | | 1/1997 | Bar-David |
| 5,712,869 A | | 1/1998 | Lee et al. |
| 5,754,533 A | * | 5/1998 | Bender et al. .............. 370/252 |
| 5,757,853 A | | 5/1998 | Tsujimoto |

OTHER PUBLICATIONS

Philips, L. et al. "Silicon Synthesis of a Flexible CDMA/QPSK Mobile Communication Modem", DSP Applications, pp. 48–56, Feb. 1994.

Van Himbeeck, C., "Technological Evolution of CDMA Modems for Mobile Satellite Communication", $4^{th}$ Int. Workshop on DSP Techniques for Space, pp. 6.27–6.31, Sep. 24–28, 1994, London.

Product Brief from Stanford Telecom, Digital, Fast Acquisition Spread Spectrum Burst Processor STEL–2000A, 1994.

S20043 Data Sheet from American Microsystems, Inc., Spread Spectrum Transceiver, Jan. 1995, pp. 5–10.

AT48802, Spread–Spectrum Signal Processor Integrated Circuit, Advanced Information.

Zilog Wireless Datacommunications Development Kit Information Sheet, 1994.

"A Programmable CDMA IF transceiver ASIC for wireless communications" IEEE 1995 Philips et al.

* cited by examiner

| FIG. 10A |
| FIG. 10B |

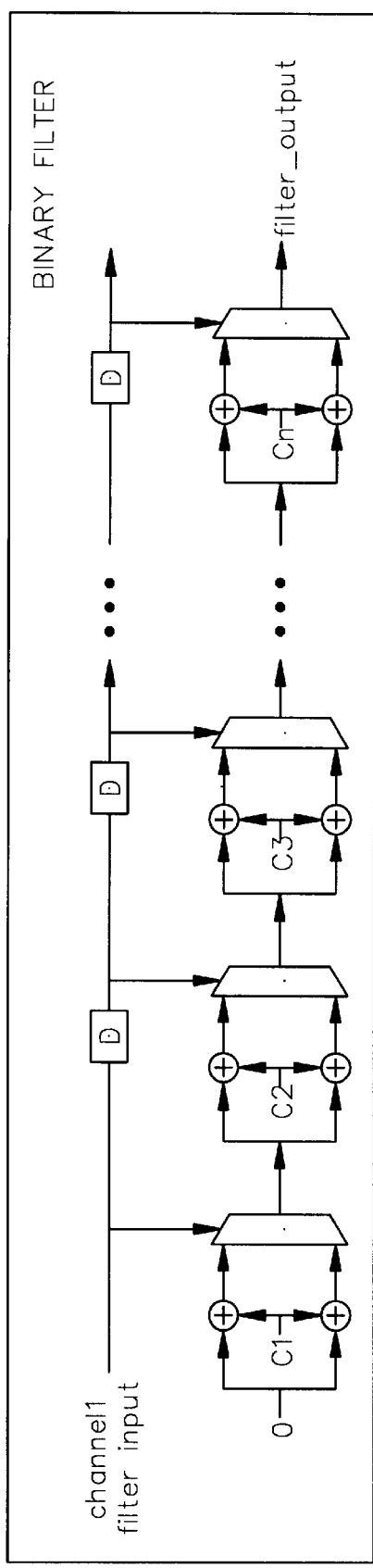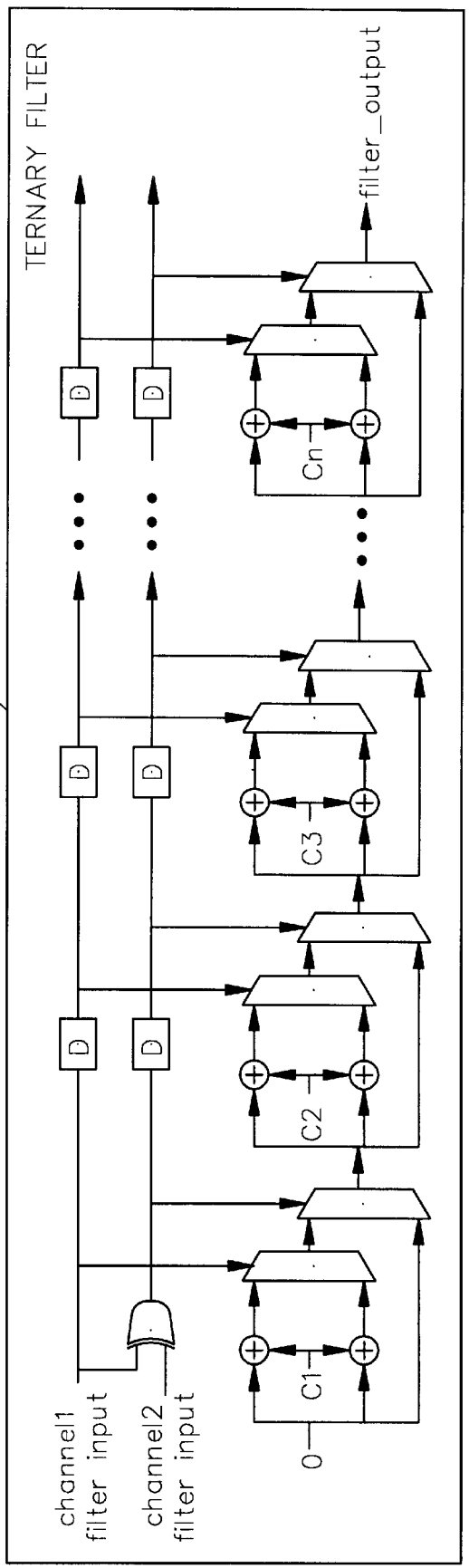
FIG. 27A
FIG. 27B

PROGRAMMABLE MODEM APPARATUS FOR TRANSMITTING AND RECEIVING DIGITAL DATA, DESIGN METHOD AND USE METHOD FOR THE MODEM

This application is a continuation of U.S. patent application Ser. No. 09/138,162 filed Aug. 21, 1998 now U.S. Pat. No. 6,308,877 and is related to divisional application Ser. No. 08/592,700 filed Jan. 26, 1996, now U.S. Pat. No. 5,872,810, and is related to Provisional Application No. 60/066,012 filed Oct. 23, 1995, and No. 60/004,785 filed Oct. 4, 1995.

BACKGROUND OF THE INVENTION

1. Field of the Invention

The present invention involves a programmable modem for digital data, a method of using the modem, and a manner in which to design an appropriate modem. More specifically, the present invention relates to a programmable digital modem using spread spectrum techniques and being specifically programmable to alter the parameters of the modem to improve performance.

2. Description of Related Art

There are a number of systems and methods for communicating information using spread spectrum communication techniques. The direct sequence spread spectrum technique is a digital modulation technique in which a digital signal is spread over a wide frequency band so that it has a noise-like spectrum. This is done by breaking up each data bit into multiple sub-bits (commonly called chips, and referred to in this application as PN code bits or chips (Pseudo Noise code bits)) that are then modulated and up-converted to a carrier frequency. By using orthogonal codes for different communication links, the same frequency band can be used for different simultaneous links. Using the same PN code as the transmitter, the receiver can correlate and collapse the received, spread signal back to the data signal, while other receivers that use other codes or other transmission techniques cannot. Advantages of using spread spectrum communication techniques include robustness with respect to interference caused by other signal sources, the possibility of sharing the same frequency band for different co-existing applications, a potential for high effective data rates and a guarantee on message privacy. These advantages make spread spectrum techniques a preferred technology in order to realize communication systems for use on noisy network media where robustness of the link is crucial, like in wireless local area networks or in industrial environments with high and unpredictable interference levels or in home or indoor office environments.

Systems employing spread spectrum communication methods are well-known.

U.S. Pat. No. 5,359,625 discloses an apparatus and method for transmitting and receiving data on a communication channel making use of spread spectrum communication techniques using direct sequences that approximate a swept frequency waveform.

U.S. Pat. No. 5,022,047 discloses an apparatus for decoding received spread spectrum signals modulated with a PN code.

U.S. Pat. No. 5,309,474 discloses a direct sequence spread spectrum modulator with a signal orthogonalizer. Exemplary embodiments are shown wherein signals are communicated between a cell-site and mobile units using direct sequence spread spectrum communication signals.

U.S. Pat. No. 5,357,541 discloses a transceiver for transmitting and receiving digital data using direct sequence spread spectrum communication techniques. The transceiver also includes circuit means for selecting different PN code bit sequences to provide multiple communication channels on a single transmission medium. Additional means for providing selectable carrier frequencies are also disclosed. The means provide a limited programmability of the transceiver.

U.S. Pat. No. 5,235,615 discloses a method for establishing and communicating synchronous, code division multiple access communications between a base station and a plurality of remote units.

U.S. Pat. No. 5,375,140 discloses a wireless direct sequence spread spectrum digital cellular telephone system. Orthogonal CDMA techniques are used.

U.S. Pat. No. 5,363,401 describes a mechanism for extracting hybrid frequency-hopping/direct sequence signals within a multi-signal type environment.

U.S. Pat. No. 5,414,728 discloses a method and apparatus for bifurcating signal transmission over an in-phase and quadrature-phase spread spectrum communication channel using orthogonal codes on the in-phase and quadrature-phase branch. Both transmitter and receiver are described.

In the article "Silicon Synthesis of a Flexible CDMA/QPSK Mobile Communication Modem," DSP Applications, February 1994, by L. Philips et al., parts of the architecture of a flexible modem chip ("chips" herein to be understood as an integrated circuit) that can be used in a broad class of satellite transceivers is disclosed. This modem chip is called the Programmable Mobile Communication Modem (PMCM) and is programmable to a large extent. The chip is realized as an integrated circuit with a hardware core that is reusable, and therefore adapted for programming for different applications. The PMCM chip is used as one part of a chip set, the other part being any commercially available DSP chip.

A modem is a device that is designed to optimally transmit data over a particular, specified channel. There exists many types of channels. Hence, there exist many types of modems.

This is also true for the particular case of direct sequence spread spectrum (DSSS) modems. From the characteristics of the channel, and the required performance of the modem for that particular channel, the structure of the modem and a large number of modem parameters are selected. There is no systematic way to make these selections in the prior art. It is rather the art of the modem designer that makes a good modem design.

There are a number of methods and tools for supporting the design of large and complex electronic systems such as digital multi-processor systems. These systems comprise many parts which are very different, such as control dominated parts, reactive parts, data flow parts, and structurally described parts. Such systems are referred to as heterogeneous systems. The methods and tools propose a unifying specification paradigm to capture a behavioral specification of a large and complex, heterogeneous digital or mixed digital/analog electronic systems. These methods and tools propose a simulator concept to cope with all aspects of the various parts of the specified system. The methods and tools propose a single implementation target for heterogeneous systems. Examples are named Ptolemy, by the University of Berkeley, California, COSSAP by the RWTH Aachen, Germany (now commercialized by CADDIS, a subsidiary from Synopsys) or GRAPE by the University of Leuven, Belgium.

SUMMARY OF THE INVENTION

In wireless and wireline communication systems, a key technological requirement is a physical modem. A modem ("modulator/demodulator") can be defined as an apparatus that converts data into a signal suited for transmission over a physical channel, and that can convert a received signal into data again. For state-of-the-art and future wireless applications, modem(s) should be able to transmit and receive data very power-efficiently and very robustly. Modem(s) should accept high data-rates and transport datastreams in real-time, independent of the number of links that are simultaneously active in the same area.

Spread spectrum techniques are a preferred technology to realize such communication systems for use on noisy network media, such as wireless local area networks, industrial environments wi^Cth high and unpredictable interference levels or in home or indoor office environments.

An option within the art is to implement parts of physical modems comprising spread spectrum communication technics/technology as an integrated circuit. U.S. Pat. No. 5,359,625, U.S. Pat. No. 5,309,474 and U.S. Pat. No. 5,357,541 disclose this option. The company Atmel offers for sale a chip set comprising a micro controller and a spread spectrum signal processor, AT48802. This spread spectrum signal processor comprises control functions for the demodulation and modulation of signals. This chip set is intended for use in cordless telephone applications. The company Stanford Telecom offers the STEL-2000 and STEL-2000A chips, providing programmability for short code lengths, and fast acquisition. The company AMI offers for sale the S20043 chip. Synchronization and formatting functionality have been implemented in hardware. The chip has limited programmability. The company Zilog offers a chip set comprising the Z2000, a spread spectrum base band and transceiver chip, and the Z182, a micro controller for the baseband transceiver.

None of the prior art teaches or discloses an essentially fully digital implementation of a spread spectrum communication modem as an integrated circuit. State-of-the-art direct sequence spread spectrum modems that are built around state-of-the-art chips require a high number of peripheral components surrounding the basic chip. Moreover the lack of a fully digital implementation makes these modems inherently slow and expensive.

The present inventors recognized these shortcomings and recognized that in order to provide cost-effective and robust modems for use in a wide application area, a high level of programmability and a high degree of integration is preferred. Integrated circuit modems with embedded microprocessor cores provides a high level of integration and flexibility is provided. None of the prior art discloses an integrated circuit for reception or transmission of digital data combined with an on-chip general purpose processor.

Today's state-of-the-art wireless communication modems support maximum data rates to 1 Mbit/sec. Applications such as efficient wireless LANs (Local Area Networks) and Multimedia applications will require data rates on the order of 20 Mbit/sec. This requires a substantial increase in the signal data rate. In order to obtain robust data transfer, long pseudo noise (PN) spreading codes are used. However, there are limits to the bandwidth increase for practical reasons. There is hence a need for a technique that combines the requirements of high data rate, long PN codes and limited bandwidth. None of the prior art discloses such a technique.

When designing a modem, the designer selects modem algorithms and parameters based upon the channel characteristics and the required modem performance. This design can be accelerated with a fast simulator for particular modem algorithms, including particular modem parameters and the ability to observe many internal signals.

The fastest simulator is a real-time, parametrizable modem. Such a "modem development kit" would allow increase in the controllability and the observability of a programmable modem. Preferably, the kit of the present invention comprises one or more programmable modems, with a computer attached to each modem to provide a user interface to the modem. The user interface facilitates easy programming of the modem (controllability aspect), and observance of the internal and external behavior of the modem (observability aspect).

None of the prior art teaches or discloses a modem that is sufficiently programmable to serve as a real-time modem simulator for a relatively wide class of modem types. None of the prior art teaches or discloses a modem that is sufficiently observable to serve as a real-time development platform for novel modem development. None of the prior art teaches or discloses a development kit that is portable such that field tests can be performed to check the performance of the modem in a particular situation.

Advantageously, a modem development kit also provides determination of the specifications for transceiver chips for specific application areas. The specific chips are then derivatives of the generic programmable chips, being less flexible but smaller, and hence cheaper. Accordingly, in the present invention a development kit provides a real-time emulation environment for designing new spread spectrum modem chips.

Large and complex integrated systems such as the described modems are heterogeneous in nature, from a specification point of view as well as from an implementation point of view. When specifying, simulating and/or implementing large and complex systems, many parts are connected to many other parts, making partitioning difficult. A suited specification and simulation paradigm covering all systems aspects is preferable.

One way of supporting the design of large and complex electronic systems is to define generic communications between various existing specification paradigms. A generic communication protocol removes the need for a unifying specification paradigm and the need for a unifying simulator and compiler for implementation. Instead, existing specification paradigms, languages, simulators and compilers can be used to specify, simulate and implement parts of a large system. If the generic communication mechanism is self-timing, the complete system is self-timed, and no global controller is needed. Thus, the system is completely modular. Any change in the specification or implementation in one of the parts does not affect the specification, simulation or implementation of the other parts. The generic communication protocol also allows linking of existing communication simulators, so that a global system simulation of all the system parts is possible.

None of the prior art teaches or discloses a generic method for specifying, simulating and implementing a heterogeneous large and complex electronic system. State-of-the-art system design support methods and tools propose a unifying specification paradigm to capture a behavioral specification of a large and complex, heterogeneous digital or mixed digital/analog electronic systems. Consequently, existing tools feature built-in limitations in the types of systems that can be described in a concise manner.

The present invention involve a novel simulator concept to cope with all aspects of the various parts of the specified system. The present invention involves a single multiprocessor architecture for heterogeneous systems. Consequently, the present invention provides a path to an implementation which has a global system controller, which decides at each moment in time what each processor is doing, or when it should start or stop a function. The global system controller is part of the implementation that is designed from scratch every time some changes are made to the system behavior description.

Accordingly, a first aspect of the present invention involves a Domain-Specific Integrated Circuit (DSIC), called Programmable Mobile Communications Modem (PMCM). These DSICs allow for a cost-effective customization of chips for specific modem applications. The PMCM DSIC chip is an integrated, digital programmable communication modem which operates in a wide range of modulator and demodulator schemes. The PMCM DSIC has spreaders and correlators, band limiting filters, and intermediate frequency up-converters and intermediate frequency down-converters. The PMCM chip can process 10 Mega PN code bits per second and has an interface to an external processor for the application-dependent functionality. The functionality of the PMCM is largely programmable, allowing for customization of the chip in several application areas.

The PMCM chip operates in CDMA (Code Division Multiple Access) and non-CDMA mode. In the case of Synchronous CDMA, the Receiver operates with a dual-type demodulator—demodulation of the Pilot, which contains synchronization information and network management data, and demodulation of the Traffic channel, which carries the actual user information. In the cases of synchronous CDMA operation and non-CDMA operation, the Pilot channel is discarded. Many other modem parameters are programmable, such as the intermediate frequency (IF), the spreading length and the spreading code.

The PMCM DSIC can be used together with a Digital Signal Processor (DSP) chip. The PMCM interfaces to the DSP chip as a memory device (i.e., memory mapped). Accordingly, the methods and the timing for reading from and writing to the PMCM chip are similar to the protocols for a memory device. The idea of choosing a chip set is induced by the complexity and desired flexibility of the overall modem. The PMCM DSIC contains the high-throughput digital functions which can be parameterized to be used in a broad class of satellite or WLAN (Wireless Local Area Network) transceivers. On the DSP, the final demodulation steps and deformatting, error correction functionality and voice processing functions are executed; these digital functions are application specific, hence full programmability is provided.

More specifically, this first aspect involves a system for transmitting and receiving signals. The system has a digital integrated circuit having a transmitter which generates first baseband signals. The transmitter has a first plurality of circuits comprising a converter coupled to receive parallel input data signals and which converts the parallel intput data to serial data, a spreader, an over-sampling filter, a gain control, and an up-converter which converts the first baseband signals to first intermediate frequency signals. The system has a receiver a receiver having a plurality of circuits to generate a second plurality of output data signals, the plurality of circuits comprising a down-converter to convert second signals at an intermediate frequency to second baseband signals, a decimating filter, a gain control, and a correlator which generates the plurality of output data signals. A clock generator is coupled to the transmitter and the receiver. The clock generator has at least one numerically controlled oscillator. At least one memory mapped memory provides storage locations for programming of the digital integrated circuit. A phase error measuring module measures a phase error between an external signal and one of the plurality of output data signals. A processor is coupled to the digital integrated circuit. The processor writes parameters to the plurality of memory elements and reading the plurality of output data signals and the phase error. Finally, a memory mapped interface is coupled between the processor and the digital integrated circuit.

In one embodiment, the at least one memory has a code phase storage memory, a spreading code storage memory, and a spreading code length storage memory for the transmitter. Advantageously, the granulatiry is half a code ibt period. The at least one memory also has a transmitter gain control programming memory, an up-converter frequency memory, a transmitter modulation procedure selection memory, and an over-sampling filter interpolation factor memory for the transmitter.

In one embodiment, the the spreading codes and the spreading code lengths are PN codes and PN code lengths. In a further embodiment, data and address busses connect the memory mapped interface with the at least one memory. Address decoders respond to the address of the at least one memory via the memory mapped interface.

In yet another emboiment, a gain control memory stores the gain control factor for the receiver and down-converter frequency storage memory maintains the downconveter frequency. A demodulation procedure selection memory for the receiver controls the receiver demodulation protocol. A decimation factor storage memory is provided for the decimating filter, and a clock frequency memory is provided for the clock generators.

In one embodiment, a means is provided to program the codes of the correlators and of the spreader with a maximal code length of 1024.

In another advantageous embodiment, the system further has a filter in the first plurality of circuits which shapes the spreaded first baseband signals for bandwidth reduction and a filter in the second pluraliity of circuits which performs out-of-band noise filtering on the down-converted second baseband signals.

Advantageously, the system has an external pilot demodulator, an external traffic demodulator, and an external noise estimator.

In one embodiment, correlators correlator generate a plurality of output data signals for the external pilot demodulator, the external traffic demodulator and the external noise estimator. The correlators have a random access memory for storage of a plurality of PN codes comprising a plurality of pilot codes and a plurality of traffic codes. A pilot correlator coupled to receive an output signal of the decimating filter correlates the decimating filter output signal with the pilot codes to generate the first output data signals. A traffic correlator coupled to receive the output signal of the decimating filter correlates the decimating filter output signal with the with traffic codes to generate second output data signals. A code phase control circuit has an address generation circuit for the random access memory and a clock inhibit circuit with a cycle of half a code bit period. A symbol timing circuit has an interrupt signal generator which generates an interrupt signal for the external processor when data is ready.

Advantageously, the communication system can be realized in whole or in part as an an application specific integrated circuit, a domain specific integrated circuit or as a multi-chip module package.

According to this first aspect of the invention, a method is also disclosed of digitally combining low rate input data signals with accurately defined up-converter and down-converter intermediate frequencies by programming the programmable communication system with a programmable interpolation factor having a value high enough to obtain accurately defined up-converter and down-converter frequencies.

A second aspect of the present invention involved a digital CDMA receiver chip. This chip is called DIRAC in the following description. The DIRAC is a single chip digital spread spectrum receiver with an embedded microprocessor (ARM) core. A flexible intermediate frequency down converter, a chip matched filter, and parallel correlators are also on the DIRAC chip. The chip performs the functionality of down conversion, demodulation, despreading, frame extraction, and user interface tasks to convert a sampled intermediate frequency signal to data on a screen.

More specifically, this second aspect of the present invention involves a signal receiving system have a receiver chain with a down-converter, a receiver filter, and a gain control. A reciever chain clock generator is coupled to the receiver chain. a means to program the receiver chain and the clock generator is provided, and a processor is programmed to complete pilot demodulation, traffic demodulation and noise estimation. Advantagesously, the signal receiving system may be realized as as an integrated circuit. The signal receiving system, in one embodiment, forms the receiver for a position determination device, such as a Global Position Determination terminal.

What is referred to herein as the ASTRA chip, is a low-cost, low-power version of the PMCM chip. The ASTRA chip has a modular architecture to increase the data throughput without increasing the transmitted signal bandwidth. The modular architecture implements an optimized digital form of a multi-channel, synchronous CDMA network. The modular architecture features parallel correlators in the receiver, and parallel spreaders in the transmitters, to implement the parallel channels. The transmitter also comprises a transmit Nyquist filter with binary input for 1 transmit channel, ternary input for 2 channels, and so forth.

This aspect of the present invention involves a method and system for increasing signal data rate of a transmission and reception system without increasing the transmission bandwidth. The method entails dividing the input data signal among a plurality of parallel segments of transmission data, spreading each of the plurality of parallel segments to form parallel spread signals using orthogonal or semi-orthogonal PN codes, summing the parallel spread signals to generate a sum signal, filtering the sum signal to generate a first baseband signal, transmitting the baseband signal, and receiving the baseband signal in a receiver with parallel correlators synchronized to despread the sum signal. In one embodiment, the system is realised as an integrated circuit.

Another aspect of the present invention involves a modem development kit built around the PMCM DSICs for selection of major system parameters in order to customize a modem to specific needs. The flexibility and programmability in the architecture of the PMCM DSICs is exploited by providing a test configuration whereby programmable parameters can be tuned to meet the requirements for a particular application. The test configuration allows downloading of any parameter combination within the allowed ranges of the PMCM DSICs. This procedure permits real-time modem tests whereby a number of parameter settings can be evaluated. The parameter set required for a particular application provides the detailed specification of a new modem chip.

The development kit is built around PMCM DSIC, an FPGA and a DSP. Because it is portable, the development kit also allows performance of real-time field tests. The supporting development software also includes many evaluation aids that help troubleshoot a particular configuration. Once the design is finalized, all settings can be stored in a memory component such as an EPROM to produce prototypes or first products. The settings can also be used as a specification of a customized, low-cost ASIC (Application Specific Integrated Circuit) version of the DSIC.

The purpose of the modem development kit is a method to use the DSICs to develop new modems using the invention as a real-time lab and field breadboard.

Thus the modem development kit can be used by:
- telecom students who want to experiment with PSK modulation and spread spectrum techniques;
- application engineers who want to determine the optimal set of parameter values for a particular wireless or wireline link;
- potential modem customers who want to gain confidence in the robustness of wireless or wireline links;
- OEM modem builders that want to evaluate the PMCM ASIC, by doing reference measurements;
- system engineers who want to test new synchronization strategies in real time; and
- field engineers who want to perform field measurements.

The Development Kit aims at two goals:
- It is an experimental platform to design demodulation algorithms.
- A rigorous way to specify new, customized ASICs, by passing a selected parameter set to the ASIC designer.

The modem development kit has:
- one or a number of identical Evaluation Boards, each comprising of a full-duplex programmable spread spectrum baseband-and-IF modem, including a PMCM chip, and including a programmable DSP, an FPGA, an ADC and a DAC, a parallel interface and a serial (RS232) interface. The DSIC chips have an implementation loss of less than 0.1 dB. Each of the evaluation boards modulates and up-converts a bit stream into a modulated IF carrier, and down-converts and demodulates such a modulated IF carrier back into the original bit stream.
- one or a number of identical analog radios that can be connected to the full-duplex programmable evaluation boards to up-convert the modulated IF carrier output of the full-duplex programmable spread spectrum baseband-and-IF modems to an RF signal, and to down-convert such an RF signal to a modulated IF carrier that forms the input of the full-duplex programmable spread spectrum baseband-and-IF modems. The parallel interface can be configured as input or output, or any mixture of both. This allows feeding of real-time data and measurements values in and out of the modems.
- a set of antennas to be directly connected to the radios.
- a PC with parallel and serial (RS232) interfaces, that are connected by a parallel and a serial communication channels to each of the fall-duplex programmable spread spectrum baseband-and-IF modems. The parallel interface can be configured for input or output, or any mixture of both. This allows for feeding of real-time data and measurements values in and out of the modems.
- a software program to run on the programmable DSP inside the full-duplex programmable spread spectrum baseband-and-IF modems

- a hardware configuration file to configure the FPGAs inside the full-duplex programmable spread spectrum baseband-and-IF modems
- a software program to run on the PC to initialize, control and monitor the full-duplex programmable spread spectrum baseband-and-IF modems in real-time and with a graphical user interface
- a default configuration file to initialize, configure and program the DSIC chip inside full-duplex programmable spread spectrum baseband-and-IF modems Furthermore, the development kit has several advantages:

- exploring a set of programmable modem parameters, including requirements on SNR, modulation and demodulation schemes, signal bandwidth, symbol rate, symbol clarity, tracking loop algorithms, synchronization algorithms, chip phase acquisition strategy, carrier frequency acquisition strategy, carrier phase acquisition strategy spreading technique, maximal Doppler shifts, maximal Doppler rates, bit error rate and clock jitter, which differ from one modem application to another;
- determining the parameter set tuned towards a particular modem application;
- using the flexibility and programmability which has been provided in the architecture of the DSIC chips to configure the devices to prototype less stringent modem applications that the maximally stringent applications they have been designed for, i.e., satellite links;
- performing real-time modem field tests, reference measurements, CDMA and PSK evaluation tests, performance tests, real-time development of customized demodulation algorithms, and for educational or didactical purposes;
- finding optimal of such settings for a particular set of modem requirements;
- using these settings as unambiguous and detailed specifications which are necessary and sufficient of a new modem chip.

More specifically, the modem development kit has a programmable modem which receives input data signals and modulates and up-converts the input data signals into first intermediate frequency signals and which demodulates and down-converts second intermediate frequency signals into output data signals. The modem has a first transmitter chain which generates baseband signals. The transmitter chain has a converter coupled to receive input data and convert the input data into first serial baseband signals. The transmitter chain also has a spreader, an over-sampling filter, a gain control, and an up-converter with a programmable frequency which converts the baseband signals to the first intermediate frequency signals. The modem also has a receiver chain which generates a plurality of output data signals. The receiver chain has a down-converter with a programmable frequency which converts the second intermediate frequency signals to second baseband signals. The receiver chain also has a decimating filter, a gain control, and a correlator to convert the second baseband signals into the plurality of output data signals. A clock generator is coupled to the transmitter chain and to the receiver chain. The clock generator has at least one numerically controlled oscillator, and in one embodiment has an NCO for the receiver and the transmitter.

The development kit further has a programmable digital signal processor, a field programmable gate array chip, an analog to digital converter, a digital to analog converter, and a radio to up-convert the first intermediate frequency signals to a first radio frequency signal, and to convert a second radio frequency signal to the second intermediate frequency signal. An external programming device is coupled to the programmable modem, to the digital signal processor and to the field programmable gate array. The external programming device provides programming for the digital signal processor, for the field programmable gate array chip, and for the programmable modem. The modem can be initialized for start-up. Advantageously, the modem is monitored by a user interface, and an interface is provided between the external programming device and the programmable modem.

In one embodiment the interface comprises a serial interface. A parallel interface is also advantageous. The external programming device is a personal computer in the present embodiment. The personal computer maintains a hardware configuration file for the field programmable array and a hardware configuration file for the programmable modem.

The development kit defines a method for customizing a domain specific integrated circuit for an application, using the modem development kit. The method entails collecting the specifications of the application, choosing a first set of programmable parameters, initializing the field programmable gate array, and the digital signal processor, and the programmable modem with the first set of programmable parameters, monitoring the behavior of the programmable modem. The method then entails deriving a second set of programmable parameters, repeating the initialization, monitoring and deriving steps until a set of parameters is derived which result in functions complying with the desired specifications. The final parameters can be used to define an application specific integrated circuit.

For a modem circuit, the method involves, selecting a modulation scheme, selecting or switching the filters, determining the over-sampling factor, determining the decimation factor, determining the transmitter intermediate frequency, determining the bandwidth of the PN code bit frequency PLL, determining the bandwidth of the carrier frequency PLL, determining the gain of the PN code bit frequency PLL, determining the gain of the carrier frequency PLL, determining the PN code length, determining the tracking update rate, determining the symbol rate, and determining the code set. The monitoring and controlling steps involve (for a modem), monitoring the automatic gain control value, monitoring the bit error rate, monitoring the demodulator status, monitoring the interface status, monitoring the PN codes, monitoring the constellation diagram (scatter plot), monitoring the correlation, monitoring the interrupt rates, monitoring transmitter data, monitoring receiver data rate, monitoring transmitter interrupt duty cycle, monitoring receiver interrupt duty cycle, monitoring downloaded transmitter codes, monitoring transmitter intermediate frequency signal, monitoring transmitter over-sampling factor, monitoring transmitter filter loss, monitoring receiver filter loss, monitoring transmitter filter step response, monitoring modem status, monitoring diagrams on an oscilloscope connected to the development kit, and restarting, re-initializing and resetting the modem, resetting the numerically controlled oscillators, starting and stopping the modem, and turning the transmitter on or off.

A fifth aspect of the present invention involves a method to specify, simulate and implement a complex system, such as the PMCM DSIC, as a set of concurrent, communicating processes, where the processes are specified in their own specification language, simulated with their own simulator and implemented with their own compiler, separately and with local control only, and in which the communication is generic, yet efficient, low-power, robust, and clock skew tolerant, and in which the complete system is self-timed. This specification method is called IPC (interprocess communication) in this application. When specifying, simulating, and/or implementing large and complex systems, many parts are connected to many other parts. The present specification method breaks up a complex system into manageable parts.

Large and complex systems such as the PMCM DSICs are heterogenous in nature, from specification point of view, as well as from implementation point of view. The IPC method offers a generic way to connect existing different parts, each specified using its own specification paradigm rather than a general unified specification paradigm. This method offers a generic connection of the various implementations (hardware, processors, embedded software, etc) using an efficient, low-power and robust communication scheme and a suited interface implementation in hardware, or in software or in a mixture of both.

The IPC can be automatically optimized if particular border conditions for the interface hold. In this way, a new language, a new paradigm, a new simulator and a new compiler are unnecessary. The IPC method allows use of the existing languages, paradigms, simulators and compilers, but offers a way to connect all these existing languages, paradigms, simulators, and compilers in a generic way.

IPC is a modular specification method for power-efficient, high-throughput and area-efficient implementations. Efficient hardware/software implementations of the IPC procedures are described, which allow for an overall system performance as good as other, less modular, implementation methods. The specification method can be implemented for simulation.

Some goals of the IPC protocol are as follows:

to describe all coarse-grain sub-systems of a complex system at the most appropriate abstraction level, and in the most appropriate host language, in order to make explicit internal control flow when needed or desired, in other words, describing control-oriented sub-systems as well as dataflow oriented sub-systems, preemptive sub-systems, and reactive sub-systems;

to have the freedom to clock each sub-system at its most appropriate clock rate, including non-periodic clocks;

to describe the sub-systems independently with respect to their control flow;

to define all data communications between processes;

to model all relevant system behavior aspects;

to have this specification behaviorally simulatable, such that an early system test plan can be executed on a computer, with user control panels and user interfaces included;

to use the specification as the unambiguous input for implementation, steered by either automatic or manual allocation of implementation target processors and assignment of processes onto the allocated processors;

to implement and re-use the sub-systems independently from each other;

to guarantee data integrity for all communications;

to provide a method that has constraints whatsoever on the kinds of systems that can be described and implemented;

to have a bit-accurate implementation compared to the test plan simulations;

to allow as much non-determinism in the system as the designer wants; and to have an efficient, safe and modular implementation, with low area/timing overhead caused by process modularity, and low power consumption, and an overall system performance at least as good as other, less modular approaches.

The test-plan simulation uses an executable implementation of each process, that can be executed on any computer or computer network, that supports a multi-process operating system or multi-tasking simulator, such as a C-UNIX implementation, i.e., an implementation where all processes are converted into a separate C-program and all processes and their communication are assigned to one or more UNIX work stations as implementation targets.

The output of any implementation step for any of the sub-systems (towards a UNIX computer, an ARM processor, a Cathedral-III processor, or any other processor or dedicated piece of logic) is delivered in an executable form (such as compiled C, assembled microcode or executable VHDL) such that it can be simulated or executed as a test plan verification. These goals are reached by implementing the behavior of a sub-system separate from the communication protocol, and separate from the other sub-systems. This partitioning is possible due to the use of the generic IPC communication protocol.

BRIEF DESCRIPTION OF THE DRAWINGS

FIGS. 27A and 27B illustrate a binary FIR filter structure and a corresponding ternary FIR filter structure for the transmitter when a single data channel is divided among several parallel channels as depicted in FIG. 6.

DETAILED DESCRIPTION OF THE PREFERRED EMBODIMENTS

The PMCM DSIC

Figure 1:
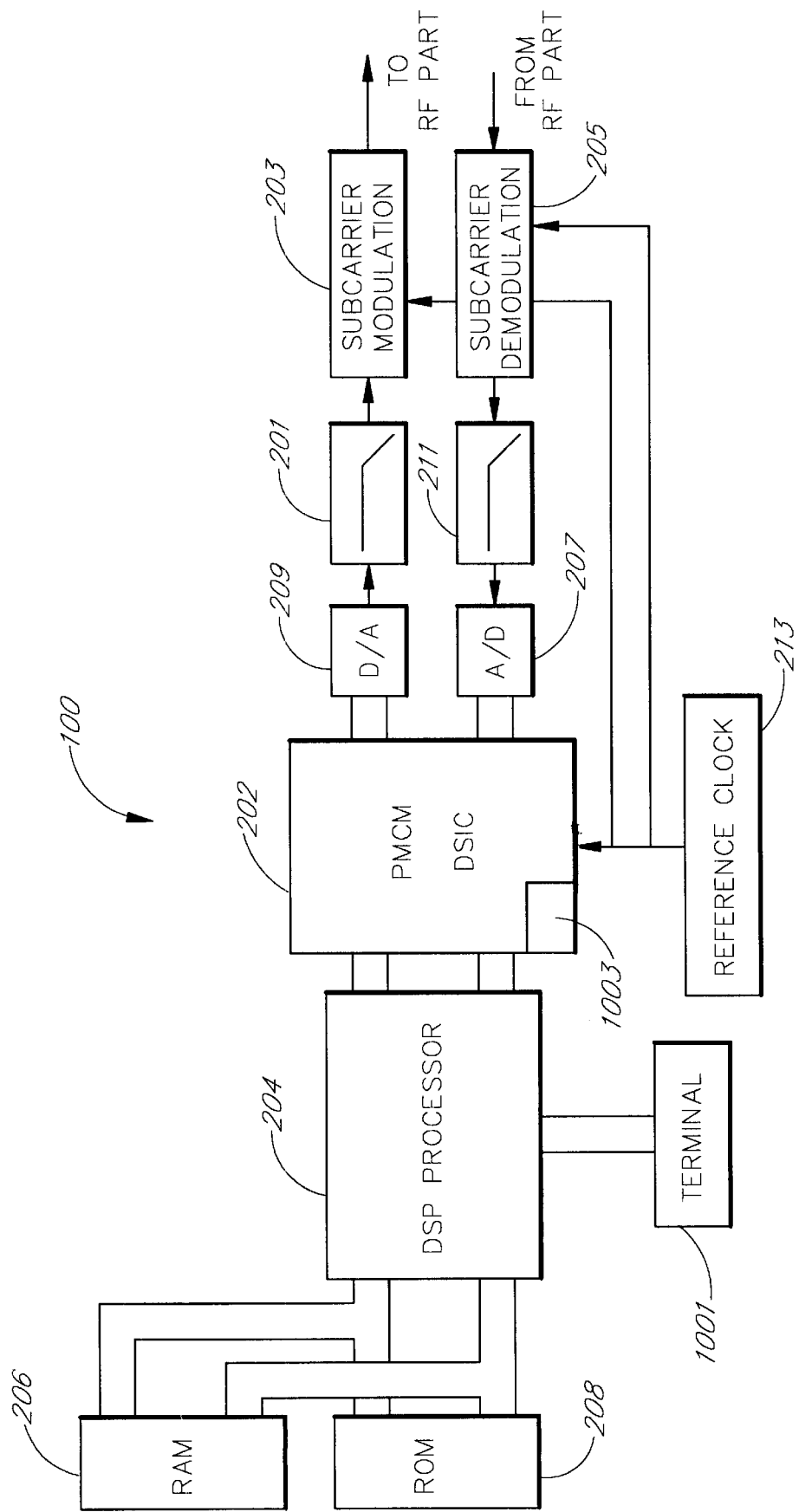
FIG. 1 illustrates a block diagram of a programmable mobile communications modem system having a DSP processor and supporting resources.

FIG. 1 depicts an overall block diagram of the programmable mobile communications modem (PMCM) system 100. The PMCM system 100 is preferably realized with an application specific integrated circuit or a Domain-Specific Integrated Circuit (DSIC) 202, coupled to a digital signal processor (DSP) 204. Advantageously, the DSP 204 couples to resources such as RAM 206 and ROM 208 and a user terminal 1001. The PMCM 202 is memory mapped it interfaces to the DSP 204 as if the PMCM 202 were a memory device. The PMCM can also be realized as a multi-chip module package.

In the present embodiment, the PMCM 202 interfaces with a modulator 203 and a demodulator 205 via a digital-to-analog converter 209 and an analog-to-digital converter 207, respectively. Low pass filters 201, 211 are also provided. The inputs and outputs to the digital-to-analog converter and analog-to-digital converters from the PMCM 202 are at an intermediate frequency (IF). The demodulator 205 receives a radio frequency signal. Similarly, the modulator 203 provides a radio frequency signal for transmission. The modulator 203 and demodulator 205 receive clock inputs from a reference clock 213. The reference clock 213 also provides a clock signal for the PMCM 202.

A chip set is desirable because of the complexity and desired flexibility of the overall modem. The PMCM 202 contains high-throughput digital functions which can be parameterized to be used in a broad class of satellite or WLAN (Wireless Local Area Network) transceivers. On the DSP Processor 204, the final demodulation steps and deformatting, error correction functionality and voice processing functions are executed; these digital functions are application specific, hence, full programmability of the PMCM 202 is provided. In other words, the final pilot demodulation is performed by the DSP 204, and the final traffic demodulation is performed by the DSP 204. External noise estimation can also be performed by the DSP 204.

Figure 2:
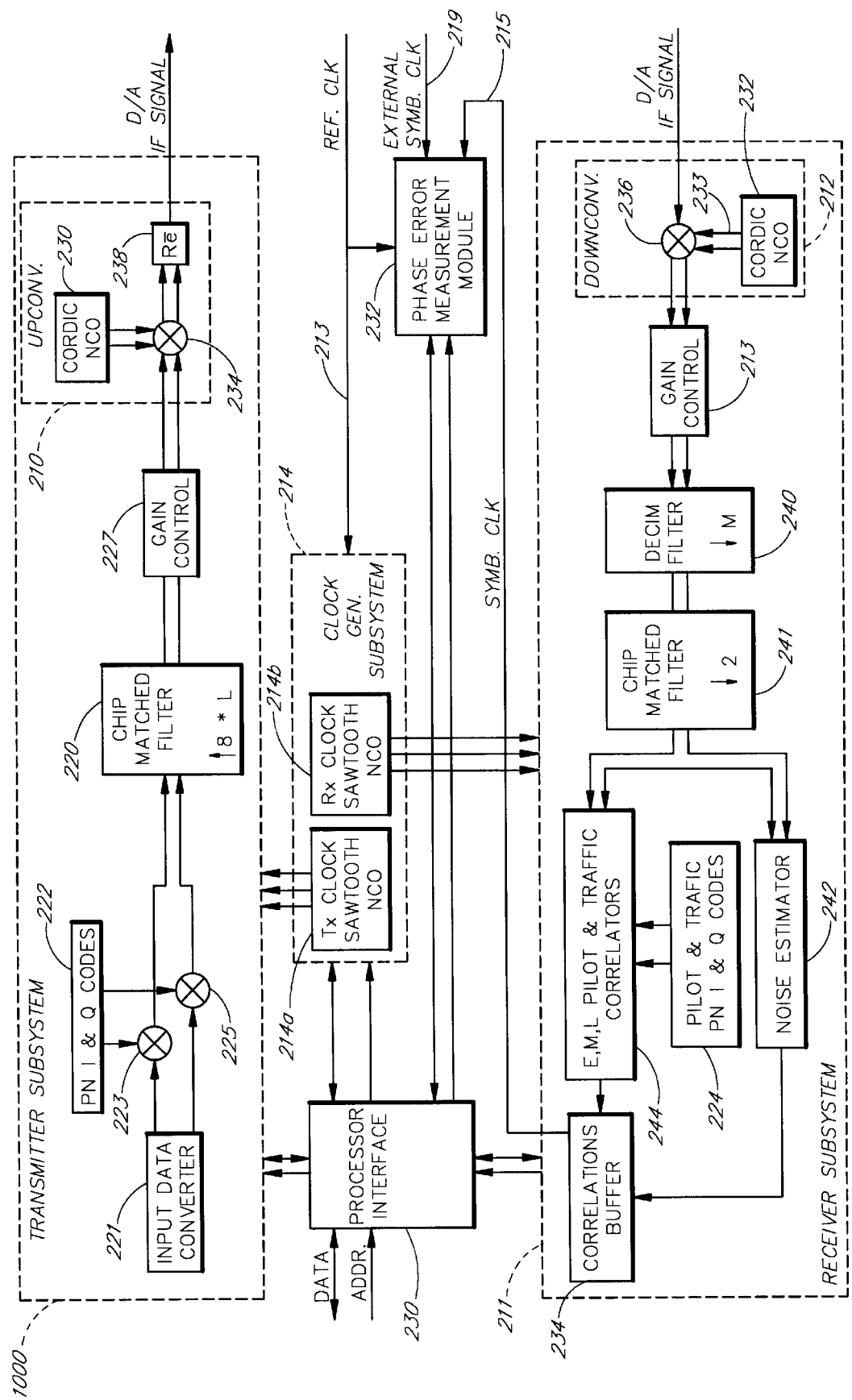
FIG. 2 illustrates a block diagram of the programmable mobile communications modem chip of FIG. 1.

A more detailed PMCM 202 diagram is shown in FIG. 2. As depicted in FIG. 2, the PMCM 202 has a transmitter subsystem 1000 and a receiver subsystem 211. The transmitter subsystem 1000 has an up-converter 210, which has a numerically controlled oscillator (NCO) 230 which operates in accordance with the CORDIC algorithm, and a multiplier 234 to create real data 238 from complex data which is on the input of the up-converter 210. The output of the transmitter subsystem 1000 provides the intermediate frequency (IF) signal, which is output from the PMCM 202 and provided to the digital-to-analog converter 209 (FIG. 1). The transmitter subsystem 1000 further has a gain control 227, which receives input data from a chip matched filter 220. The input to the chip matched filter 220 results from complex multiplications of input data from an input data converter 221 and the pseudo noise (PN) I and Q codes stored in the I&Q codes register 222.

As further depicted in FIG. 2, the receiver subsystem receives an intermediate frequency signal at its input, which is a signal generated by the analog-to-digital converter 207 (FIG. 1). The input IF signal is received by a down converter 212. The down converter 212 has a numerically controlled oscillator 232, which also operates by the CORDIC algorithm. the down converter 212 provides a complex multiplication of the input IF signal in a multiplier block 236. The output of the down-converter 212 is provided to a gain control 213, which provides its output to a decimation filter 240. The output of the decimation filter is provided to a chip matched filter 241. The output of the chip matched filter 241 is provided to a noise estimator 242 and to complex correlators 244. The complex correlators 244 also receive an input from pilot and traffic PN codes stored in a PN code register 224. The output of the complex correlators 244 and the noise estimator 242 is provided to a correlations buffer 234.

As seen in FIG. 2, the PMCM 202 also has a phase error measurement module 232, a clock generation system 214, and a processor interface 230. The phase error measurement module 232 receives input from an external symbol clock and an internal symbol clock, and from the reference clock 213 and from the processor interface. The clock generation system 214 has a transmitter clock sawtooth NCO 214a and a receiver clock sawtooth NCO 214b. These oscillators 214a, 214b provide timing for the receiver subsystem 211 and the transmitter subsystem 1000. The processor interface 230 provides an interface to the DSP 204 (FIG. 1). The Chip Matched Filters (CMF) 220, 220a in Transmitter 1000 and Receiver 211 are the over-sampling lowpass filters 201, 211 (FIG. 1), implemented as Finite Impulse Response (FIR) filters. The roll-off factor is chosen for all envisaged applications.

The Spreading and Correlating PN code sequence registers 222, 224 are fully programmable. The maximum code length is 1024, hence supporting the GPS (Global Positioning System) code length. In the Transmitter 1000, synchronous switching between 2 alternative PN-codes is possible. Hence there are 4 codes stored in the Transmitter 1000: two I-branch codes and two Q-branch codes. In the Receiver 211, four codes are also stored during setup: an I and a Q code for the Pilot Channel, and an I and a Q code for the Traffic Channel. The Pilot Channel is mainly used for synchronization purposes; in the Traffic Channel, the actual data are demodulated. In the Receiver 211, a total of 14 correlation values are calculated (raw correlation data) by the correlators 244 to be processed further by the functions on the DSP Processor 204, to derive estimations for the tracking values of carrier and clock frequency.

Communication with the DSP Processor 204 is performed by the double-buffered, on-chip processor interface 230 which has address and date lines coupled to the DSP processor 204.

The PMCM 202 operates in a wide range of modulator and demodulator schemes. It operates in CDMA (Code Division Multiple Access) and non-CDMA mode. In the case of synchronous CDMA, the Receiver 211 operates with a dual-type demodulator 244. The first demodulator demodulates the Pilot channel, which contains synchronization information and network management data. The second demodulator demodulates the Traffic channel, which carries the actual user data. In the cases of a synchronous CDMA operation and non-CDMA operation, the Pilot channel is discarded.

The data signals are complex-valued, and the two signal components are denoted further as In-Phase (I) and Quadrature (Q) components; The PN code bits of the spreading sequence can be modulated in QPSK (Quadriphase Shift Keying), OQPSK (Offset QPSK), QPN (Quadriphase Pseudo Noise) and OQPN (Offset QPN). The amplitude levels of the I- and the Q-branch can be separately adjusted. BPSK (Binary Phase shift Keying) systems can also be implemented by disabling the Q-branch. The Receiver can be configured QPSK/CDMA, OQPSK/CDMA, QPN/CDMA, OQPN/CDMA, and non-CDMA OQPSK or BPSK.

In typical system implementations, the synthesizers consumer most area and power. Full flexibility is provided by four synthesizers: sampling and carrier frequency synthesizers, both for the Transmitter and the Receiver. The sampling synthesizers 214a, 214b generate the adjustable Over-sampling clocks, while the carrier frequency synthesizers generate carrier waveforms at an Intermediate Frequency (IF).

The PMCM DSIC 202 is divided into three subsystems: the Transmitter subsystem 1000, the Receiver subsystem 211, and the Reference subsystem 214 (i.e., the clock generators). For each of these subsystems there is a write address decoder in the processor interface 230. In this way, the programmable fields 1003 of the PMCM 202 are accessed via memory mapping techniques. There are also two read address decoders in the processor interface 230: one for reading the phase error measurement data from the phase error measurement module 232 and one for reading the correlation values from the correlations buffer 234.

Parallel to Dibit Converter.

An external data source (e.g., the external processor) provides packets of bits, hereafter called subframes, to the transmitter chain based upon receipt of an interrupt from the PMCM 202 indicating it can accept more data. The input data is provided to the input data converter 221, which provides parallel-to-dibit conversion. The processor interface 230 provides the input data to the input data converter 221. In the case of OQPSK modulation, bits coming from a data source via the interface 230 are converted to 2-bit symbols by the Parallel to Dibit Converter 221. The even bits are passed to the I-branch multiplier 223, and the odd bits are passed to the Q-branch multiplier 225. For BPSK operation, the Q-branch 225 is disabled, and the Parallel to Dibit Converter 221 transfers the data bits to the I-branch multiplier 223.

PN-code spreading is provided by transmitter PN-code spreaders (multipliers) 223, 225 for the I and Q branches of the input data. The PN codes for the transmitter subsystem 1000 are stored in an on-chip (RAM) register 222. Similarly, the PN codes are stored in an on-chip memory (RAM) 224 for the receiver subsystem 211. The code length number for an application, together with the code sequences are loaded during initialization action and setup. The rate obtained after spreading is the PN code bit rate. A PN code length equal to 1 provides the ability to perform non-CDMA schemes. In the present embodiment, the spreading is provided by multiplication of the I and Q code sequences by the input data.

Coarse tuning of the phase of the PN Code spreaders 223, 225 (resolution of 1 PN code bit) is possible via a specific control register 1003 in the PMCM transmitter subsystem 1000. This control register is memory mapped to the external DSP 204.

Transmitter Chip Matched Filter.

The Transmitter Chip Matched Filter 220 is an oversampling filter, operating on the complex (I, Q) input signal. The Chip Matched Filter 220 performs shaping of the spread, baseband signals from the spreaders 222, 223. The implementation loss is very small, according to the following specifications:

Phase Linearity:

Group Delay variation is zero due to a FIR filter implementation with a symmetrical coefficient set;

Pulse Distortion (ripple):

The deviation from the theoretical SRRC profile is smaller than 0.15 dB;

Out-of-Band Suppression:

Above the PN code bit frequency (fPN) the suppression of spurious levels is better than 50 dBC spurious energy in any 3 kHz band versus the energy in the center of the band (center of band +fPN/Z.) for a pn length of 255.

The roll-off is selected for a wide range of applications. If, however, a different Chip Matched Filter is necessary, the on-chip Transmitter Chip Matched Filter 220 can be bypassed (bridged) (e.g., be replaced by an external band-pass SAW filter). This bypass operation is controlled via a specific memory mapped control register 1003.

Hold Function. A zero-th order interpolation (Hold function) can be applied on the output of the Transmitter Chip Matched Filter 220. The Hold (interpolation) factor is in the range 1 . . . 1024 and is controlled via a memory mapped control register.

Level Control Function.

In the Transmitter 206, the levels of the I and Q branch can be separately adjusted in a +/−10 dB range with a resolution of 1 dB. This is accomplished with the Gain Control 227.

Transmitter and Receiver Clock Generation NCOs.

The Numerically Controlled Oscillators (NCOs) 214a, 214b used for the Transmitter and Receiver clock are sawtooth generators from which the most significant bit is used as the control signal for the clock waveform generator circuit 214 (generation of two-phase and single-phase clock waveforms).

The frequency of the sawtooth generators is controlled via programmable memory-mapped registers, TCLKNCO and RCLKNCO, (not shown specifically). The accumulator dynamic range (word length) for the sawtooth oscillators is 32 bits.

The accumulator of the sawtooth generator is incremented once per incoming clock cycle of the reference clock 213 with the INC value. When the accumulator passes its maximum value it wraps. The highest clock frequency that can be generated is half the frequency of the Reference Clock 213. Hence, the desired increment reference INC is:

$$INC=2^{32} \text{ Over-sampling Clock/RefClock}$$

In other words, in that the most significant bit is used as a control for the clock waveform, INC is the value that is added to the accumulator in the sawtooth generator in order to obtain the desired step down of the reference clock. The Over-sampling Clock is the Transmitter or the Receiver sawtooth NCO 214a, 214b. The resolution or tuning sensitivity is thus:

$$\text{Resolution} = \text{RefClock}/2^{32} \text{ Hz}$$

The clock precision is thus:

$$\text{Precision} = \text{RefClock}/2^{32} \text{ Over-sampling Clock)}$$

The digital signal exiting the transmitter 1000 or entering the receiver 211 is at an Intermediate Frequency (IF) for the modulator 203 as well as for the demodulator 205. This reduces the number of A/D and D/A Converters 207, 209, and simplifies the analog filtering. As explained in the previous subsection, the applied Reference Clock frequency determines the jitter of sampling, and thus also the maximum acceptable central (IF carrier) frequency. On the other hand, the maximum frequency range over which the central frequency of the signal can be changed is determined by the over-sampling rate and the bandwidth of the spread signal which is fPN/2 or is equal to the symbol rate (baseband) in case of non-CDMA. Hence, the transmitted and the received signal central frequency can be moved in a range depending on the over-sampling or decimation factor.

The cordic NCOs 230, 232 generate sine and cosine waveforms based on the Cordic algorithm, in order to perform the complex multiplications 234, 236. These NCOs use as a reference the Over-sampling Clocks generated by the Clock Generation NCOs 214a, 214b.

Specific memory-mapped, programmable registers (not shown) control the phase increment. An accuracy of 34 bits is used, hence the resolution is:

$$\text{Resolution} = \text{Over-sampling Clock}/2^{34} \text{ Hz}$$

The relation between the increment (INC), the sinusoidal frequency (Freq) and the Over-sampling Clock is as follows:

$$INC=2^{34} \text{ (Freq/Over-sampling Clock)}$$

The outputs (sine and cosine waveforms) of the Transmitter NCO 230 are combined with the complex Gain Controller 221 output to form the real part "RE" 238 of the complex multiplication 234. At the Receiver side, the IF signal from the A/D Converter 207 is complex multiplied in the multiply block 236 with the Receiver Complex Multiplier NCO outputs.

The complex multipliers interface with the modulators 203 and demodulators 205 via the ADC and DAC buses (FIG. 1).

Decimation Function.

In the receiver subsystem 211, the receipt of the IF signal and the complex multiplication 236 provide complex data to the gain control 213. The gain control 213 advantageously provides sufficient gain to allow for further processing. In the recent embodiment, the gain control 213 is a scalable multiplier with a multiple of 1 . . . 127, the multiple being programmable through a memory mapped register. The output of the gain control 213 provides signals for the decimation filter 240. The sample rate reduction with the Decimation Function 240 is programmable from 1 to 1024 via a memory-mapped, programmable control register. In the case of non-CDMA reception and in a mobile channel characterized by large Doppler shifts, the preceding NCO must be able to track large carrier frequency ranges.

Receiver Chip Matched Filter.

The output of the decimation filter 240 provides an input to the receiver chip matched filter 241. The Receiver Chip Matched Filter 241 consists of two stages. The first stage is a filter with programmable decimation factor; the second stage is an accurate high-order FIR lowpass decimating filter. The reciever chip matched filter 241 performs out-of-band suppression on the downconverted baseband signals from decimation filter 240. The out-of-band suppression, pulse distortion and phase are the same as in the transmitter chip matched filter 220.

Correlators and Noise Estimator.

The output of the chip matched filters provides an input to the correlators 244 and the noise estimator 242. The Noise Estimator 242 performs a sum of the absolute values of both the I and the Q branch output of the 2nd stage of the chip matched filter (CMF) 241. Final noise estimation is also calculated by the DSP 204. More specifically, the DSP 204 reads the signal energy level from the noise estimator 242 and uses this information to control the gain of the receiver in the gain control 213. This noise control closes the loop for the gain control 213.

The correlators 244 calculate for both the I and the Q branch output of the 2nd stage of the CMF 241, a Middle correlation with the Pilot I-code, the Pilot Q-code, the Traffic I-code, the Traffic Q-code, an Early correlation with the Pilot I-code, and finally a Late correlation with the Pilot I-code. These correlations are provided in the correlators 244. This is also known as the de-spreading operation.

The phase of the correlators 240 is alterable during the initial acquisition phase via a memory-mapped, programmable control register (not shown). The resolution (granularity) of phase jumps is half a code bit period in the present implementation.

At the beginning of each data symbol, an internal symbol clock strobe 215 (active low) is generated as the correlation values are written into the correlation buffer 234. The symbol strobe 215 is used for two purposes. The first use is the Phase Error Measurement between different demodulators. The second use is as an interrupt strobe for the DSP 204. The correlation code length is between 1 and 1024, controlled via a memory-mapped, programmable control register.

The final demodulation is performed in the DSP 204, which performs BPSK, QPSK or OQPSK demodulation. The different demodulation schemes are selectable. In other words, the final pilot demodulation is performed by the DSP 204 204 and the final traffic demodulation is performed by the DSP 204.

Special Synchronization Functions.

A number of special functions are provided a wide range of applications.

The modulator outputs its Subframe Clock, indicating the beginning of a subframe via a Transmitter Subframe Clock pin of the PMCM 202.

The demodulator outputs a clock indicating the epoch at which it detects the beginning of a symbol, via a Receiver Symbol Clock pin on the PMCM 20.

A Phase Error Measurement function 232 is provided to measure the code bit phase difference between different demodulators.

An instantaneous synchronization of the modulator Subframe Clock to the demodulator Symbol Clock. This permits calculation of the round trip delay, a typical function in ranging applications. The modulator Subframe Clock can also be synchronized to the Subframe Clock of another external modulator. Selection of the synchronization mode is done via a memory-mapped, programmable specific control register.

The demodulator can be synchronized to an external Symbol Clock 219. Programming is done via a memory control register.

The Over-sampling Clock 214a of the Transmitter 1000 can be generated locally at the Transmitter side or taken from the Receiver side, or from an external source. The PMCM chip 202 has-a Transmitter Over-sampling Clock pin to which an external clock can be connected as an input. Programming of the PMCM chip 202 to indicate whether the over-sampling clock 214a of the transmitter 1000 is generated internally or received from an external clock is provided via a memory-mapped, programmable control register.

The Over-sampling Clock of the Receiver 211 can be internally generated (at the Receiver side) or taken from an external source. The PMCM chip 202 has a Receiver Over-sampling Clock pin to which an external clock can be connected as an input. Programming of the PMCM chip 202 to indicate whether the over-sampling clock of the receiver is internally generated or provided by an external source on the receiver over-sampling clock output pin is provided by a memory-mapped, programmable control register.

Phase Error Measurement.

Phase Error Measurement is implemented in order to realize synchronous CDMA. The phase error module 232 has the reference clock 213 of the demodulator 205 as one input. The phase error module 232 is a counter that is reset on each pulse of an external symbol clock 219 which provides another input to the phase error measurement module 232. The phase error measurement module 232 dumps its accumulated count on the reception of the internal symbol clock strobe 215. The resolution of the measurement is (PN code bit rate/Reference clock) code bit periods.

The DIRAC DSIC

Figure 3:
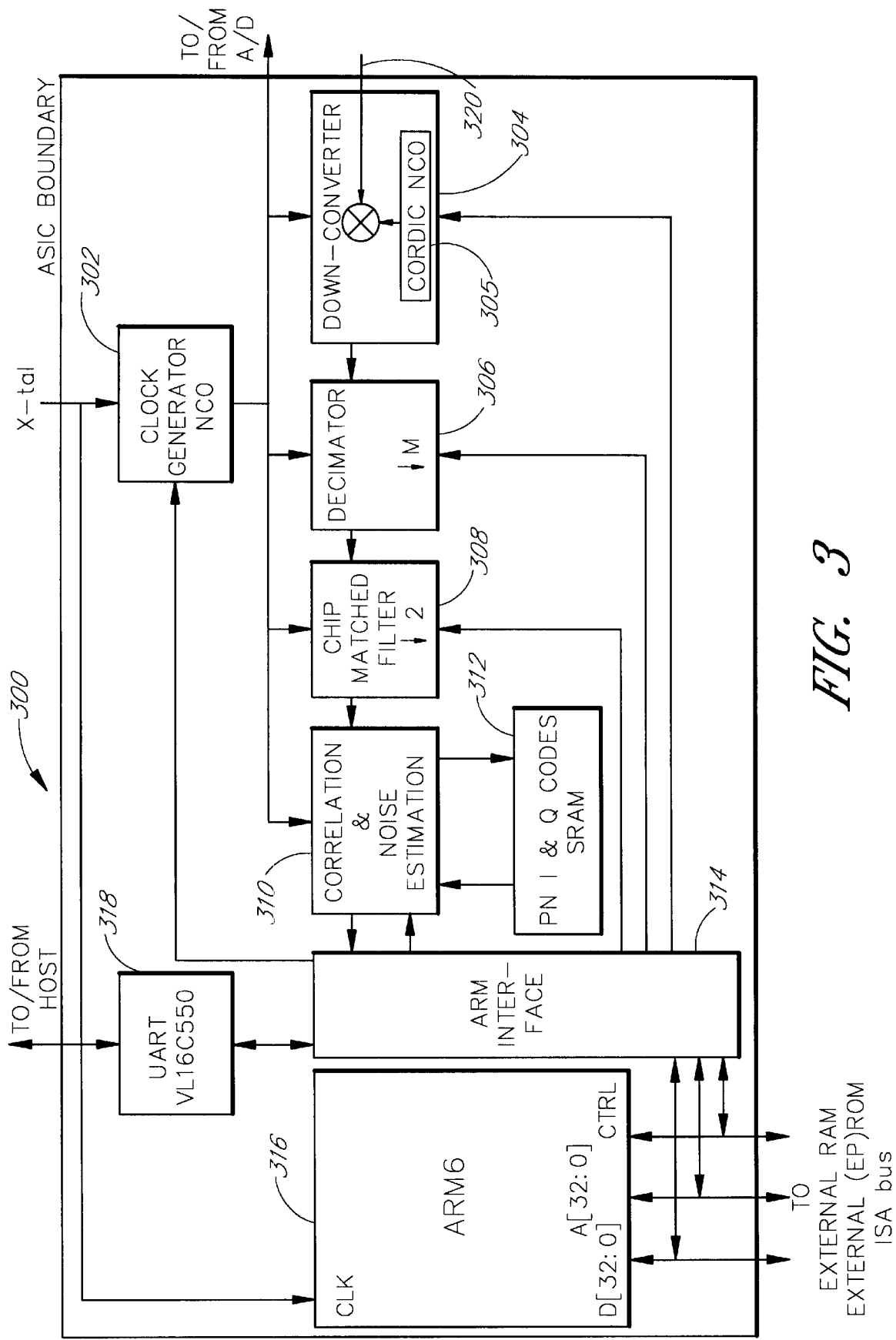
FIG. 3 illustrates an overview of the architecture of the DIRAC integrated circuit in accordance with the present invention.

FIG. 3 illustrates a block diagram of a Digital Integrated Receiver with ARM Core (DIRAC) DSIC system 300. The DIRAC DSIC 300 has a clock generator NCO 302, a down converter module 304, a decimation module 306, a chip matched filter 308, a correlation and noise estimation module 310, a memory (SRAM) 312 for the storage of PN codes, an ARM interface 314, an internal microprocessor (ARM) controller 316, and a universal asynchronous receiver/transmitter (UART) module 318. The ARM core is an advanced use of microprocessor core licensed by ARM Ltd.

The DIRAC DSIC 300 is a digital CDMA (Code Division Multiple Access) receiver chip with a digital spread spectrum receiver and an integrated advanced micro controller 316. The DIRAC system 300 receives an 8-bit digital signal at an intermediate frequency on an input 320. The input signal could be provided from a radio receiver or the like, such as provided for the PMCM DSIC 202 at its input. In other words, the radio transmission could be received, demodulated, filtered and digitized to provide a signal at the input 320. The input signal is down converted to baseband in the down converter 304 using an I and Q local carrier, with a programmable frequency. The down convertor 304 uses an NCO 305 to provide a programmable frequency. The down convertor 304 is capable of removing Doppler shifts originating from the transmission radio link.

The DIRAC DSIC system 300 can be used as any type of spread spectrum receiver. For instance, the DIRAC DSIC 300 could be used to receive a spread spectrum signal from a satellite or other radio transmitter. More specifically, the DIRAC DSIC 300 could form the receiver portion of a position determination device such as a global positioning system (GPS) device.

A complex signal results from the down conversion. The resulting complex signal is down-sampled by the variable decimator 306 to a rate of 8 complex samples per code bit. These samples are fed into the Chip Matched Filter (CMF) 308, which is a Square Rooted Raised Cosine (SRRC) filter with a roll-off of 0.4. It has a signal-to-noise ratio (SNR) of 40 dB and a spurious response suppression of 50 dBC. The CMF 308 realizes a down-sampling with a factor of 2, down to 4 times the code bit frequency.

The CMF 308 samples are provided to a dual demodulator 310, demodulating a pilot (reference) channel and a traffic (information) channel. This allows the use of synchronous CDMA. The correlators 310 calculate the complex correlations of the traffic channel and the Early, Middle, and Late correlations of the pilot channel.

From these correlations, the ARM 316 calculates delayed lock loop (DLL) phase locked loop PLL and automatic frequency control (AFC) variables during tracking and acquisition, which are fed back to data-path registers. For this purpose, the ARM 316 acts as the controller in a control system with feedback. The ARM also performs frame extraction, channel decoding, and provides a user interface and communication to a host computer via a serial port 318.

The ARM 316 communicates with its peripherals via its interface. The ARM 316 can store 14*16 bit correlations and 14 parameters of variable length. This allows ARM I/O without wait-states, leaving a maximum of cycles for the tracking and acquisition algorithms.

In a typical example like MSBN (Mobile Satellite Business Network) with a symbol rate of 3400 sym./s, the ARM running at 40 MHz can execute 11,111 cycles or 6944 instructions (1.6 cyc./inst.).

The ARM core 316 also provides an interface to external memory (RAM and EPROM) and to a standard ISA bus. The interface to the external memory and ISA bus are provided for development purposes. In a completed device, this interface to the external memory and ISA bus can be removed.

Each one of the elements in the block diagrams of FIGS. 2 and 3 is modular in design and provides communication using a interprocess communication protocol (ICP) described below. Accordingly, each block is provided with an IPC buffer to handle communications between different dedicated hardware block functions, such as the functions shown in FIGS. 2 and 3.

Communication Buffer.

Figure 4:
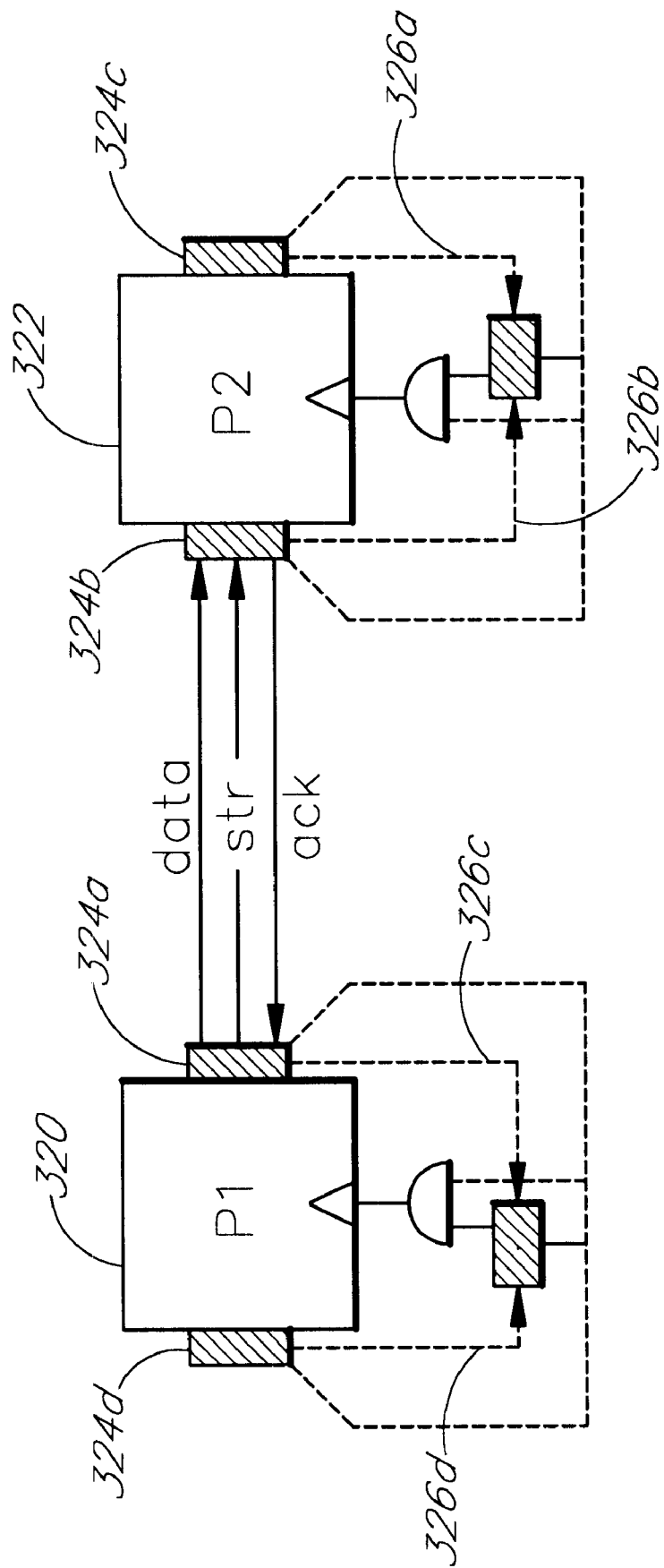
FIG. 4 illustrates a simplified block diagram of a communication buffer protocol in accordance with the present invention.

FIG. 4 shows details of the communication buffer which allows data transfer between any two dedicated hardware blocks. These buffers provide a handshake and clock gating mechanism for each dedicated hardware function block such that the function block is clocked only when there is data available at its input (str) and the subsequent reading device has received the output (ack). This guarantees that each device is clocked at the minimal required frequency, determined by the data rate, thus reducing the power consumption. These IPC buffers also make a global controller redundant, which further reduces the power and silicon area. All devices can have independent asynchronous clocks, so that the clock tree routing process, during the layout phase, is simplified, because only the clocks inside a processor need to be free of skew.

Although the details of the IPC communication protocol as described further below, the diagram of FIG. 4 details an overall view of the communication between two function or processor blocks. As depicted in FIG. 4, two devices (dedicated function blocks) 320, 322, labeled P1 and P2 are depicted. These two devices correspond to any dedicated hardware block such as one of the hardware blocks depicted in FIG. 2 or FIG. 3. These hardware blocks could also comprise a processor or two processors communicating with each other. In accordance with a protocol to be further described below, an IPC interface 324a, 324b, 324c, and 324d, is provided. These interfaces provide for the necessary IPC handshake as described further herein. In addition, a disable signal can be provided to control circuitry for the block in order to disable the circuit. Control disable signals are provided on signal lines 326a, 326b, 326c and 326d. Accordingly, a communication buffer can be defined with a predefined communication protocol as hereinafter described.

The ASTRA DSIC

The advanced spread spectrum transmitter and receiver ASIC (ASTRA) comprises a particular application of a generic, modular architecture extension to the PMCM DSIC 202, to increase the signal data rate without increasing the transmission bandwidth. In addition, the ASTRA chip is a low-cost, low-power version of the PMCM chip.

This subsection describes the principles for using synchronous CDMA direct sequence spread spectrum (DSSS), implemented in the ASTRA DSIC. It is based on a modulation scheme called M-ary QPN. The aim is to increase the throughput of DSSS wireless or wireline links and networks. An optimized and modular architecture is proposed for a transmitter and a receiver to provide bandwidth-on-demand chips.

In general, it is known that a single point-to-point wireless link can handle a limited data rate, which is fairly low when using PSSS CDMA because the spreading factor reduces the rate. The longer the spreading code, the lower the net data rate for a fixed bit rate. The PN code bit rate is limited by technological limitations of the baseband modem, the bandwidth of the analog radio and the analog channel capacity. Therefore, in order to increase the data rate by one or two orders of magnitude, fundamental solutions are disclosed.

The basic idea of the present invention is to exploit the multiple access properties of DSSS. DSSS allows a number of simultaneous links in transmission by assigning each Tx/Rx pair a code orthogonal to all the other codes in the transmission. In principle, a peer-to-peer network topology, where all network intelligence is distributed.

Technological constraints, more in particular the near/far problem (receivers at different locations), limit the feasibility of such a distributed peer-to-peer network. In fact, a central transmission-power control system must be added to implement such a system. Synchronous CDMA networks (which also demand a central dispatching) are also possible and provide for more efficient global network traffic.

Figure 5:
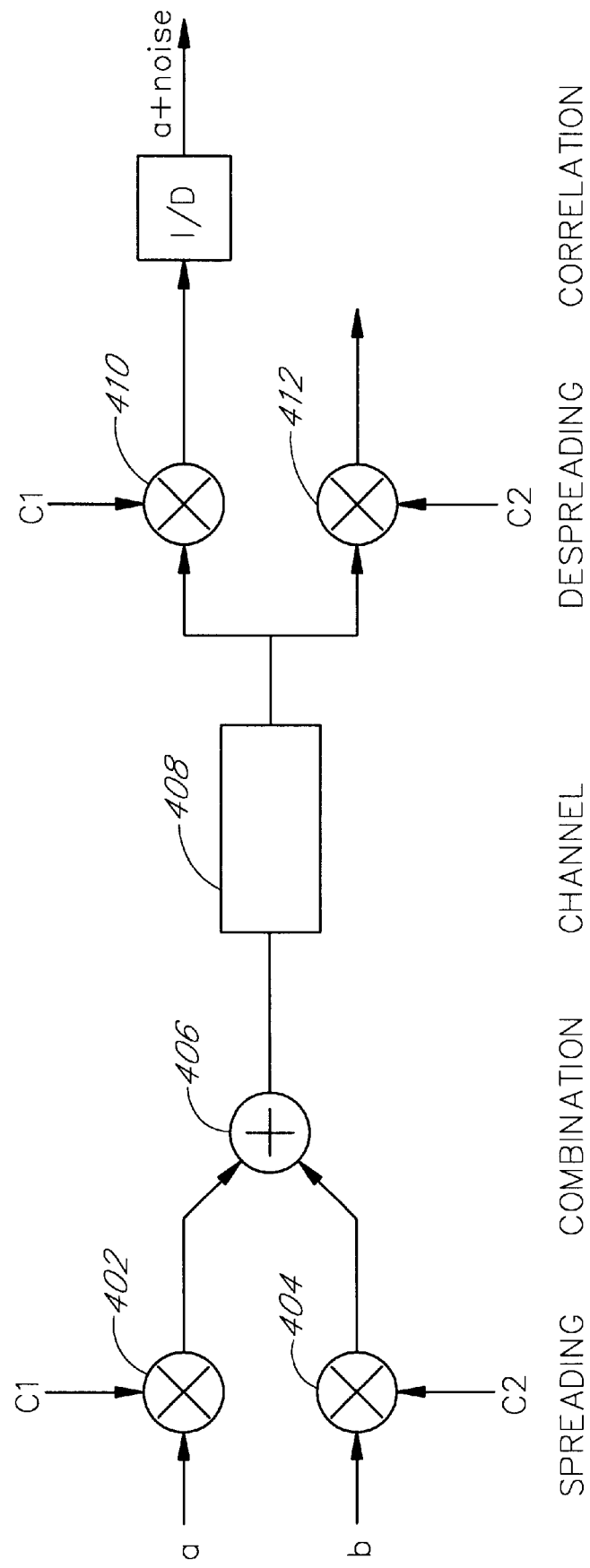
FIG. 5 illustrates the general architecture for a parallel CDMA system.

However, instead of using this multiple access scheme for building peer-to-peer networks, it is possible to split the data of a high data rate multi-media channel over several parallel CDMA links. Each channel is assigned a code orthogonal to all others in the transmission. At reception, the data are reconstructed. FIG. 5 depicts such a system in principle. The input data is split, for purposes of the present example, into two channels 'A' and 'B'. Data is spread using appropriate coding in spreaders 402, 404. The spreading codes (C1, C2) are provided as inputs to the spreaders 402, 404. After spreading, the channels are combined in a summing module 406. Transmission via non-wire line or wire line channel 408 is provided and the incoming signal is despread using despreaders 410, 412. The despreading is provided by using the corresponding codes from the spreading operation. After despreading is performed, the data can be reconstructed. The noise which is on each channel is a sum of the noise from both channels.

For implementation, all (multiple) transmitters are at the same physical location and all (multiple) receivers are at the same location and the data is divided among the parallel channels. Therefore, synchronous CDMA for the parallel channels can be used. The QPSK carrier can be common. This allows a receiver architecture with only one carrier down-convertor/tracking, but N despreaders. The bit phase acquisition and tracking are common.

The transmitter uses parallel spreaders. The transmitted signals are combined by summing them after the spreaders to form an N-ary signal instead of a binary (BPSK) or 2 binary (QSPK) signals. The Nyquist filter in the transmitter (such as the Chip matched filter 241, FIG. 2) is then no longer a binary input filter, but for three channels a ternary input filter, for 3 channels a quaternary input filter, etc. In FIG. 27, the architecture of such a binary filter 330 and a corresponding ternary input filter 332 are shown.

Figure 6:
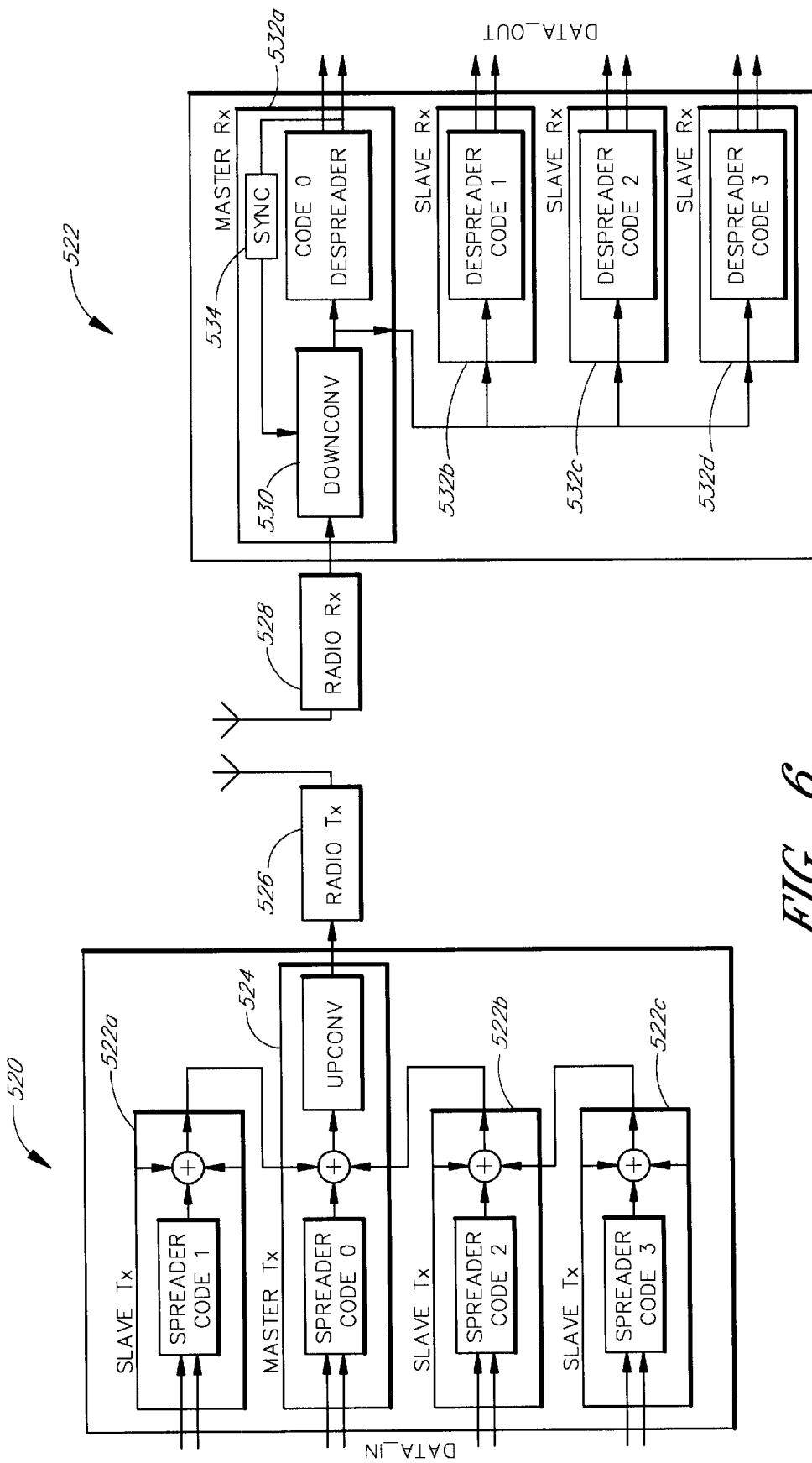
FIG. 6 illustrates a modular architecture for synchronous CDMA in accordance with one aspect of the present invention.

The near-far problem is completely avoided in this type of multiple access link. In order to make the architecture modular, so that more channels can be added as a higher data rate is needed, the structure in FIG. 6 is proposed. As seen in FIG. 6, a transmitter side 520 and a receiver side 522 are provided. The transmitter side 520 has a plurality of slave transmitter channels 522A, 522B, 522C with spreaders and a master transmitter channel 524 having an up-converter. Each of the transmitter channels has a spreader and a summing module. The data from all spreaders is summed before up-conversion and transmission via a radio transmitter 526. The receiver side 522 receives the data over a radio receiver 528 (or wire-line or optical link). This data is down converted in a down-converter 530 and the resulting data is provided to multiple parallel despreading channels 532A, 532B, 532C and 532D with one receiver channel 532a being the master receiver. A synchronization module 534 provides for synchronous CDMA. The system shown in FIG. 6 is an overview of the proposed ASTRA DSIC in accordance with the present invention. This structure provides a very modular architecture which can be easily expanded or down sized for bandwidth on-demand architecture.

Note that this transmitter architecture limits the ripple path of the spreader-adder to a logarithmic-depth ripple path.

The processing gain Gp for a spreading length of N is Gp=10×log(N) dB. There are approximately N balanced or more-or-less balanced and orthogonal codes for a code length of N (if N is larger than 30). This number is an absolute limit on the number of possible parallel channels.

There is also another limit. The user-interference noise added to the link with each additional channel is L dB. As described above, the cross-channel noise is additive. Adding channels only makes sense as long as the total loss k×L<Gp, with k being the number of interference channels.

The Spread Spectrum Modem Development Kit

The Spread Spectrum Modem Development Kit of the present invention aims at two goals:

(1) A platform to design demodulation algorithms.
(2) A rigorous way to specify new, customized ASICs, by passing a selected parameter set to the ASIC designer.

The requirements on SNR, bandwidth, symbol rate, symbol parity, Doppler shifts, Doppler rates, bit error rate, and jitter differ from one modem application to another. Therefore the modem DSICs are designed to meet the most stringent satellite link requirements. In this sense, the modem DSIC chips are a superset of a range of more dedicated—terrestrial—modem applications.

Flexibility and programmability are provided in the architecture of the DSICs. Exploiting this flexibility, the development kit can also prototype less stringent modem applications. This allows for real-time modem tests, where a number of settings can be evaluated in the field. The Modem Development Kit provides an easy-to-use interface to download any parameter combination. It also allows monitoring of relevant performance measures in real-time.

When the Modem Development Kit is used to find a suited parameter set for particular modem requirements, the parameters provide the detailed specifications of a new modem chip.

The kit consists of two parts:

a set of modem boards, called evaluation boards connected to each evaluation board, a PC (host computer) with a user interface, monitor software and parameter setting software, to control and observe the evaluation board behavior.

Figure 7:
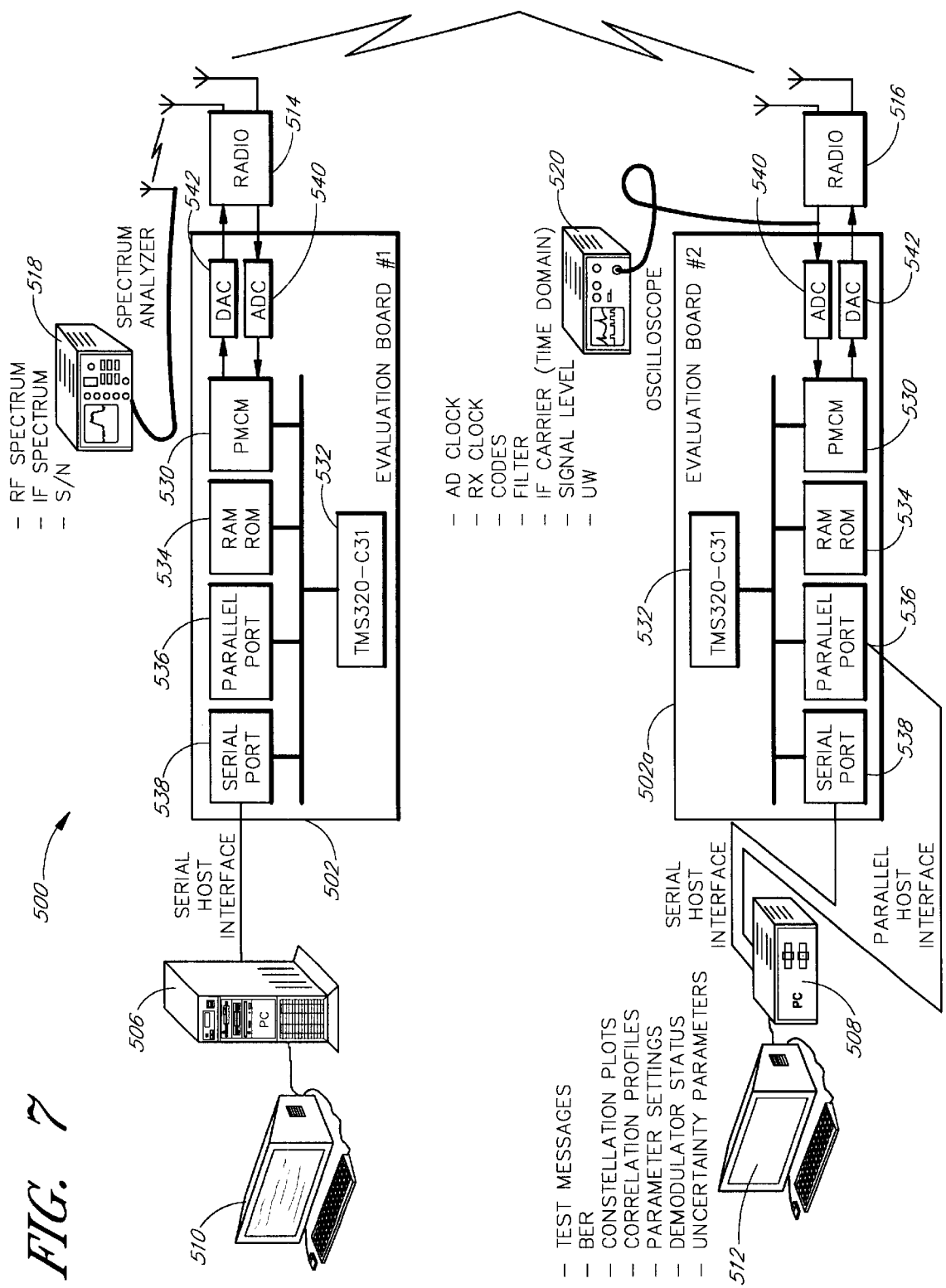
FIG. 7 depicts an overall diagram of the modem development kit in accordance with one aspect of the present invention.

FIG. 7 illustrates an overall view of the spread spectrum modem development kit system 500. In general, the modem development kit system 500 has evaluation boards 502, 502a; host computers 506, 508; a user interface 510, 512; radios 514, 516; a spectrum analyzer 518; and an oscilloscope 520. The evaluation boards 502, 502a are the same. Further details are provided below.

Evaluation Board.

The Evaluation Boards 502, 504 are a PCB circuit layout containing a spread spectrum DSIC 530 such as the PMCM DSIC 202, a DSP 532 such as a TMS 320-C31 (available from Texas Instruments) with RAM and ROM 534, an FPGA (not shown in FIG. 7), a parallel port 536, a serial port 538, an analog-to-digital converter 540, and a digital-to-analog converter 542. These converters provide analog input/output (I/O) communication at the IF frequency. A radio 514, 516 (i.e., IF-to-RF up- and down-convertor) can be connected to the evaluation board analog interface for experiments with wireless links, or a cable can be connected to the analog interface for experiments with wireline links. Because the DSIC 530, the DSP 532, and the FPGA are programmable, the Evaluation Board 502, 504 provides full flexibility in modulation schemes, data rates, spreading techniques, tracking loops, synchronization algorithms, acquisition strategy, etc. In the present embodiment, the FPGA is connected between the bus and the PMCM 530.

The serial port 538 of the evaluation board 502, 504 provides a serial host interface that can be connected to any RS232 terminal. This allows parameters to be set, parameter settings to be checked, software and codes to be downloaded, test messages to be sent, bit error rates to be measured, and other performance measures via a terminal (computer 506 and user interface 510).

Parallel port 538 of the Evaluation Board 502, 504 provides a parallel interface that can be configured as input or output, or a mixture. This allows real-time data and measurements to be written to and read from the modem.

Figure 8:
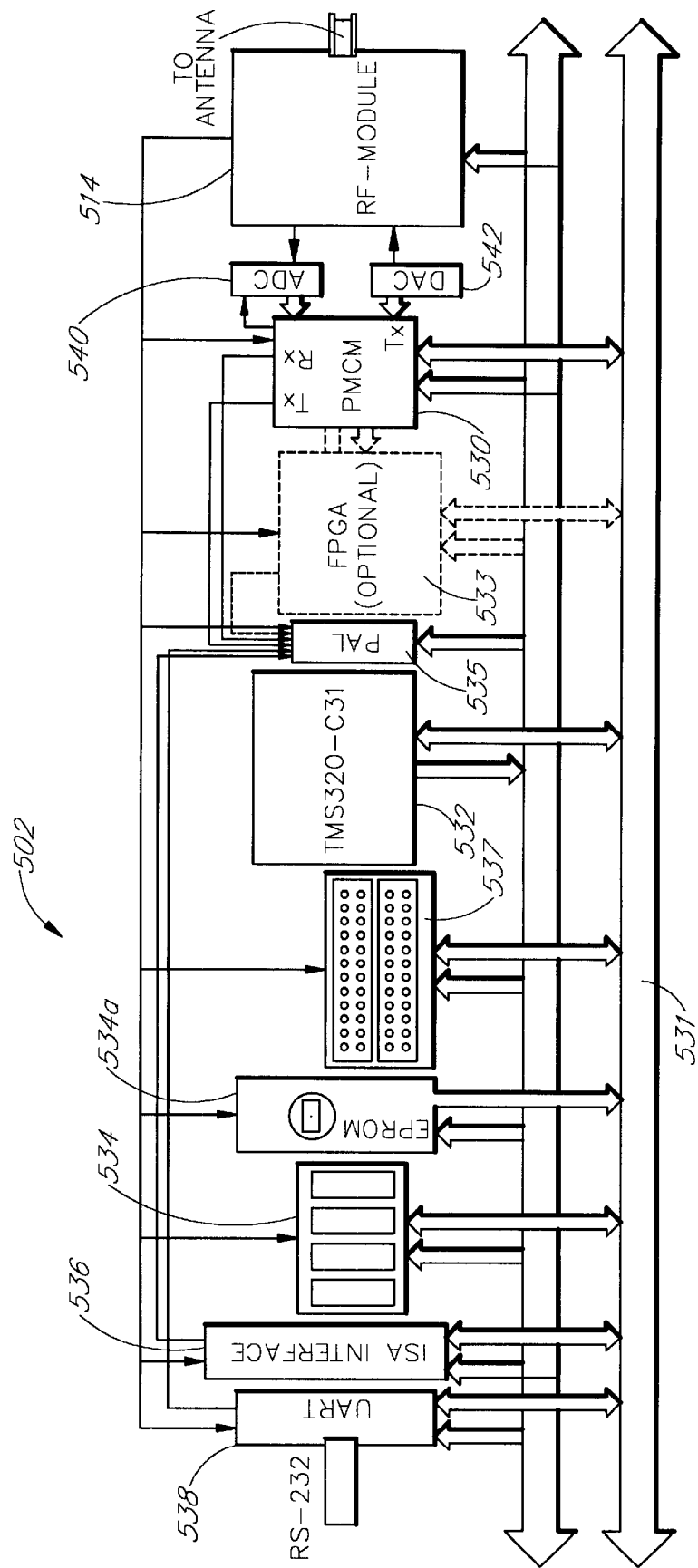
FIG. 8 depicts a diagram of the architecture of the evaluation board of the development kit of the present invention.

The architecture of the evaluation board is depicted in detail in FIG. 8. All real-time clocks are generated by this DSIC based on a 40 MHz crystal oscillator in the present embodiment.

As depicted in FIG. 8, the evaluation board architecture is illustrated in detail with the interconnection between the modules of the evaluation board 502 described above. As depicted in FIG. 8, the evaluation board has the radio 514 or other radio frequency module coupled to an antennae and to the analog digital converter 540 and the digital analog converter 542. These devices couple to the PMCM-DSIC 530. The PMCM-DSIC 530 couples to the bus structure 531 or in an alternative embodiment to the FPGA 533. The FPGA 533 is an optional device and is shown in dashed lines in FIG. 8. A programmable array logic block 535 also couples to the bus structure 531 and to the DSP 532. In the present embodiment, the DSP 532 is a Texas Instruments TMS 320-C31 which also couples to the bus structure 531. An LSA (Logic State Analyzer) interface 537 also couples to the bus structure for troubleshooting. The LSA interface 537 provides access to signals in the evaluation board 502. The EPROM 534a depicted in FIG. 8 also couples to the bus structure 531 as well as the random access memory (RAM) 534. The ISA interface 536 is depicted in FIG. 8 with its connections to the bus structure. The ISA interface 534 provides the parallel interface to the computer as depicted in FIG. 7. Finally, the universal asynchronous receiver/transmitter 538 is depicted in FIG. 8 with its connections to the bus 531. In the present embodiment, the UART 538 comprises an RS-232 interface which preferably provides an interface to the host 506 (FIG. 7).

The Evaluation Board 502 also forms the heart of the Development Kit, described in the next section.

The Modem Development Kit

The Modem Development Kit adds the computer 506, 508 and user interfaces 510, 512 and software for continuous real-time performance measurements. Most measurements can be displayed graphically in real-time on the displays 510, 512. Also, an elaborate user interface is provided. The Development Kit contains a TMS320-C31 embedded software library that allows building of any custom data formatting, carrier tracking algorithms, etc. It also allows for configuring of the FPGA on the Evaluation Board 502, 502a.

The specific goals of the modem development kit are as follows:

Allow setting of all parameters within meaningful ranges. This includes the selection of various modulation schemes, symbol rates, PN code lengths, PN codes, IF rates, PLL parameters, etc.

Allow selecting of various data sources, such as test messages, files, test images, camera images, speech and RS-232 data.

Support to evaluate an operational modem, including:
Report the settings of all parameters and PN codes.
Measure the bit error rate (BER).
Real-time measurements of the Tx and Rx interrupt rates to check the clocks.
Real-time sampling of the Tx base-band and IF outputs, both filtered and unfiltered, I-branch and Q-branch separately and combined.
Real-time monitoring of the PN code phase acquisition phase.
Real-time constellation plots for both the I and Q branches.
Real-time measurements of the interrupt server execution times on the DSP.

For specialized telecom engineers, the re-design of the major modulator components is supported:
  the design of the PLLs (lock regions and noise sensitivity for given parameter sets, such as PLL filter type, analog band width, damping and loop gain)
  code types and code sets (orthogonality, cross correlations, auto correlations, balancing, mean and variance)

Support software development of the supporting DSP 532. This allows to implement alternative demodulation algorithms, based on the same raw correlation data supplied by the DSIC.
  A link to the TMS320-C31 DSP 532 for the PMCM 530.
Support the implementation of part of the synchronization in the FPGA.
Using the Kit for Rapid Customization.

Using the Development Kit, a designer may experimentally find optimal parameters for a particular wireless or wireline link. These parameters can be translated into a cost-effective ASIC solution.

The programmable DSIC 530 on each Evaluation Board 502 is sufficiently powerful to meet high throughput and high robustness requirements.

In addition, the DSIC 530 has a modular architecture, so that it is easily adaptable to the specific requirements of other applications. It can be customized into cost-effective ASICs (Application Specific Integrated Circuits) to meet particular needs. This modular architecture allows for fast customization of the DSIC 530.

Examples of specification changes with respect to the standard DSIC are:
  a faster chip phase acquisition unit.
  dedicated carrier and chip tracking PLLs.
  frequency diversity control by a slow hopping strategy over the ISM band.
  dedicated symbol formatting, frame extraction and symbol detection.
  antenna diversity and TIR switch control.
  more parallel traffic channels.
  a dedicated medium access layer.
  a different modulation scheme.
  port to another processing technology, another package (including MCM technology) or another foundry.

One can also relax a number of specifications of the DSIC 530 in order to reduce the cost. The PMCM DSIC 530 is able to maintain satellite links, which is the most demanding wireless or wireline link. The PMCM DSIC 530 operates under extremely low SNR conditions, and with large Doppler shifts and large Doppler rates. The PMCM DSIC 530 may be over-functional for less demanding applications.

Examples of specification relaxations are:
Leave out the pilot channel.
Relax the filter specifications, or leave out the filters.
Reduce the number of on-chip functions by using a half-duplex mode.
Drop special synchronization features. Replace full programmable codes (on-chip RAM) by generators for a number of specific code families.
Leave out the phase error measurement for ranging applications.
Drop the decimation features.
Use a different over-sampling rate.

Development Kit Configurations.

Each development kit consists of at least a computer 506 and an Evaluation Board 502. The serial port 538 can be used to program the DSP and the FPGA. This link can be removed once the modem is operational because the software of the modem is located in EPROM on the evaluation board 502. The modem board 502 also contains a parallel interface ports to transmit or receive data from the computer bus, such as an ISA bus.

The development kit allows for two types of measurements:
  Baseband and IF measurements
  RF measurements Although it is possible to perform all baseband and IF measurements described in the following sections using one modem only, a two-modem evaluation system 500 is preferable. Some synchronization aspects can be evaluated only when the transistor (Tx) and the receiver (Rx) execute on slightly different crystal frequencies, which drift in time. With one evaluation board, the measurements rely on the full-duplex operation of the baseband and IF functions. For RF propagation measurements, two boards are needed. This is because the RF radios 514, 516 are half-duplex.

Figure 9:
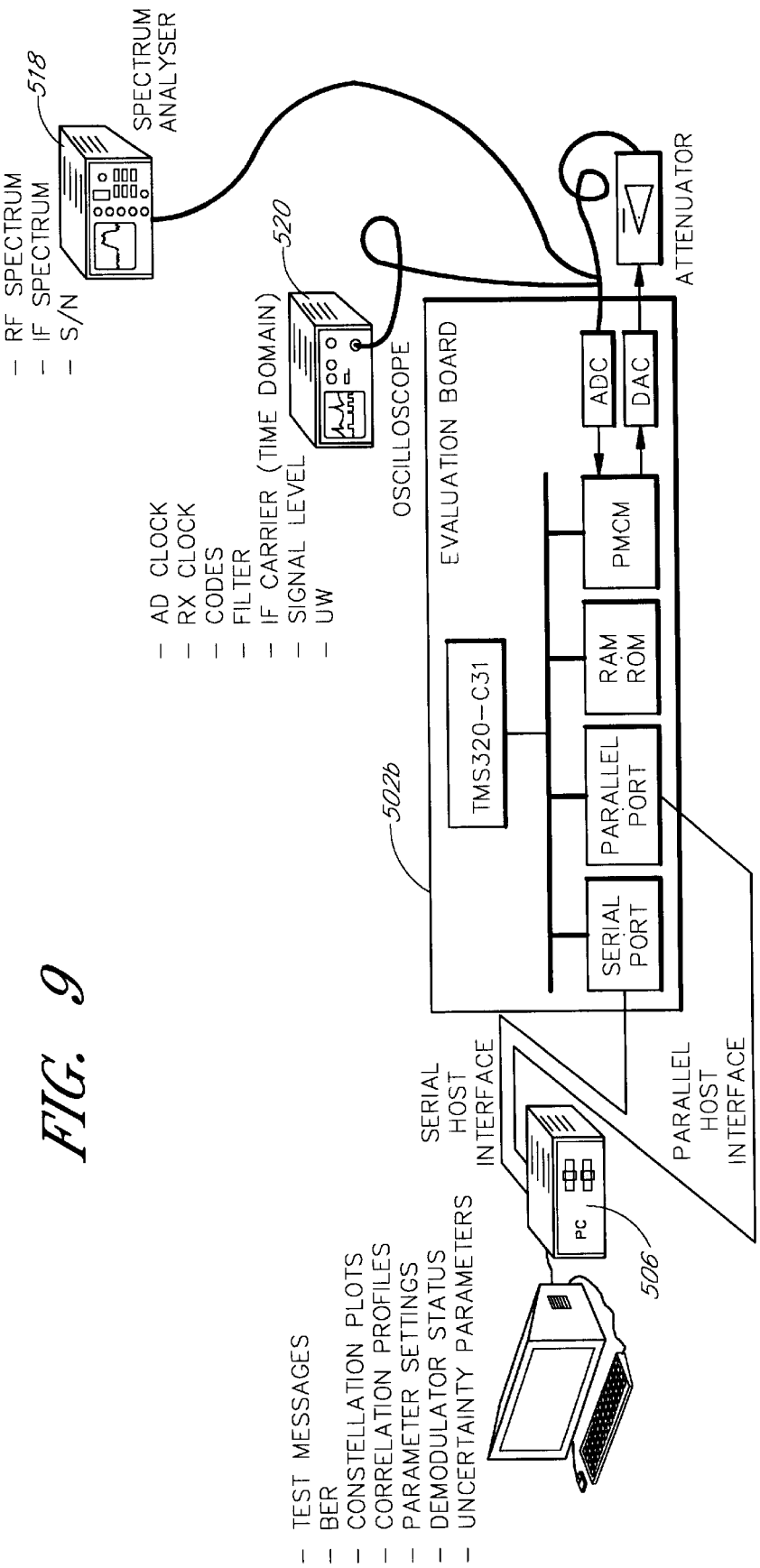
FIG. 9 depicts an alternative setup configuration of the development kit in accordance with the invention for a full duplex link using a single evaluation board.

The baseband configuration using one evaluation board is shown in FIG. 9. The more general set-up using two kits is shown in FIG. 7.

In these set-ups, the data is provided by the computer 506 at the transmitter side (site 1), or a test image is generated by the DSP 532 or read from EPROM 534a. The image can be displayed on a display 512 at the receiver side (site 2). Full duplex operation on two modems can be demonstrated by sending control commands from the receiver side back to the transmitter side.

The next sections describe user configuration of a modem, and measurement of the performance of the modem. First, data acquisition for the environment are explained, and how the received data can be interpreted. Next, tuning the modem parameters is described.

Additional Equipment.

In order to perform all measurements, some additional equipment is used.
  A 50 Mc oscilloscope 520.
  A spectrum analyzer 518 for the ISM band (2.4 GHz) is optional.
  A logic state analyzer is only needed for more specialized applications, where the user wants to re-program the DSP 530 and the FPGA 533.

Conventions.

Any command that is typed in is printed in this type face. Any optional parts of a command are enclosed in square brackets, [like these]. Any alternatives are separated by vertical bars. Any user-defined values are printed in italics, like this. Any numbers are to be considered decimal numbers. Hexadecimal numbers are preceded by '0x', such as in 0x77, the ASCII code for the letter 'w'.

Booting.

When the power is turned on, the modem boots from the EPROM 534a. This activates two different processes: The modem Tx and Rx are started with default parameters, and the user interface of the modem starts communicating to the user via the RS-232 interface 538 (if there is no terminal or PC connected to the RS-232, this cannot be seen).

If a computer is connected to the RS-232 interface 538, any graphical user interface can replace the textual user interface.

The textual user interface is a menu of parameters checking/setting commands. Each command can be activated by typing at least the first two letters of its name. Typing "help" shows the following help list:

| | |
|---|---|
| help | shows this list of commands |
| baud | set host interface baud rate |
| input | <1..3> transmit data source |
| output | <1..4> receive data sink |
| tx | input transmit string |
| rx | print received string |
| frame | [2..67] set frame length |
| uw | set unique word (0..228..255) |
| modulat | <1-2> use BPSK or QPSK modulation |
| filter | <0-1-2-3> turn Tx/Rx filter off/on |
| hold | set Tx hold factor |
| dcim | set Rx decimation factor |
| tfchip | set TX chip freq offset (Hz) |
| rfchip | set RX chip freq offset (Hz) |
| if | set IF (MHz) |
| tcarrier | set TX carrier offset (Hz) |
| rcarrier | set RX carrier offset (Hz) |
| tstep | step in 1 TX chip |
| rstep | step in 1 RX chip |
| swap | swap PN codes |
| ilevel | set I level (0 to 127) |
| qlevel | set Q level (0 to 127) |
| dwell | set symbol dwell (1..50) |
| dllbw | set dll band width (1..500 rad) |
| pllbw | set pll band width (1..500 rad) |
| dg | set dll gain (..1..) |
| pg | set pll gain (..1..) |
| bitdec | <0-1> reverse sign bit decoding |
| ferr | <n> set uncertainty carrier (Hz) |
| pnlen | <11-15-25> set PN code length |
| update | [1..100] set tracking update rate |
| rate | <n> set symbol rate |
| ccodes | <I Q> change code indices |
| zcodes | put codes to all-zero |
| gain | display AGC gain |
| ber | [n] display [reset] BER [frame] |
| status | print SDM status |
| dspif | display DSP interface status |
| pcodes | print PN codes |
| scatter | record 10 scatter plot points |
| corr | print correlation profile |
| timer | <0-1-2> set timer to off-Tx-Rx |
| debug | print integer debug variable |
| fdebug | print float debug variable |
| run | re-run program from the start |
| rinit | reinitialize the PMCM-DSIC |
| reset | reset phasers on PMCM |
| clear | reset TX and RX carrier and chip frequency |
| halt | discard interrupts |
| on | turn TX on |
| off | turn TX off |
| lock | (re-)lock and track |

Most of these commands work in two ways: typing a command followed by a parameter value sets the new value, and typing the command without a parameter displays the current parameter setting.

Setting up the Host Communication.

If a host computer or terminal is connected to the RS-232, the communication parameters are defined.

Setting the Host Interface Baud Rate.

Using the baud command sets the host interface baud rate for the RS-232 serial communication link. The default is 19200 baud. This baud rate has nothing to do with the modem function as such.

Transmit Data Source.

Figure 11:
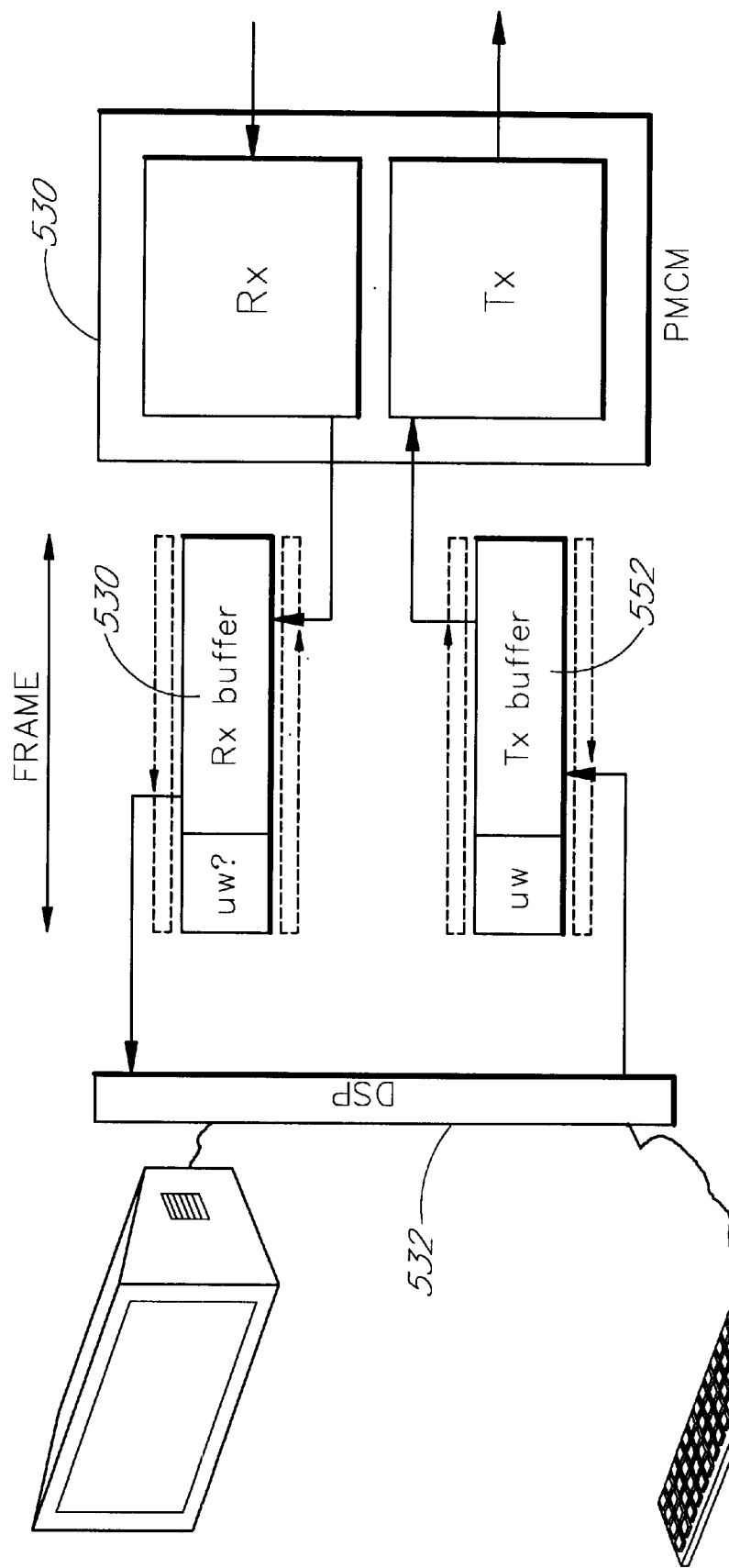
FIG. 11 depicts a communication configuration using circular FIFO buffers for communication between the PMCM and a DSP.

The modem transmits the contents of a 67 byte FIFO 550 (see FIG. 11). If the FIFO 550 is filled with static data (e.g., a text message), the modem transmits this message continuously.

The first byte of the message is a unique word (UW) (default: 0xE4 or 228). The UW is used to synchronize the frames. It is also used to determine the sign of the demodu-lation to resolve the 180 degrees phase ambiguity of the carrier (see FIG. 10). The remaining 66 bytes can be used as payload.

There are several sources to fill the transmit buffer payload. To set up various test sites, data can be taken as follows:

Type 1 input means a continuous transmission of a message of up to 66 bytes of ASCII, to be typed in via the keyboard of the PC controlling the modem board.

Type 2 input means a continuous transmission of a set of images stored in the EPROM on the modem board.

Type 3 input means transmission of a file via a 9600 baud RS-232 input.

The input command selects one of these possibilities.

EXAMPLE

When selecting input mode 3, one must make sure the host interface baud rate is set to 9600 baud, and the modem data rate is at least 10 kb/s, otherwise the modem will be overrun.

Transmit Data Buffer.

If the first input mode is selected, a message can be typed into the Tx buffer by using the tx command. If no argument is issued, the contents of the Tx buffer are displayed.

If either input mode 2 or 3 is selected, the Tx buffer is continuously updated with new frames. Inspecting the Tx buffer by the tx command, displays a snapshot at a particular moment in time.

The default contents of the Tx buffer is the default unique word (Uw), followed by an all-zero message.

Receive Data Sink.

There are several ways to process received data.

Type 1 output means the received bytes are stored in the Rx circular buffer 550, and no other I/O is performed.

Type 2 output means the received bytes are stored in the Rx circular buffer 550, but also sent out via the parallel port. A host computer connected to this port can interpret the data as images and display them in real-time.

Type 3 output means the received bytes are stored in the Rx circular buffer 550, and also sent out as ASCII characters over the RS-232 link.

Type 4 output means the received bytes are stored in the Rx circular buffer 550, but modem statistics, such as the bit error rate (BER) and the tracking frequency offsets are sent out via the parallel port 536. A host computer 508 connected to this port interprets the data and plots the data in real-time.

The output command selects one of these possibilities.

Receive Data Buffer.

The received data are always stored in the 67 byte circular buffer 550. At any moment a snapshot of this buffer can be displayed for inspection, by typing the rx command.

Frame Length.

The length of the frame (which is equal to the length of the circular communication buffers) can be set to any value between 2 and 67. Use the command frame to inspect or reset the frame length. The default frame length is 67.

Unique Word.

The unique word (UW) is the first byte of any transmitted frame. The UW command is used to set or inspect the UW value. The default value is '0xE4', which is outside the normal 7-bit ASCII range. When transmitting images, the coding is selected in such a way that the unique word is not part of the data.

For transmitting binary files, a byte stuffing algorithm is used to avoid confusion with the unique word.

Setting the Modem Parameters.

Selecting the Modulation Scheme.

One can select either a BPSK or a QPSK modulation scheme. BPSK is installed through the command mo 1. QPSK is installed through the command mo 2. Typing mo reports the current setting. The default setting is QPSK.

Using either mode does not change the symbol rate. It does, however, change the bit rate, which is 2 times higher for QPSK.

Switching the Filters. The PMCM-DSIC 530 contains a root-raised cosine filter in both the Tx and the Rx. These filters can be bypassed. For some of the measurements, it is necessary to switch these filters off. Use the filter command controls the signal flow, as follows:

filter 0 bypasses both the Tx and the Rx filters.

filter 1 bypasses the Rx filter only.

filter 2 bypasses the Tx filter only.

filter 3 bypasses neither the Tx, nor the Rx filters.

In the normal operation mode, the signals run through the filters, so the default value is 3.

Tx Hold Factor.

The Tx hold factor can be set using the hold command between 1 and 1023. Its effect is to over-sample the Tx main clock accordingly. Increasing the hold factor does not change the chip rate, the symbol rate or the IF carrier frequency. However, increasing the hold factor increases the resolution of the carrier wave (in samples per carrier period).

allows de-coupling of the carrier frequency and the chip frequency.

EXAMPLE

If the symbol rate and/or PN length is low, the chip frequency is also low, and the 8-fold over-sampled chip clock generates a carrier up to Pn×rate×4 Hz. Using a hold factor of 10, generates a 10-times higher carrier frequency.

The hold factor is limited by the inequality Pn×rate×8×hold<Xtal/z=20 MHz. The Tx hold factor is not related to the Rx decimation factor. They can be set independently from each other.

Rx Decimation Factor.

The dcim command inspects or sets the Rx decimation factor between 1 and 1023. The default value is 1.

Increasing the decimation factor decimates the incoming symbols accordingly by sending out the mean value. Increasing the decimation factor does not change the external symbol rate. Instead, it up-samples the Rx chip clock.

The Rx decimation factor is not related to the Tx hold factor. They can be set independently from each other.

Tx Chip Frequency Offset.

The tfchip command inspects or sets the Tx chip frequency offset (in Hz). It can be positive or negative. It can be used to simulate crystal mismatches on one modem board. This allows to investigate the chip frequency PLL performance.

Rx Chip Frequency Offset.

The rfchip command inspects the Rx chip frequency offset (value in Hz), which is continuously updated by the chip frequency PLL.

Carrier frequency.

In contrast to the chip frequency, which is set implicitly, the carrier frequency can be set explicitly with the if command. The frequency of the digital intermediate frequency (IF) can be set up between DC and half of the over-sampled chip frequency. The argument value is in MHz.

Tx Carrier Frequency Offset.

The tcarrier command sets the Tx carrier offset (in Hz). It can be positive and negative. It can be used to simulate Dopler shifts on one modem board. This provides monitoring of the carrier frequency PLL performance.

Rx Carrier Frequency Offset.

The rcarrier command is used to inspect the Rx carrier offset (in Hz), which is continuously updated by the carrier frequency PLL.

Tx Chip Phase Step.

The tstep command advances the Tx PN code generator by 1 chip.

Rx Chip Phase Step.

The tstep command advances the Rx PN code generator by 1 chip.

Power Level of the I Branch. The i level command inspects or sets the gain of the I branch. It can vary between 0 and 127. The default value is 127.

Power Level of the Q Branch.

The qlevel command inspects or sets the gain of the Q branch. It can vary between 0 and 127. The default value is 127.

Symbol Dwell.

During the chip phase acquisition, the correlations for each candidate chip phase offset can be averaged over a number of consecutive symbols. The average is the symbol dwell. It can be set by the dwell command. The default is 2.

The chip phase acquisition time (ta) is proportional to the symbol dwell, because a sequential chip phase acquisition algorithm is used. The approximate acquisition time can be computed as $ta = pn-len \times \frac{2}{3} \times dw$.

The carrier and chip frequency are not tracked during acquisition. The acquisition time, $t_a$, must be small enough, so that the PLLs can lock in after acquisition. The allowable frequency drift depends on the PLL band widths.

Due to crystal mismatches, the optimal chip phase may drift by more than half a chip by the time it is detected. In that case, the chip frequency PLL locks in a wrong state.

Bandwidth of the Chip Frequency PLL.

The dll-bw command sets or inspects the analog bandwidth of the chip frequency PLL. It is expressed in rads, and the default value is 50 radians. It should not be set lower than 1 rad.

Increasing the bandwidth increases the chip frequency offsets that can be tolerated, but it also increases the noise sensitivity of the PLL. In general, frequency steps equal to the bandwidth should not disturb the PLL.

Bandwidth of the Carrier Frequency PLL.

The dll-bw command sets or inspects the analog band width of the carrier frequency PLL. It is expressed in rads, and the default value is 100 radians. It should not be set lower than 1 rad. Increasing the bandwidth increases the carrier frequency offsets that can be tolerated, but it also increases the noise sensitivity of the PLL. In general, frequency steps equal to the bandwidth should not disturb the PLL.

Gain of the Chip Frequency PLL.

The dg command inspects or sets an additional gain factor in the chip frequency PLL. The default value is 1. The gain is positive, but can either be larger or smaller than 1.

Gain of the Carrier Frequency PLL.

The pg command inspects or sets an additional gain factor in the carrier frequency PLL. The default value is 1. The gain is positive, but can either be larger or smaller than 1.

Phase Ambiguity.

The bitdec command inspects the sign of the bit decoding. This sign is computed during the frame lock procedure, based on the detection of the unique word or its inverse. Reversing its computed value alters this sign. The default for the argument is "1," which means 0 degree phase shift. A value "0" causes a 180 degree phase shift.

Carrier Frequency Uncertainty.

The ferr command sets or inspects the carrier frequency uncertainty range. The modem continuously monitors the Rx carrier frequency offset, and determines that the link is lost if the carrier offset falls outside the specified uncertainty range. The value is specified in Hz, and the default is 600 Hz.

PN Code Length.

The pnl en command (11, 15 or 255) sets the length of the used PN codes, but also selects a type of a code (Barker, maximum length and Gold (all well known), respectively). Alternate code generators can be provided by the user.

Tracking Update Rate.

The update command (between 1 and 100) sets the tracking update rate. The default value is 1, which means one update of all tracking parameters per received QPSK symbol. Using a larger update parameter allows a high data rate, at the expense of a coarser tracking algorithm.

Symbol Rate.

The rate command sets or inspects the QPSK symbol rate. The rate of the Tx and the Rx should be identical. After altering the rate, one has to re-lock the modem. The rate command without argument reports the selected rate.

Since the modem uses QPSK, each symbol corresponds to two data bits. The bit rate of the modem is twice the symbol rate.

Code Set Selection.

The Gold code generator of length 255 can generate 255 different code sequences. Selecting an I and Q code is done through the ccodes command, with 2 arguments. The default selection is (1, 2).

Clearing the PN Code Cache Memory.

The PN code cache memory on the PMCM-DSIC 530 can be explicitly cleared by the zcodes command. This is useful for measuring the carrier waveform.

Inspecting the Modem Status.

At any time the control variables of the modem can be inspected. These displays offer a snapshot of a time-varying function.

AGC Value.

The gain command displays the current automatic gain control (AGC) value. The AGC value cannot be altered by the user, therefore any arguments are neglected.

Bit Error Rate.

The ber command displays statistics about the link quality.

The bit error rate (BER), in faults per bit over the last BER measurement frame. The BER is computed on the payload, not on the unique word.

A unique measurement number corresponding to the currently stored BER. This allows to distinct between two consecutive BER readings.

The length of the current BER measurement frame.

The maximal BER since the last BER reset.

The number of received bits since the last lock command or automatic re-lock action.

The number of bit faults per received unique word bits.

The number of received, serviced, and skipped Rx interrupts.

The readings can be reset by typing ber 0. The BER measurement frame can be set by typing ber.

To perform a BER measurement, the received data is compared to the transmitted data, which must be known data. Therefore, the BER measurement only makes sense if input mode 1 is selected, and the Tx buffer contents is an all-blank message, preceded by a unique word (0xE4, 0x20, 0x20, 0x20, . . . , 0x20). To set the Tx buffer properly for BER measurements, type tx (tx followed by at least one blank).

Demodulator Status.

The demodulators of the PMCM can be in different states which are monitored by a state diagram manager (SDM). Entering the command status displays the status of the demodulator as monitored by the SDM.

DSP-PMCM Interface Status.

The DSP interface is a circuit on the PMCM-DSIC through which all communication between the DSP 532 and the PMCM 530 occurs.

The status of the interface after each communication, is provided through the status command. The status includes the value of the 3 write-acknowledge bits, and the write delay of the last access.

This command also reports write errors.

The status can be reset by the reset command.

PN Codes.

The command pcodes prints the I-branch and Q-branch PN codes on the screen.

Constellation Diagram.

When the modem has passed the chip phase acquisition, a constellation plot for the I and Q bits can be obtained by issuing the scatter command.

Correlation Profile.

During the chip phase acquisition procedure, the modem performs an exhaustive search for the PN chip phase, while assuming the carrier frequency and the chip frequency are close to the nominal carrier and chip frequency. These correlation profiles are recorded during acquisition by the lock command. Once in lock, the profile can be dumped by typing corr.

Interrupt Rates.

The interrupt rates of the Tx (one quarter of the symbol rate in QPSK mode) and the Rx (equal to the symbol rate in QPSK mode) can be measured by the timer command. Selecting timer 1 sets the timer to measure the Tx rate. Selecting timer 2 sets the timer to measure the Rx rate. Typing ti (without argument) shows the last recorded measurement. Selecting timer 0 disables the timer, and sets the value to 0.

Debug Variables.

Any integer and floating point debug variable that one can assign somewhere in the program to the global variables debug and fdebug, can be shown by the debug and the fdebug commands, respectively.

Controlling the Modem.

A list of the run-time commands that control the modem software follows:

Re-starting the Modem Software.

The run command performs a warm start. The settings of the PMCM-DSIC are switched to the defaults.

Re-initializing the Modem Hardware.

The rinit command reinitializes the PMCM-DSIC 530 with the current settings. It does not download the default parameters.

Resetting the Modem Hardware.

The reset command does not clear all the PMCM-DSIC registers, it resets the write-acknowledge circuit of the DSP-PMCM interface.

the complex phasers of the PN code NCO and the carrier NCO to itoj. The only way to set these phasers into a known state, if to first set the chip or carrier frequency to 0 Hz (this freezes the phaser), and than give the reset command to set it to position itoj.

Setting the chip frequency to 0 Hz also freezes the handshake hardware inside the DSP-PMCM interface. The effect is that writing parameters to the PMCM-DSIC will result in (false) write errors, but the parameters will be programmed correctly. The chip frequency, which is equal to pnlen x symbol_rate, cannot be set directly. It can be set to zero in two indirect ways:

By setting a negative chip frequency offset exactly equal to the nominal chip frequency.

By setting the symbol rate to zero.

Resetting the NCOs.

The chip and carrier frequencies of both the Tx and the Rx can be reset to the set-up nominal values by the clear command.

The nominal values however are not reset to their default values. The nominal chip frequencies cannot be set directly: They adapt automatically with changes in the symbol rate or the PN code length parameters.

Stopping the Modem.

The halt command disables both the Rx and Tx part of the software. The user interface stays active, and also the Tx part of the PMCM-DSIC retains its settings.

Turning the Tx Off.

To save transmission power, the Tx can be disabled by the off command.

Turning the Tx On.

After using the off command, the Tx can be re-activated by the on command.

Start the Rx Modem Function.

The lock command starts the chip phase acquisition algorithm, followed by a continuous tracking and decoding. It reports the selected chip phase and the initial AGC value, when switching from acquisition to tracking.

Design of PN Code Sequences.

On the host computer, a software aid is added to design, evaluate, and download PN codes.

Also, code generators are built inside the TMS320-C31 software, part of this development kit. There are three generators available:

one for a Barker code of length 11. The I and Q codes are reversed.

one for code length 15. The I and Q codes are reversed.

a more complex set of Gold code generators of length 255, with 193 balanced codes (numbered from 1 to 193) and 63 unbalanced codes (numbered from 194 to 256).

any other code generator added by the user.

When setting the code length with the pn_len command, the appropriate code generator is activated and the codes are automatically downloaded in the code cache inside the PMCM-DSIC. The default length is 255.

Measurements.

This subsection describes the procedures, i.e., the measurements, set-ups and the corresponding parameter settings, to check the parameters that can be downloaded.

Tx Data Rate. The Tx generates a data request data_rq pulse every 8 data bits (i.e., every 4 symbols in (O)QPSK mode, and every 8 symbols in BPSK mode). This pulse is used as interrupt signal INT1 on the TMS320. This measures the rate of the main Tx NCO, which is 8 times the INT1 rate.

A cross check is available by setting the TMS320 timer to measure the Tx interrupt rate (type the command ti 1), and then typing fd several times displays the measured frequency in Hz. The number should be 4 times lower than the symbol rate.

The maximum chip rate is 40 MHz/2/8=2.5 MHz. This rate is also equal to Pn×rate.

To demodulate, the Rx data rate should be set equal to the Tx data rate. In full duplex mode, the Tx rate may be different from the Rx rate on the same DSIC.

Rx Data Rate. The Rx generates a data_rdy pulse every symbol. This pulse is used as INT2 on the TMS320. Measure it at pin 34 of the EPLD. This measures the rate of the main Rx NCO, which is 4 times the INT2 rate.

A cross check is available by setting the TMS320 timer to measure the Rx interrupt rate (type the command ti 2). Typing fd several times displays the measured frequency in Hz. The number should correspond to the symbol rate.

Note that the maximum chip rate that can be generated is 40 MHz/2/8=2.5 MHz. This rate is also equal to Pn x rate.

To demodulate, the Rx data rate should be set equal to the Tx data rate. In full duplex mode, the Tx rate may be different from the Rx rate on the same DSIC.

Tx Interrupt Duty Cycle. It is important in developing the TMS320 software to measure the interrupt duty cycles. If the duty cycle of the interrupt becomes close to 100, the interrupt servers take too much time to execute. The processor will hang, as the main program cannot execute.

The interrupt duty cycle can be measured with an oscilloscope, provided that the interrupt server pulls an output pin high when starting, and pulls it low again when finishing. In the present embodiment, certain commands can be used to indicate what signal is present on one or more output pins. In the present embodiment, the command ti 1 causes the transmission (Tx) interrupt duty cycle to be apparent on an interrupt pin of the PAL (Program Array Logic) 535 of the evaluation bore which can also be provided with an EPLD (Electrically Programmed Logic Device). The PAL or EPLD, as the case may be, is programmed to monitor signals in the modem for the purposes of trouble shooting. The LSA interface 537 provides the pins for monitoring of the signals in the evaluation board.

Rx Interrut Duty Cycle.

It is important in developing the TMS320 software to measure the interrupt duty cycles. If the duty cycle of the interrupt becomes close to 100, the interrupt servers take too much time to execute. The processor will hang, as the main program cannot execute.

The interrupt duty cycle can be measured with an oscilloscope, provided that the interrupt server pulls an output pin high when starting, and pulls it down again when finishing. The ti 2 command causes the interrupt duty cycle to be apparent on the interrupt pin of the EPLD 535 which can be accessed through LSA interface 537. This is the same pin as used to provide for the Tx interrupt duty cycle discussed in the previous paragraph.

Tx Codes.

To visualize the downloaded Tx codes for the I-branch and the Q-branch on an oscilloscope, turn the Tx CMF filter off set the IF frequency to 0 set the I-branch level to 0 for the Q-codes, and the Q-branch level to 0 for the I-codes Use no modulation, i.e., transmit all zeroes, by selecting the Tx data buffer for continuous transmission and clearing its contents to all zeroes (the default state after a RUN command)

set the unique word UW to 0

Trigger the scope on the Rx IRQ (pin 35 of the EPLD). Measure the IF output of the Tx board.

The slope of the pulses is a measure for the RC constant of the IF output.

The gain of the output opamp can be adjusted to avoid overload, because turning the PMCM filter off increases the output level by a factor of 2 to 4.

The codes are projected onto the carrier phaser, which can be in any position, depending on the moment one turned the carrier frequency is zero. The reset command sets the phaser to phase zero (position on the real axis). In this case, the I-code comes through with maximal gain, and the Q-code is equal to zero.

Tx IF Carrier.

To visualize the Tx carrier on an oscilloscope or spectrum analyzer, that is generated in the transmitter via a Cordic-based Direct Digital Synthesizer, the Tx CMF filter is turned off the IF frequency is set to the desired value zeroes are loaded for all Tx codes (using the command zcodes The scope is triggered on the Rx IRQ (pin 35 of the EPLD).

The slope of the pulses is a measure for the RC constant of the IF output. The IF output can be used to measure the phase noise of the up-convertors.

The maximal IF frequency that can be generated is half of the Tx NCO clock frequency, which is the 8-fold over-sampled Tx clock, depending on the PN code length and the selected symbol rate. Thus, $IF_{max}=\frac{1}{2}(8 \times pn \times rate)$.

EXAMPLE

With a code length of 15, and a symbol rate of 2000 symbols per second, the maximum carrier frequency is 0.5×8×15×2000=0.120 MHz.

Therefore, a hold factor should be set. The highest over-sampled chip frequency is limited by the Nyquist rate (e.g., 20 MHz for a 40 MHz clock).

The minimal IF frequency that can be used is the signal bandwidth, which depends on the PN code length and the selected symbol rate. Thus, $IF_{min} \approx pn \times rate$.

EXAMPLE

With a code length of 15, and a symbol rate of 2000 symbols per second, the minimum carrier frequency needed is 15×2000=0.030 MHz.

The amplitude of the IF carrier changes with the frequency. This is because of the impedance of the output filter.

For the phases of the I branch carrier (set ql 0 and il 127) and the Q-branch carrier (set il 0 and ql 127) differ 90 degrees, the sum (set il 127 and ql 127) differs 45 degrees.

The instantaneous phase of the carriers depends on the initial phaser position when the if XXX command was issued. This phase is not necessarily stable. It depends on the exact NCO frequency and carrier frequency. If the NCO or carrier NCO increment is not an integer part of the NCO range, truncation errors cause a slow carrier drift. The phaser can be explicitly reset to zero by the reset command. The I or the Q branch can be turned off (il 0 or ql 0) to observe the correct initial phase. A carrier of half the Nyquist rate (set if to Pn×rate×2) yields 4 samples per period.

Tx Hold Factor.

The Tx hold factor can be set between I and 1023 to over-sample the Tx main clock accordingly. Increasing the hold factor does not change the chip rate, the symbol rate or the IF carrier frequency. Only the resolution (in samples per chip, symbol or carrier period) increases. This decouples the carrier frequency and the chip frequency. For instance, if the symbol rate and/or PN length is low, the chip frequency is also low, and the 8-fold over-sampled chip clock generates a carrier up to Hz. Using a hold factor of 100, generates a 100-times higher carrier frequency.

The hold factor is limited by the inequality Pn×rate×8×hold<xtal/2=20 MHz.

Tx CMF Filter Loss.

To measure the Tx CMF filter loss, the Tx carrier at a particular frequency is measured while the Tx filter is turned on and off (fi 0 and fi 3). The difference in amplitude is measured on an oscilloscope. This procedure eliminates all other frequency dependent losses (such as the DAC RC filter loss).

Rx CMF Filter Loss.

The Rx CMF filter loss is equal to the Tx CMF filter loss.

Tx CMF Filter Step Response.

To measure the step response in the time domain, an all zero code the Tx buffer is selected to all "w" (code 0×77)

the UW is set to 119 (0×77)

the IF frequency is set to 0 the I or Q branch only is selected (one may be more appropriate than the other depending on where the carrier phaser has been frozen when setting the carrier frequency to zero)

the Tx IF output is examined on the scope, triggering on the Rx interrupt (a pin of the EPLD).

In this way, the Tx output is a periodic sequence 010101010101 . . . . On every transition, the step response of the 8-fold over-sampling Tx CMF is visible.

The LEDs.

The board features 4 LEDs to indicate the status of the modem (such as in-lock, locking, coasting, etc.) and to be used to optimize the software performance.

Eye Diagrams.

Eye diagrams can be recorded on an oscilloscope by selecting input mode 1 loading an appropriate message in the Tx buffer selecting an appropriate short frame length and PN code, so the full buffer fits on one trace line triggering on the unique word Designing a Dedicated Demodulator.

The development kit allows easy design of a new demodulator. The timing recovery algorithm, the carrier synchronization and the transient behavior of the modem can be customized.

With a "starters development kit", a complete QPSK demodulator is supplied. It is written in ANSI-C, and runs on the TMS320-C31 processor. The optional FPGA is not used.

Figure 10A:
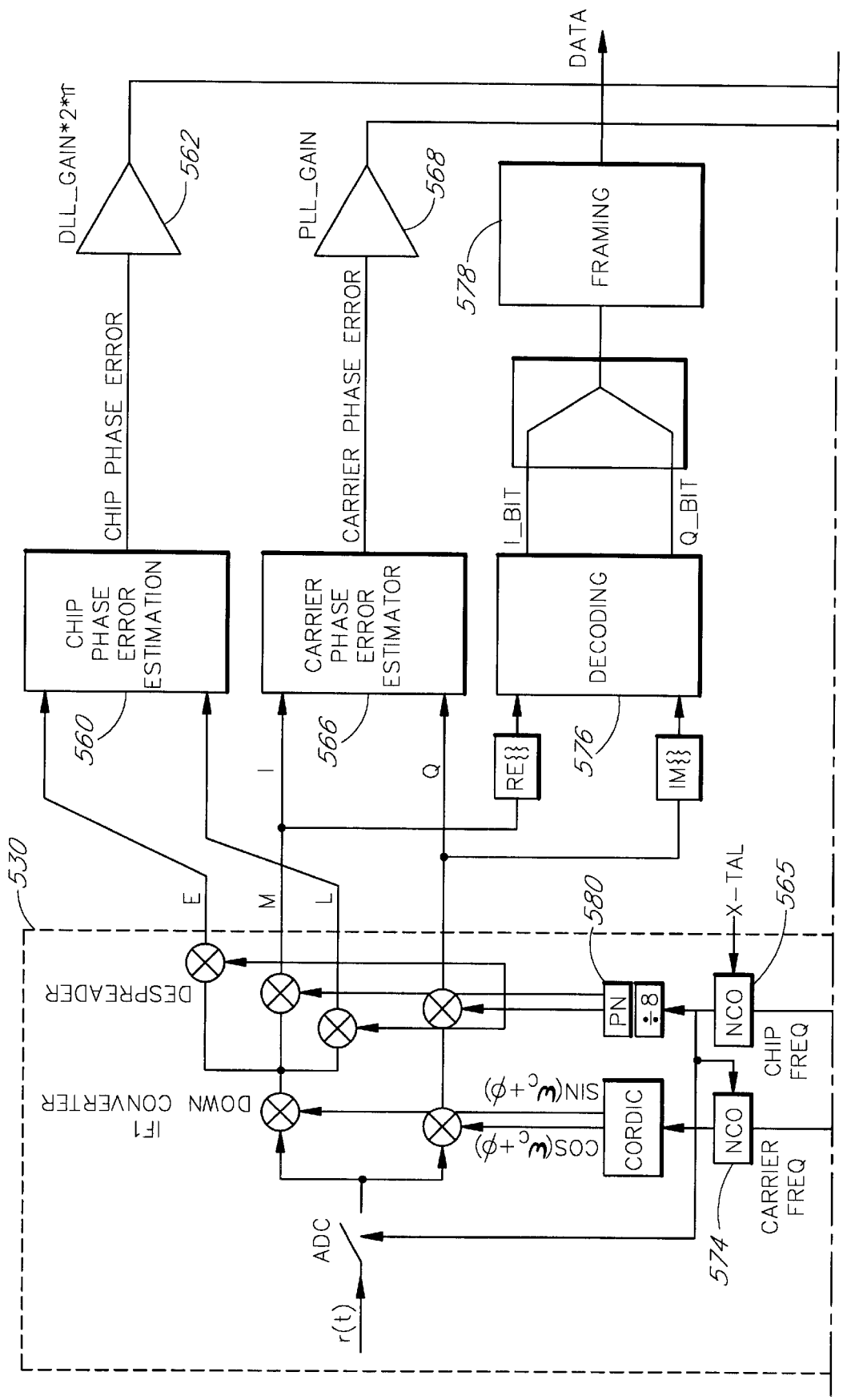
FIG. 10 depicts a complete QPSK demodulator which can be provided using ANSI-C computer language and the connection to the PMCM chip.
Figures 10, 10B:
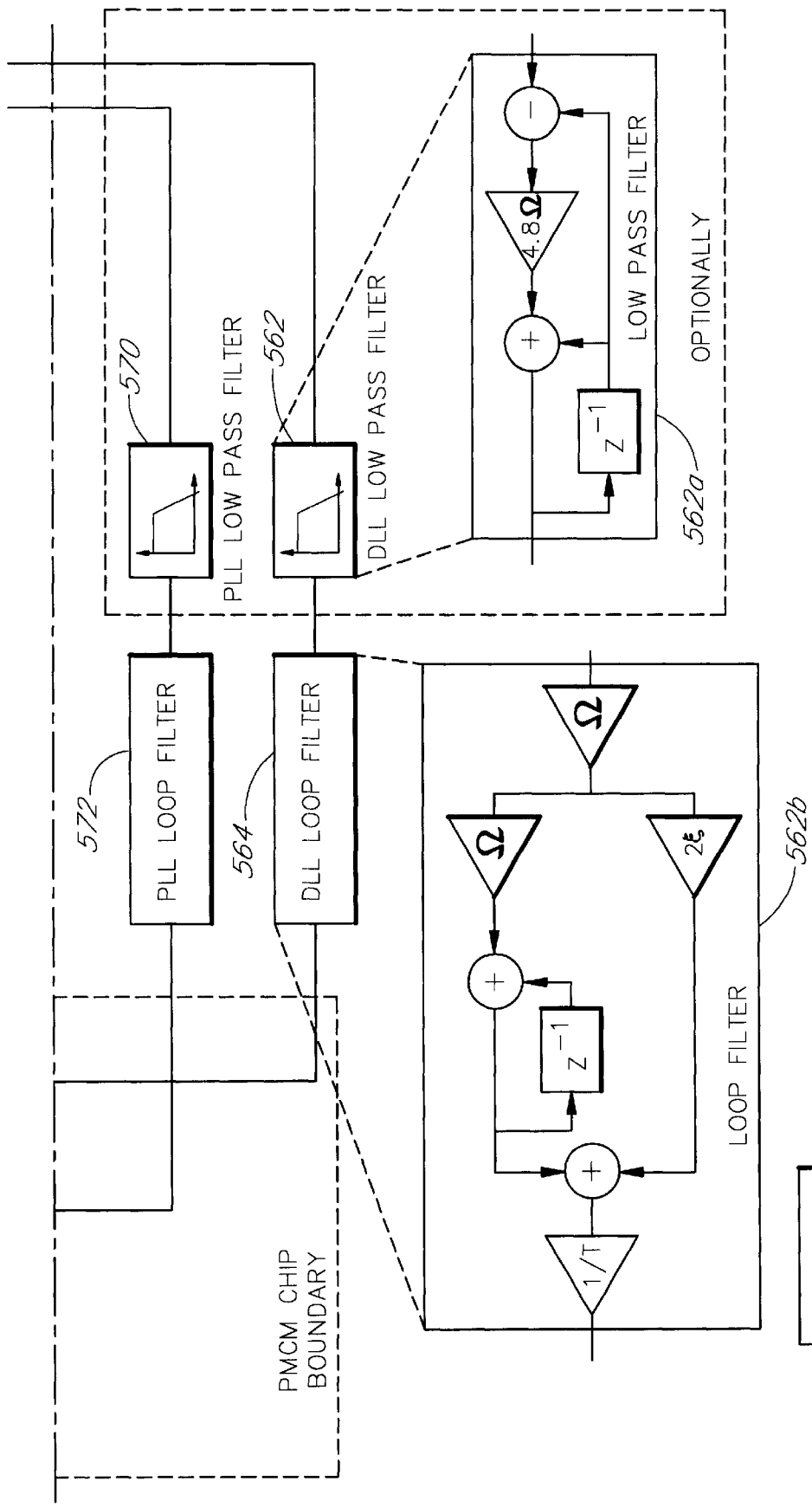

The starts kit provides data rates up to about 13 kb/s. The overall concept is shown in FIG. 10. The minimal functionality is a phase-lock loop (PLL) to track the carrier frequency and phase, and a DLL to track the chip frequency and phase. Furthermore, the down-converted and de-spread symbols are decoded and formatted into a byte stream. Also included is a serial chip phase acquisition algorithm, that initializes the chip frequency PLL.

As depicted in FIG. 10, a chip phase error function 560 receives output data from the PMCM 530 early and late correlations. This estimation block measures the error on the code bits phase in fractions of the code bit. Using a conventional early-late technique. The chip phase error is amplified and filtered using the amplifier 562 and the dll low pass filter 562 and DLL loop filter 564. The phase error is then used to control the chip (code bit) frequency NCO 564 in the PMCM DSIC 530. The illustrations with dotted lines in FIG. 10 from the DLL low pass filter 562 and DLL loop filter 564 are more detailed in illustrations 562a, 562b, of the filters utilized for those functions. It should be noted that the low pass filter 562 is an optional filter in accordance with the present embodiment. The chip phase error is used to adjust the chip frequency NCO 565.

A carrier phase error estimation function 566 detects the I and Q error on the down-converted carrier wave, by utilizing the residual angle between the real axis and the rotated real signal. The carrier phase error is amplified in an amplifier 568 and subjected to filtering in the phase lock loop low pass filter 570 and the PLL loop filter 572. The phase lock loop low pass filter 570 is an optional filter. The carrier phase error is then used to control the carrier frequency in numerically controlled oscillator 574 in the PMCM-DSIC 530.

A decoder 576 utilizes the real and imaginary branches of the I and Q signals to determine the modulation data bit (0–1), accounting for the "sign" signal, generated by a carrier phase estimation. This is a comparison of the unique word (UW) to resolve an inherent 180 degree phase ambiguity.

The framing function module 578 creates a stream of bytes from a stream of bits, using the unique word (uw) once again. The framing module also reconstructs frames from the stream of bytes. As described above, each frame begins with the unique word (UW) followed by the payload of data bytes.

The PLL loop filter 572 executes the close-loop transfer function of the phase lock loop, which in the present embodiment is a second or third order control loop. The dynamics and steady state behavior of the control loop in this environment are well known in the art.

The DLL loop filter 564 executes the close-loop transfer function of the delay locked loop, which in the present embodiment is a second or third order control loop.

As depicted in FIG. 10, a divide by 8 function is executed on the chip frequency clock 565 by the divide by 8 function 580. This is because an 8-fold over-sampled version of the chip frequency clock is used to control the A/D converter (ADC) such as the ADC 540. The division is not provided on the carrier frequency NCO 574 because the carrier frequency NCO is clocked by the over-sample clock.

The PLLs have been designed in the analog domain. The digital versions have been obtained by applying a unilinear transform $1/s = T/1-z^{-1}$, where T is the sample rate of the PLL, which is taken equal to the symbol rate. This means that the loops are updated exactly once per symbol. Other rates are also acceptable; however, the sample rate of the filters is hidden in the multipliers.

The software is full duplex. This means that the Tx and the Rx software execute in parallel, together with the user interface. The communication between the PMCM and the TMS320-C31 is interrupt based. FIG. 11 shows a configuration of the communication channels as circular buffers. More particularly, FIG. 11 shows a simplified diagram of communication between the DSP 532 of the evaluation board of the development kit and the PMCM 530 of the evaluation board of the development kit. As depicted in FIG. 11, a pair of FIFO buffers 550, 552 provide communication buffers between the PMCM 530 and the DSP 532. As depicted in FIG. 11, the receive buffer 550 is depicted with the unique word followed by the data as is the transmission buffer 552. As described above, the unique word identifies the beginning of a frame and is used for synchronization and to assure that tracking is maintained. Also shown in FIG. 11, the DSP 532 is coupled to the display and the keyboard for user input and display. This is a simplified connection and the communication occurs through the parallel or serial port for the host.

Transmitting Data.

The PMCM generates a Tx interrupt every 8 bits (every 4 symbols in QPSK). The DSP reacts to this interrupt by writing one byte of data to the PMCM. Internally, the DSP maintains a FIFO of 67 bytes, used to buffer between the UART or the ISA interface (which supply the data) and the PMCM. One location is reserved for the unique word (UW), which assures the UW is send out every 67 bytes. The rest of the transmission process is transparent to the user: The PMCM reads the data byte, formats it, spreads it with the PN sequences, modulates it on the IF carrier, and provides it to the DAC. The PMCM also generates the DAC conversion pulse.

Receiving Data.

Receiving data is more complicated. Again, the PMCM determines the sample moment of the ADC 540. The PMCM 530 reads the ADC data, down-converts it from IF to baseband, and feeds it to the correlators. Fourteen 16-bit correlation results are offered each symbol; each correlation result is split in two bytes. When the correlation results are ready, the PMCM 530 signals an Rx interrupt to the DSP 532, which reads the correlation values before the next Rx interrupt occurs.

In case the FPGA 533 is present, the DSP 532 should read the correlations from the PMCM (maximally 32 bytes to read) and send them to the FPGA 533, which can then run either the acquisition loop or the tracking loop, depending on the status of the modem.

The DSP 530 maintains the modem status. This is done by reading status bits from the FPGA 533. Every 24 bits, the FPGA 533 issues an interrupt to the DSP 532, and the DSP reads a 32-bit word, containing 24 data bits and 8 status bits. The DSP 532 sends the received data via either the RS-232 or the ISA slot or the dedicated I/O ports.

If the FPGA 533 is not present, all tracking and acquisition is done in software by the DSP 532. This limits the data rate to approximately 13 kbit/s.

Booting the Modem.

There are two distinct ways to start the modem.

Boot from the on-board EPROM. This is the default boot procedure after a cold start or a hardware reset. The DSP automatically loads its software from the EPROM and starts the modem user interface. If an FPGA is present, it automatically downloads its configuration from the EPROM.

Down-load the DSP software from a host computer. If the reset button is pressed, and simultaneously, the letter 'm' is pressed on the host computer keyboard, the DSP starts in monitor mode. One can then down-load software via the host interface.

Downloading the FPGA configuration file from the host computer is done via the DSP 532.

The IPC Architecture: Communicating Processes

In accordance with the present invention, to describe complex systems and their sub-systems, a hierarchy of concurrent, communicating interprocess communication (IPC) processes are used. The two key entities are IPC processes and IPC communications.

An IPC process is any sub-system with a confined behavior, with autonomous control in at least one control thread, and which communicates to other processes via a well-defined, generic IPC communication protocol.

Any group of IPC processes is an IPC process, providing conceptual process hierarchy. This hierarchy is useful in specifying a complex system in a structural manner. This hierarchy can be removed by flattening. A process has at least one control thread, and may have more than one. Otherwise process hierarchy is not possible. Any behavior which does not have at least one internal control thread is called a function.

Because a process operates its own control thread or threads, a process evolves at its own pace, independent from the other processes in the system, and synchronizes with neighboring processes only at explicit communication instants.

In accordance with the present invention, processes communicate with each other over IPC channels, which are unidirectional, memoryless point-to-point communication media.

All communications over IPC channels happen via a generic IPC protocol. The generic IPC protocol is an abstract protocol behavior. The physical implementation of the generic protocol may use any particular physical protocol such as VME or RS-232.

The interface between a process and a channel is an IPC port. A port is not a process, because then a port would need a port to communicate, which leads to a circular definition of the term port. A port is part of a process. It is a function, and more particular an I/O function, which has a behavior but no control thread.

There are two kinds of ports: input ports and output ports. Only one input port can communicate data to only one output port. All communication channels are permanent, unidirectional from output port to input port, and point-to-point.

Other interprocess communication schemes, such as shared memory, busses, broadcasting, FIFOs, parallel-to-serial convertors, serial-to-parallel convertors, etc. are not primitive IPC communications. Specific IPC processes can simulated or implemented these other interprocess communication schemes.

A port has IPC terminals, which are connected by signal lines or connections to the terminals of the communicating port. For each of the two kinds of ports, some terminals are input terminals, and some are output terminals.

A list of the terminals of an input port of the generic IPC protocol is as follows.

a data terminal, called "data," consisting of a set of input signal lines;

a strobe terminal, called "str," consisting of one input terminal;

an acknowledge terminal, called "ack," consisting of one output terminal.

A list of the terminals of an output port of the generic IPC protocol is as follows.

a data terminal, called "data," consisting of a set of output signal lines;

a strobe terminal, called "str," consisting of one output terminal;

an acknowledge terminal, called "ack," consisting of one input terminal.

Connecting an input port to an output port involves connecting all corresponding terminals. This general connection scheme was shown and described very generally in connection with FIG. 4. As seen in FIG. 4, two process blocks 320, 322 or devices are coupled with an interface 324*a* and 324*b* having the data connections, the strobe connection and the acknowledge connection.

A port (both input and output) may have a blocked or an unblocked behavior, which is called the port behavior class. A blocked behavior means that at any I/O instant, the control flow of the process comprising the port is stalled until the communicating process is synchronized (i.e., is ready to communicate). Unblocked I/O means that the control of the process comprising the port is not stalled at an I/O instant if no ready communication partner is found.

An input port of either behavior class can be connected to an output port of either class. Both an input port and an output port can initiate a communication or data transfer. Whether the writing devices or the reading device begins its I/O process first is not relevant.

As communicating processes may have unrelated clock inputs, all communication through the ports is conceptually asynchronous. Therefore a generic 4-phase handshake protocol is the basic communication technique. The data that is communicated in one handshake cycle is called a IPC message.

Any output port is responsible for having the data stable on the communication channel during the data sampling by the input port. Stable data are indicated by having the corresponding strobe 'str' high. An input port may only sample data from the channel if the according strobe 'str' is high. The strobe itself can be sampled at any time.

Moreover, data on the channel may only be sampled by an input port once after an up-transition of the strobe 'str' to avoid double sampling of the same data. Both a blocked input and an unblocked input wait for the strobe 'str' to become low before continuing. This prohibits a fast reading device from sampling the same data on the channel twice.

The corresponding input port notifies the output port when it may release the stable data via the acknowledge 'ack' signal. The output port must retain data and strobe 'str' stable until the incoming acknowledge 'ack' makes an up-transition. After that moment, first the strobe 'str' signal and then the data signals are released.

The implementation of this generic protocol can be simplified in case the communicating processes having commonalities, such as related clocks that allow a synchronous implementation of the asynchronous protocol.

Full handshaking applies in both blocked and unblocked communication. For blocked—blocked communication, the initiated transfer always occurs. The communicating processes are forced to synchronize. Accordingly, connected processes with different running speeds and clock speeds (e.g., because they have been designed or optimized independently) complete, and never sample unstable data, skip data, or sample the same data twice.

Two port behavior classes yields 4 communication combinations as follows:.

1) Blocked-Write, Blocked-Read Transfer.

This type of transfer assures that no message is ever lost or misinterpreted (i.e., each written message is transmitted exactly once and read exactly once). Successive messages with the same contents are considered different messages by both ports. The clock speeds and execution times of both tasks are irrelevant. This is the normal communication mode for data transfers. This transfer protocol is deterministic.

2) Blocked-Write, Unblocked-Read Transfer.

Blocked=write, unblocked-read transfers assure that no message is ever lost or misinterpreted (i.e., each written message is read, and no transient messages are ever read). However, the reading task is never stalled in the read operation. Therefore, the writing device may operate on a much slower clock rate, without efficiency loss in the reading task. This communication type is typically used for transmitting slowly varying parameters to a fast reading task. The reading task operates as if it reads each incoming message many times (which is not the case, because it would block the transmitter). If the reading devices decides to execute the transfer, the transfer itself is handshook, and the time needed to execute the complete transfer cycle has to be added in worst case to the cycle time of both processes, (including the unblocked process). If worst case statistics exist on a given percent of the transfers actually executed, this transfer time can be averaged in the unblocked process frame time; but if the unblocked process device has other blocked ports, FIFOs should be provided to maintain the fast read rate.

3) Unblocked-Write, Blocked-Read Transfer.

An unblocked-write, blocked-read transfer assures that no message is ever misinterpreted (i.e., no transient messages are ever read). However, in order to avoid loss of any messages, the reading device runs faster than the writing device; more specifically, the writing device keeps the data stable longer than a cycle of the reading device. That means external (speed) constraints impact determinism. Unblocked writing devices are, for instance, users pushing buttons or moving sliders, and analog data sources (an analog source sets its strobe equal to 1). If the writing device is faster than the reading device, messages are lost. The writing device can synchronize the reader, as the reading device is blocked.

4) Unblocked-Write, Unblocked-Read Transfer.

An unblocked-write, unblocked-read transfer carries no guarantees other than that stable data are sampled. This transfer type is typically used for synchronizing slow parameter setting by user interaction: a user controlled slider for instance should not be blocked, and the parameter reading task should also not be blocked. However, the protocol avoids invalid intermediate or unstable parameters from impacting the reading task.

IPC Generic Communication Protocol.

Figure 12:
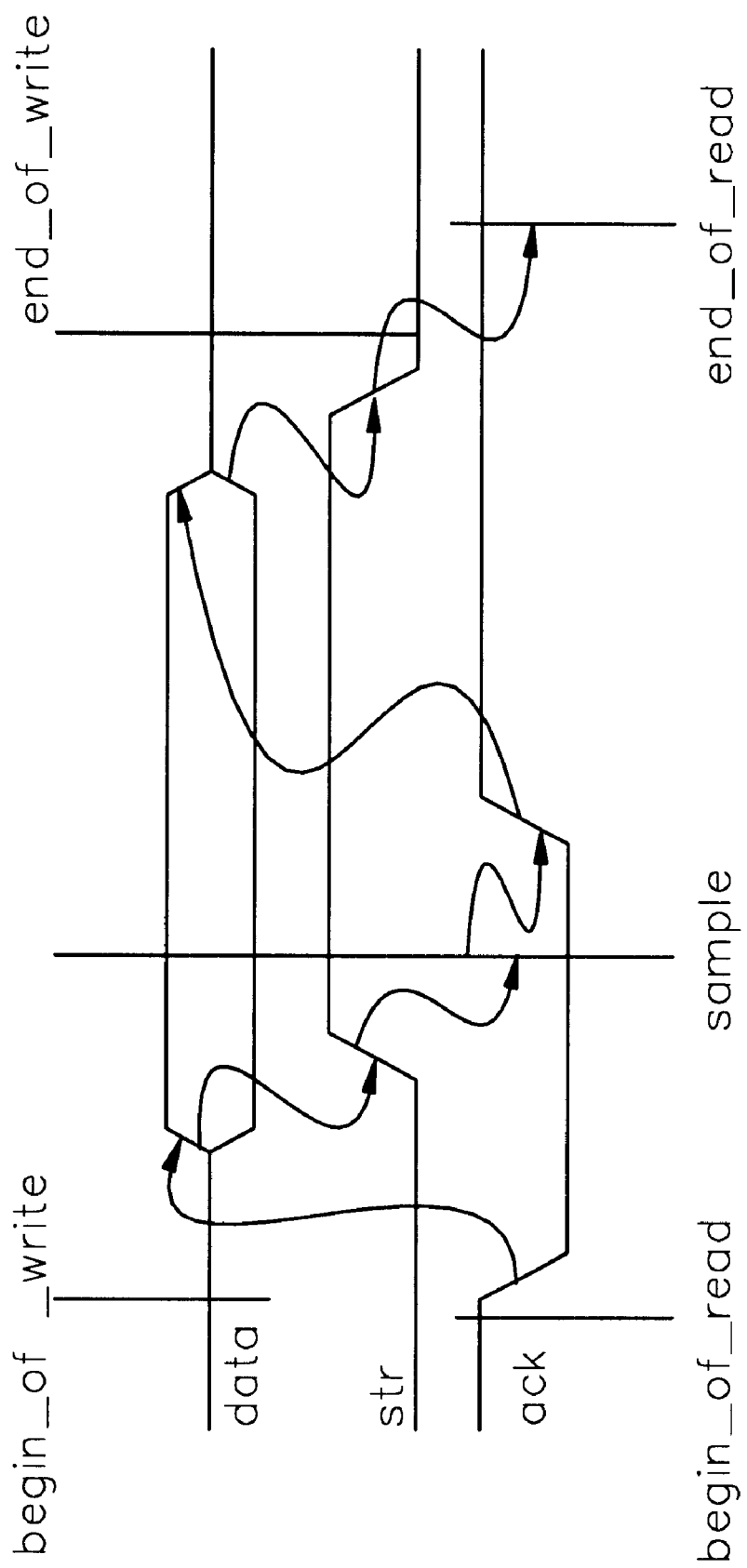
FIG. 12 depicts a timing diagram for the generic inter-processor communication protocol in accordance with the present invention.

The definition of signals and signal transitions used to implement the four combinations of the most generic protocol are described below. The generic protocol is illustrated in FIG. 12, The 'str' signal is active high, and 'str' high means that the data signals as stable. The IPC protocol guarantees that only stable data is sampled at all times, by using the 'str.'

Figure 13:
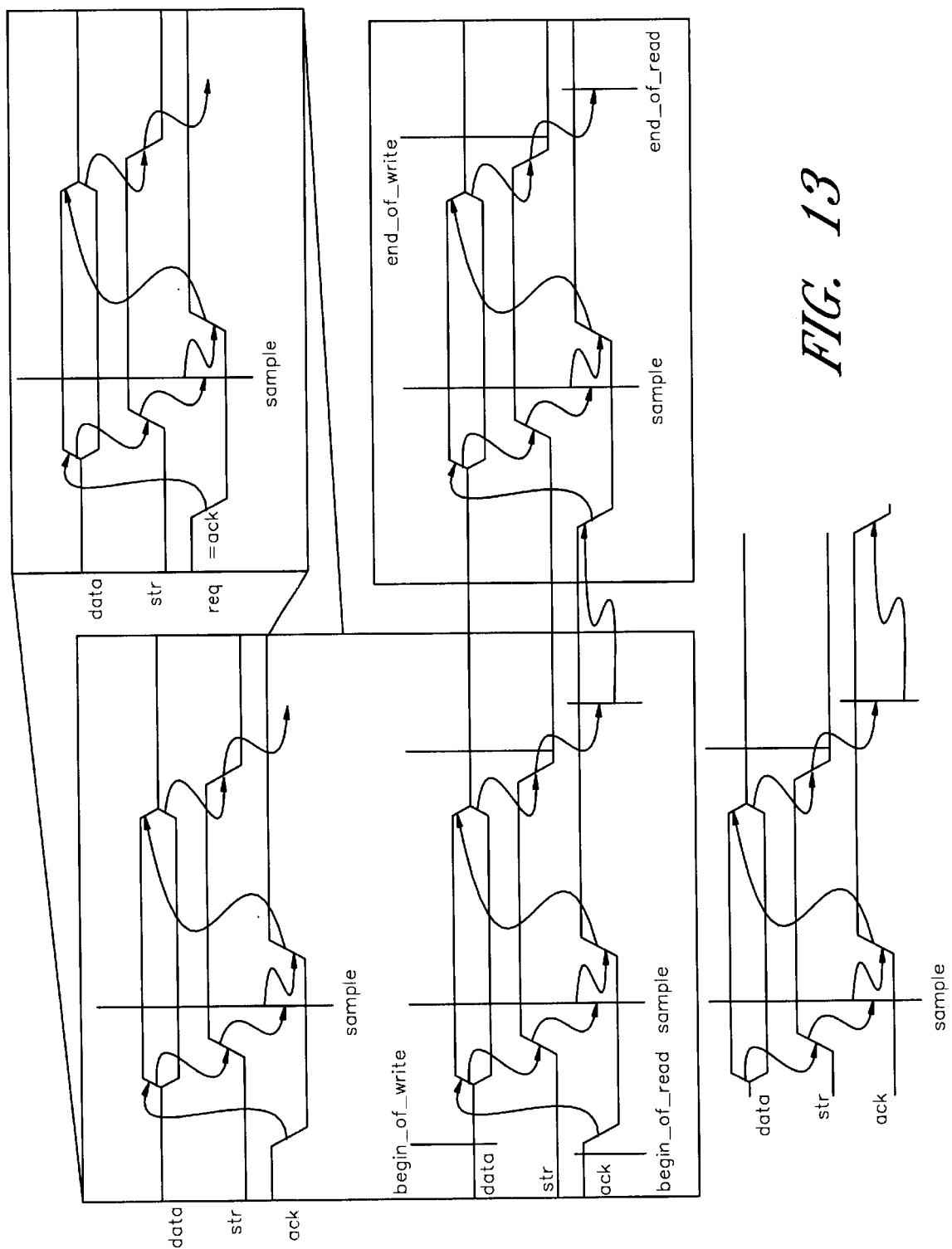
FIG. 13 depicts a timing diagram for input/output operation which illustrates that the acknowledge and request signals are dual function signals.

The 'ack' signal carries two distinct meanings: as an active high signal, it functions as an acknowledge of a successful transfer. As an active low signal, it functions as a read request. The distinction is made by the transition: an up-transitions indicates that the data have been sampled, and a down-transition means a read-request. FIG. 13 illustrates the dual function of the 'ack' signed: That the up-transition of an 'ack' signal can be interpreted as an acknowledge of one particular transfer over a channel, as well as the read-request 'req' for the coming transfer. The boxes outlined include full 4-phase handshakes where the writing device initiates the transfer. The shaded boxes contain transfers initiated by the reading device. As seen, the distinction is irrelevant. The 'ack' and the 'req' have a dual meaning, and are logically each others inverse. They are therefore redundant. Thereby, it follows that both the reading device and the writing device can initiate a transfer, the writing device by an up-transition of the 'str', the reading device by a down-transition of the 'ack'.

A transfer is actually initiated, when both a read request and a write request have been done ('str' high and 'ack' low). Once the transfer is actually initiated, it is fully handshook, even for unblocked I/O. Having unblocked I/O simply means that the actual I/O cycle is sometimes skipped.

If a blocked writing device initiates a transfer, it waits until the reading device pulls down the 'ack' signal. The handshake starts as the writing device pulls up the 'str' signed.

If an unblocked writing device initiates a transfer, it checks whether or not the reading device has the 'ack' signal pulled down by sampling it once. If so, the handshake starts by pulling the writing device 'str' signal up. If the 'ack' is not low, the transfer is not completed, and the writing device continues. The transmission data is lost.

If a blocked reading device initiates a transfer by pulling the 'ack' signal down, the reading device waits until the writing device pulls the 'str' signal up. Then, the handshake is initialized.

If an unblocked reading device initiates a transfer by pulling 'ack' signal down, the reading device checks whether or not the writing device has pulled the 'str' signal up by sampling it once. If so, the handshake is initiated; if not, the transfer is not completed, and the reader continues. The transmission data is not read.

If a handshake is initiated, it always proceeds in the same way (see FIG. 12):

1. After the request has been recognized, the writing device stabilizes the data.
2. Next, the strobe 'str' signal is pulled up.
3. The reading device maintains the 'ack' signal down, otherwise no transfer occurs.
4. The reading device samples the strobe 'str' signal until it is high. The strobe 'str' makes an up-transition in this situation.
5. The reading device then samples the data.
6. The reading device pulls up the 'ack' signal.
7. Meanwhile, the reading device continuously samples the 'ack' signal, and when 'ack' goes high, the reading device pulls 'str' down again. The 'ack' signal only makes an up-transition in this situation.
8. The writing device then releases the data bus and the I/O function is complete.
9. Meanwhile, the reading device watches the strobe 'str' until it goes down, then the reading device finishes the I/O function, leaving the 'ack' signal high.

No two transitions on either control line ('str' or 'ack') are completed without a transition on the other line.

The reading device side of the protocol can be separated from the writing device side. One side need not know whether the other side is a blocked class or an unblocked class. Thus, a library containing two distinct input functions (1 blocked, 1 unblocked), and two distinct output functions (1 blocked, 1 unblocked), which are independent, and which can be directly connected in any of the four combinations described above is provided. This provides a modular design.

Figure 14:
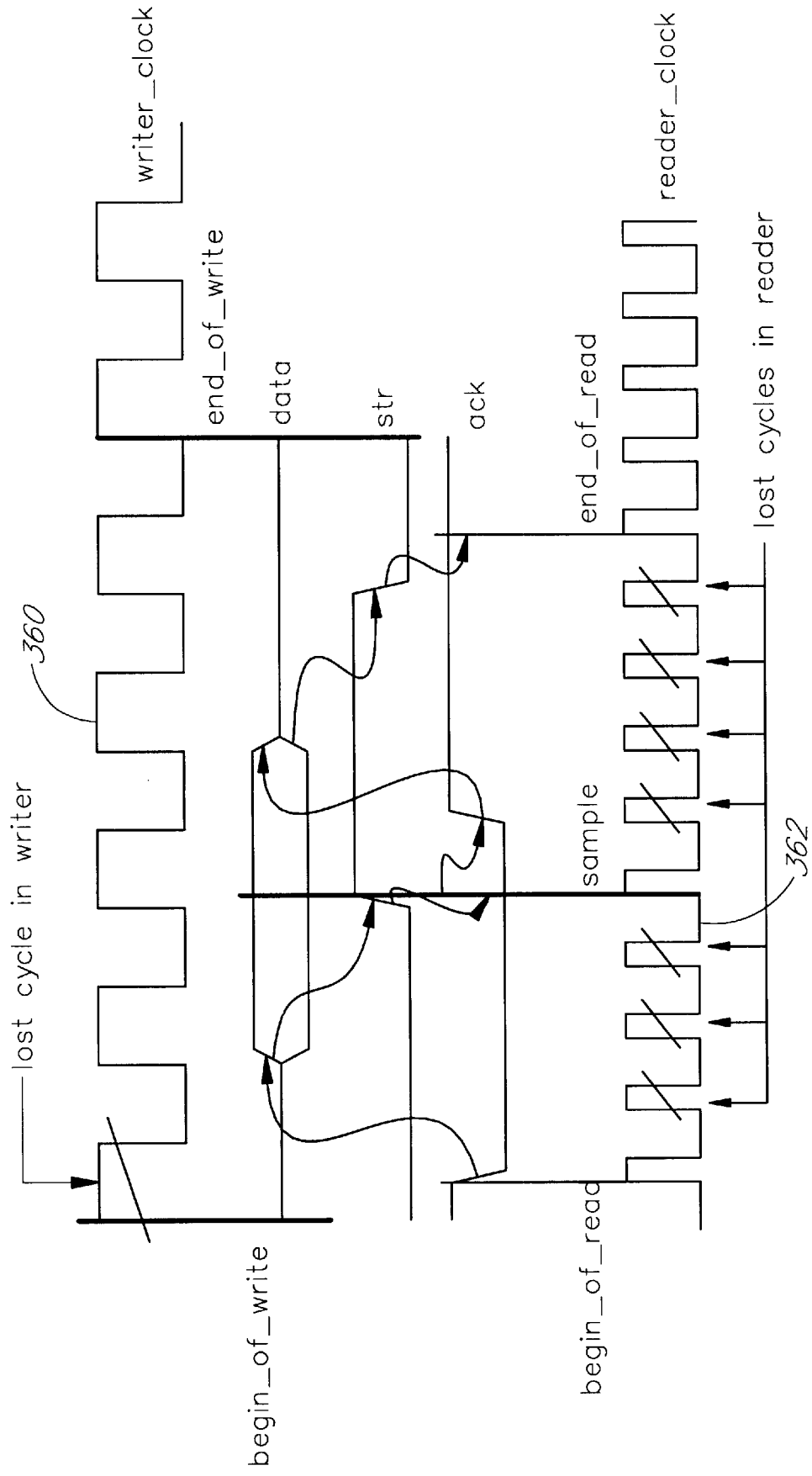
FIG. 14 depicts a timing diagram with a slow writing device clock and a faster reading device clock using the IPC implementation in accordance with the present invention.

An example, of an I/O transfer with a writing process implemented on a relatively slow clock, and a reading process on an unrelated, but faster clock, is shown in FIG. 14. As depicted in FIG. 14, the writing device clock 360 is a slower clock than the reading device clock 362. As indicated in the FIG. 14, there is a lost cycle in the writing device clock, but several lost cycles in the reading clock. for an unblocked read, the request is left active after a failed read, which is often the case. This means that the corresponding writing device is blocked from the moment of the active strobe 'str' signal, until the reading device tries a new read. For an unblocked read, because the request does not remain active with a failed read, an unblocked—unblocked communication rarely synchronizes. The unblocked read, therefore, has little or no use, unless both systems are unblocked. In that case, the addition of a non-primitive buffer process, with internal memory, and blocked I/O, is preferable to remove the synchronization problems.

IPC Implementation Issues.

There are two distinct way of implementing an IPC specification as described above:
1. If the specification of each process and all IPC communications is converted into an executable version on a computer or network of computers, it is called a simulation implementation.
2. If the specification of each process and all IPC communications is converted into specific hardware or embedded executable software, it is called silicon implementation.

Any process can be implemented in a processor. More than one process can be implemented into a single processor. To indicate which process is to be implemented on which processor, processes are assigned to processors. Process assignment can be manual or automatic. To indicate which type of processors and how many are needed in a system implementation, processor allocation is used. Processor allocation can be a manual action or an automatic action. Implementing a process into a processor can be a manual action or a compiler action.

Figure 21:
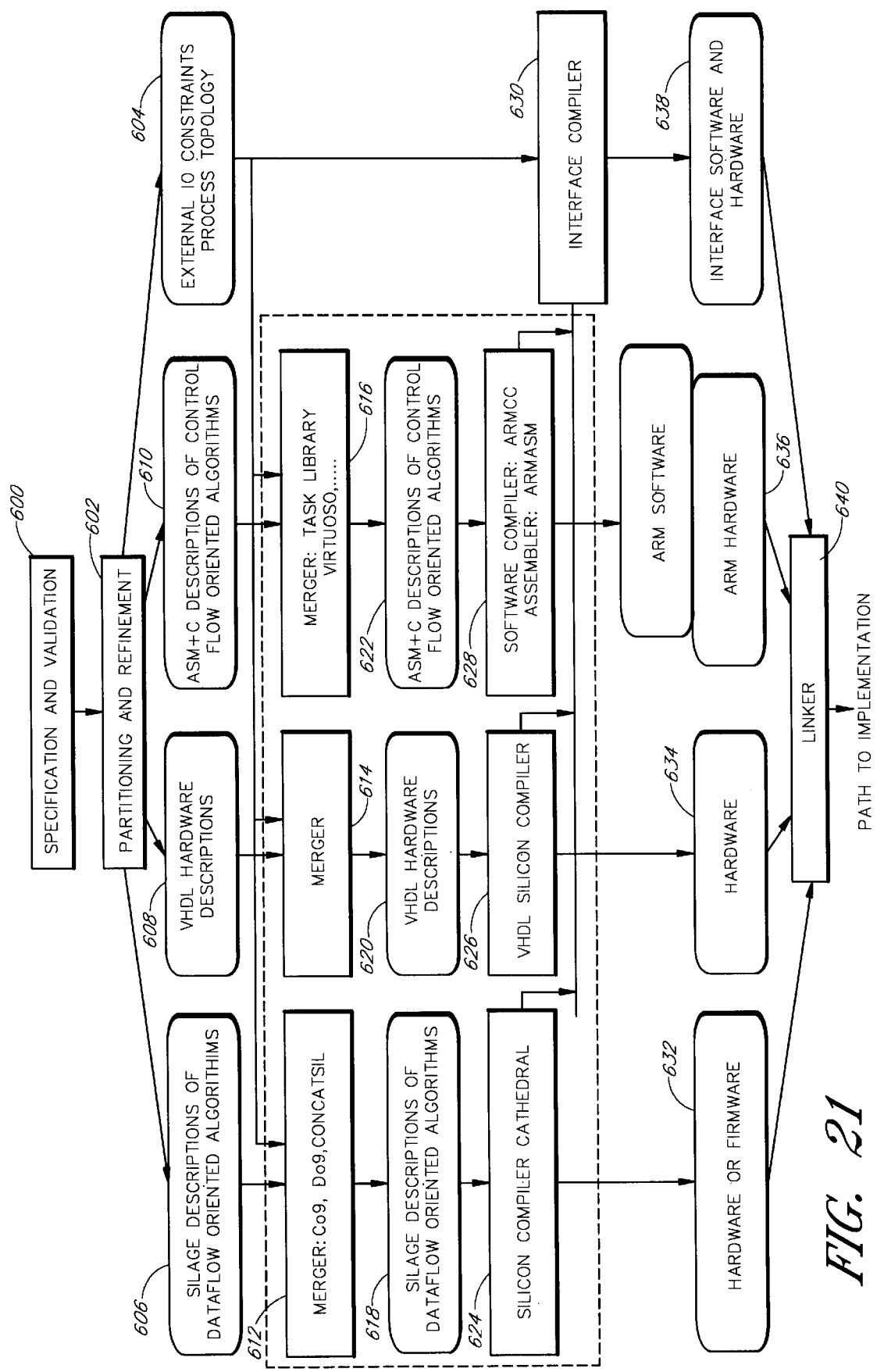
FIG. 21 illustrates a design process for implementing the IPC protocol into hardware processors for an exemplary CAD system.
Figure 22:
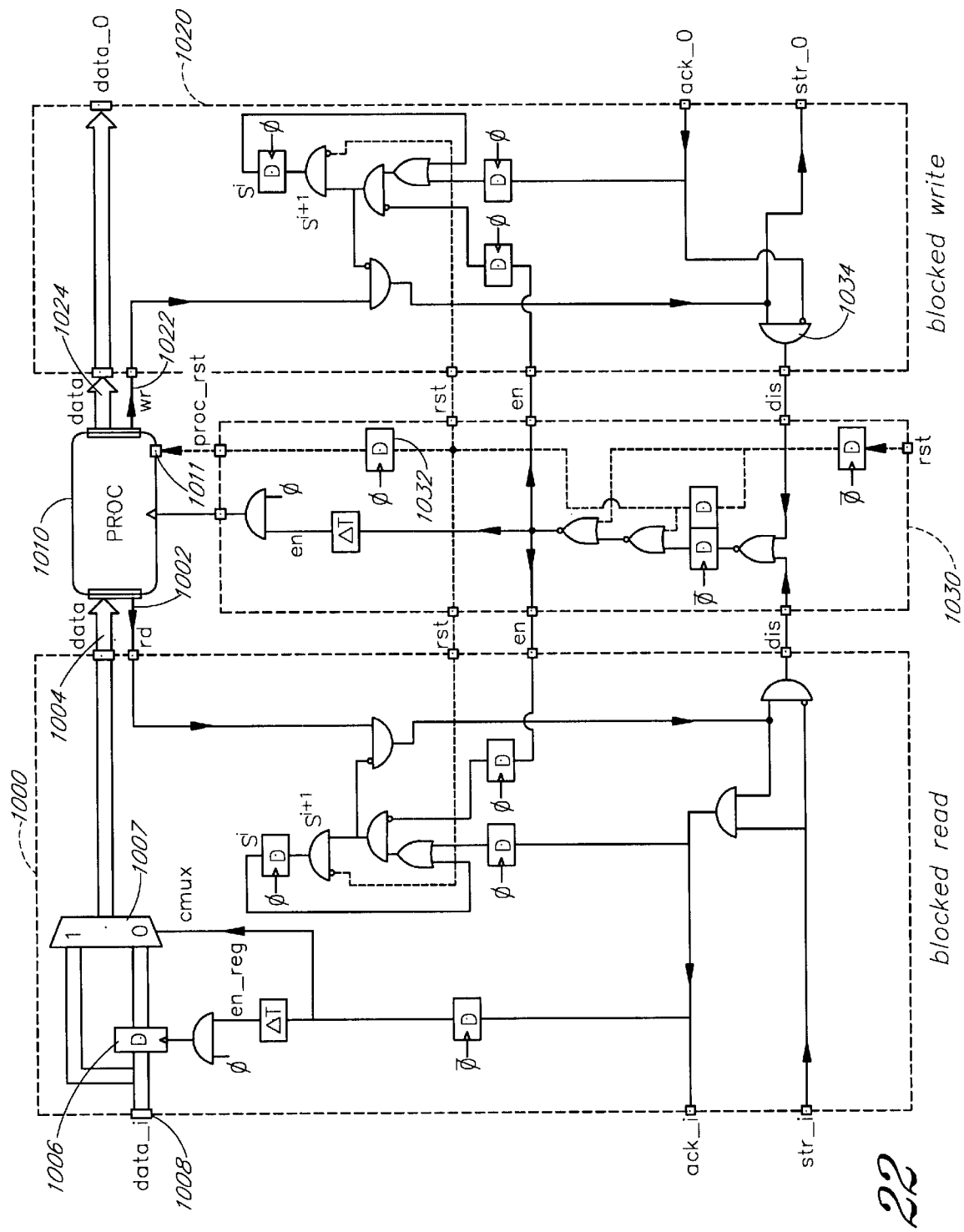
FIG. 22 illustrates a blocked write, block read IPC implementation for a common-clock Cathedral-III processor.

The idea behind the implementation strategy for IPC systems is not to build a new compiler, but combine as many existing compilers as required, and interface sub-systems via a generic protocol. This principle is called "host compiler encapsulation." The architecture of a design environment to support this methodology is shown in FIG. 21 for a CAD system.

Design in the system starts with specification as indicated in a specification and validation block 600. Specification and validation of the design involves specifying the device system functions and verifying them. The device system functions are partitioned into a plurality of sub-systems which will be termed processes for the purposes of this description. Also, the system functions are partitioned into interconnect activity information (process topology). The partitioning is represented in the partitioning and refinement block 602 in FIG. 21.

In that the specifications generally contain real-time constraints, the constraints are translated into external input output (I/O) constraints for the various sub-systems. The external I/O constraints are represented in the external I/O constraints block 604.

Each of the sub-systems or processes is implemented in the most suited description language such as assembly, C, VHDL hardware descriptions, Silage descriptions or other appropriate languages. These descriptions are represented in the Silage description block 606 for data flow oriented algorithms, in the VHDL descriptions block 608 for hardware descriptions and in the ASM and C descriptions block 610 for assembly and C description of control flow oriented algorithms. The individual processes are then assigned to processors (the processors being hardware blocks that execute one or more process).

Where more than one process is assigned to a single processor, the processes are merged into a single description. The processes can be executed by one processor using task switching, interrupt handlers and other methods known in the art for multi-tasking. The merger of operations are shown in the merger blocks 612, 614, 616.

For each language in the definition (Silage, C, VHDL, Assembly) a simulator is provided. The simulators are depicted in the block 618, 620, and 622. The individual processes can be simulated separately in the varied simulators but also can be simulated in context with the other processes by communication between the simulators using the IPC communication protocol defined above.

Once the processes are simulated, the processes can be implemented using compilers 624, 626, 628 as depicted in FIG. 21. In the present embodiment, the Cathedral compilers 624 is used for the Silage descriptions, the ARMCC compiler 628 is used for C and the Synopsys (VHDL) compiler 626 is used for VHDL descriptions. For the assembler, the ARMASM assembler 628 is used. An interface compiler 630 is used for IPC interfaces in the implemented processes.

The above-described steps define a set of processors (hardware logic with the possibility of embedded software are provided). The processors can be connected to using the IPC interfaces which are implemented in the processes. In this embodiment, the various processors need not have a separate IPC interface in that the IPC communication protocol is implemented within the processors. The processors are shown in the hardware/firmware block 632, the hardware block 634, the ARM hardware, ARM software block 636 and the interface software and hardware block 638. The processors are connected via a linker 640 (analogous to a software linker).

The interprocessor interconnectivity (process topology) results from the original partitioning in the definition block 602.

The resulting processors comprise a net list that can be converted into a hardware layout using conventional CAD tools.

Host compilers may transform process descriptions into executable code for simulation, or into silicon circuits for implementation. There is no inherent difference between the two implementation methods, only a distinct processor target. In this application, the implementation methods are described separately. For simulation, the target may be a host computer with a multi-process or multi-tasking operating system, or a network of such computers. For implementation as an integrated circuit, the target may be dedicated silicon or embedded cores, or a mixture of both.

Nowhere in the IPC design method, be it for simulation or for implementation, is code or hardware generated by means other than library inclusion or host compilers. Consequently, no part of the system function is described or specified outside the encapsulated host languages or their corresponding compiler directives. The so-called coordination language to encapsulate the sub-systems is strictly a static interconnection pattern using passive signal lines. The topology is at all times fixed.

IPC Simulation.

This section describes a C simulation implementation of the blocked and unblocked input and output IPC ports, suited for implementation on a UNIX computer. These descriptions are described as an IPC I/O library, and can be included and called as I/O functions in any C program. This implementation serves as the simulation environment.

C Programs and IPC.

Figure 15A:
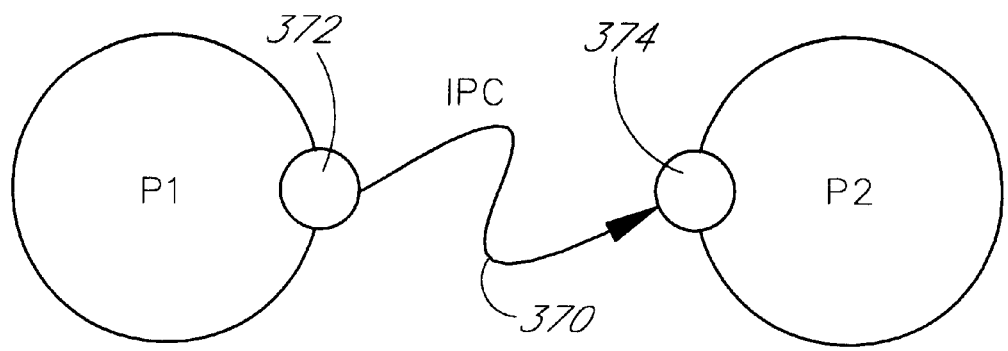
FIGS. 15a–15c depict a shared memory implementation of a memoryless connection of the IPC protocol in accordance with the present invention.
Figure 15B:
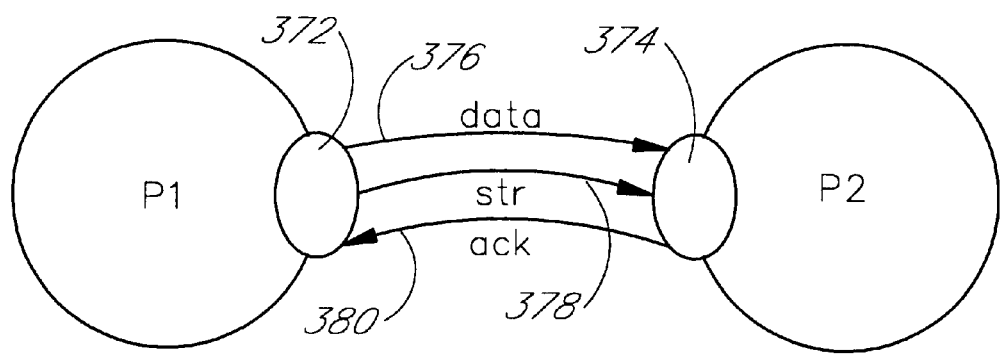
Figure 15C:
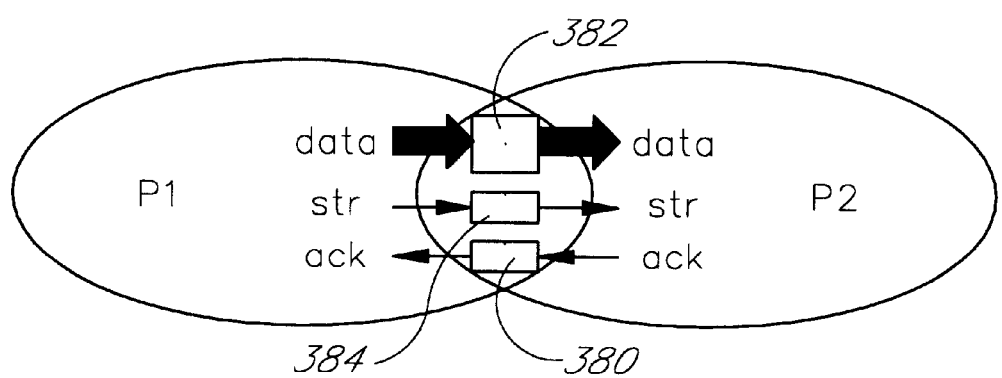

For a C implementation under UNIX, four I/O functions, called BWO (for blocked write), UBRO (for unblocked read), UBWO (for unblocked write) and BRO (for blocked read), have been developed executing the generic IPC protocol using shared memory variables. For each communication channel, a structure, as illustrated in FIG. 15, is allocated in shared memory, consisting of a data field, a Boolean field to carry the 'str' signal and a Boolean field to carry the 'ack' signal. This channel model contains memory, while the actual channels are conceptually memoryless. The memory is purely an implementation aid. The data field is randomized after each acknowledge. As depicted in FIG. 15, two devices or processors P1, P2 communicate with the IPC protocol 370 via IPC interfaces 372, 374 (See FIG. 15a). FIG. 15b shows additional details of this protocol depicting the data, signal lines 376 the strobe 'str' signal line 378 and the acknowledge 'ack' signal line 380. The memory allocation in shared memory is depicted in FIG. 15c as described above consisting of a data field 382, a strobe Boolean field 384 and a acknowledge Boolean field 386. The essence of the C-code implementing this structure is shown below.

```
#include "ipcio.h"
/*******************************/
void BW(ch, data)
IOPort ch;
double data;
{
    while (ch->ack == 1);
    ch->data = data;
    ch-> cntl = 1;
    while (ch->ack == 0);
    ch->cntl = 0;
    ch->data = (float) drand48( );
}
/*******************************/
int UBR(ch, data)
IOPort ch;
double *data;
{
    ch->ack = 0;
    if (ch->cntl == 1) {
        *data = ch->data;
        ch->ack = 1;
        while (ch->cntl == 1);
        return 0;
    } else {
        return -1;
    }
}
/*******************************/
int UBW(ch, data)
IOPort ch;
double data;
{
    if (ch->ack == 0) {
        ch->data = data;
        ch->cntl = 1;
        while (ch->ack == 0);
        ch->cntl = 0;
        ch->data = (float) drand48( );
        return 0;
    } else {
        return -1;
    }
}
/*******************************/
```

-continued

```
void BR(ch, data)
IOPort ch;
double *data;
{
    ch->ack = 0;
    while (ch->cntl == 0);
    *data = ch->data;
    ch->ack = 1;
    while (ch->cntl == 1);
}
/*******************************/
```

Silage Descriptions and IPC.

Silage is a synchronous data flow language, used to specify dataflow processes on a high abstraction level. It does not feature input and output operations, only input and output arguments of function calls.

The Silage simulator S2C is a compiled code simulator, that converts the Silage dataflow description into an executable C program. The Silage simulator S2C has been upgraded in accordance with the present invention to support multi-process simulations according to the IPC protocol. This allows for simulation of both manifest and non-manifest multi-rate communication. The above C implementations under UNIX have been integrated in the S2C code generator.

No adaptations are needed to the Silage language syntax or semantics. Only the implementation of the I/O in the compiled C-code is provided.

The standard interpretation of I/O for Silage is as follows: a Silage process runs on a frame clock, and in each iteration of the frame clock, all inputs are read simultaneously, all operations are executed in zero time, all outputs are written simultaneously, and finally the frame clock is updated by updating all delay lines.

In all traditional approaches, Silage I/O was considered unconditional and blocked: every input must be read every cycle, and every output must be written every cycle. Such traditional approach is called SDF (Static Data Flow). Many systems cannot be described using SDF methods only. Non-SDF (or DDF, Dynamic Data Flow) system aspects traditionally had to be solved outside the Silage process, which often gives rise to interface overhead. Therefore the IPC-version of Silage also allows unblocked I/O, and conditional or guarded I/O.

If a read attempt of an unblocked Silage input fails, the return value is undefined. It is assumed that the previously read value is retained if the read fails. Therefore, the unblocked IPC directive provides specification of an IPC "fail" signal, which is a local signal, defined inside the IPC process and of the type of the associated input. In other words, if the unblocked read fails, the "fail" value of the previous frame is returned. The fail signal is also assigned an initialization value, such that a fail value is provided if the very first read operation fails.

In other words, a fail signal may not be an input or output of the main IPC process, it may not be a signal outside the main IPC process, and it must have a delay initialization value in case the first frame read operation fails. This fail signal can be defined as any other signal. In other words, a failing unblocked read may return zero, any other constant, the previous value, or any other signal. An additional advantage is that the code or hardware to compute or generate the fail value is present in the Silage description, and therefore synthesized along with all the other functionality.

For an unblocked Silage output, the written data is lost if not accepted by the reading device.

An IPC guard is a Boolean signal, that can be used to control the I/O, both for reading and writing. For a guarded Silage input, a read is assumed performed if the previous read has been finished, but the 'ack' remains low until a frame is encountered with the corresponding guard being 'true.' Only then is the read operation finished so a new attempt can be executed. If in a particular frame, a read is attempted, but the 'ack' signal for one of the previous frames is still low, because the guard is not yet 'true,' the attempt is discarded. During this period, the writing device remains blocked. For a guarded Silage output, it is assumed that a write is always attempted, but the strobe is logically AND-ed with the current guard value, i.e., the write is not validated to the outside world if the current guard value is 'false.'

Figure 16:
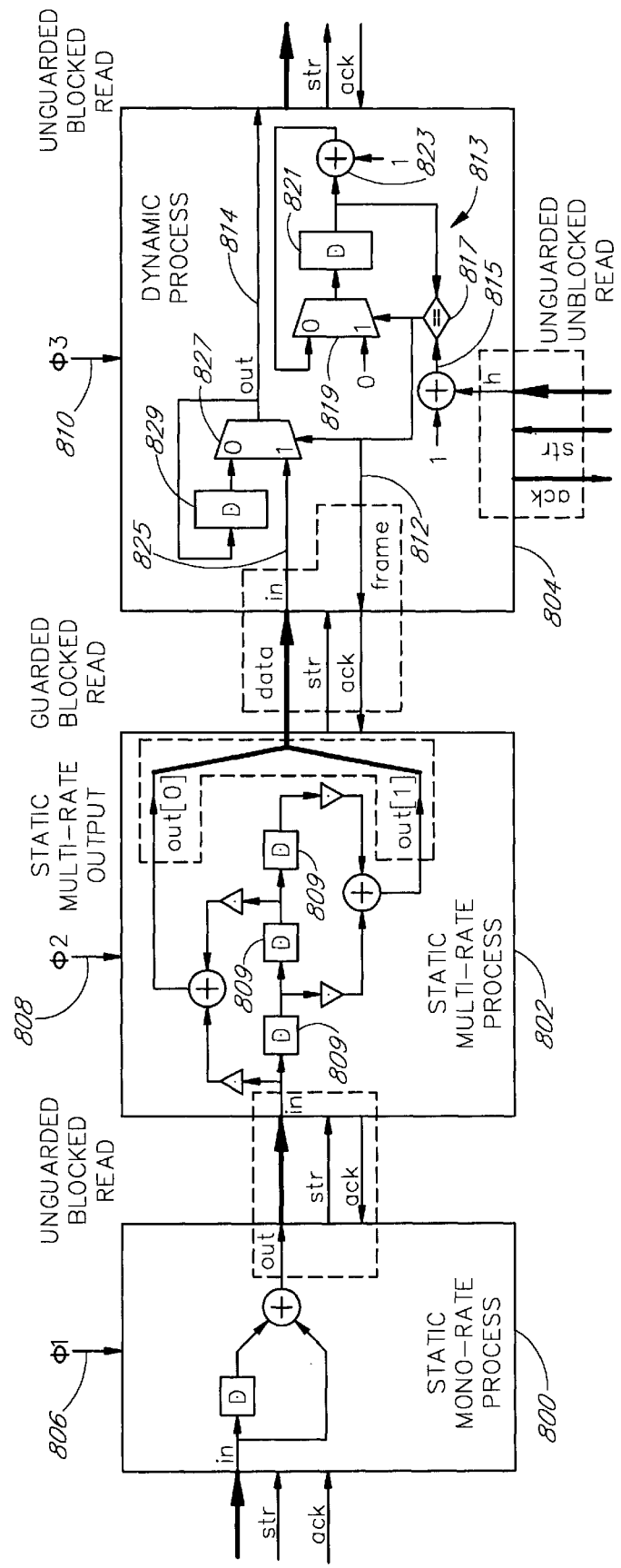
FIG. 16 depicts a connection of static data flow silage processes utilizing I/O conditions (guards) to yield nonstatic data flow operation in accordance with the IPC protocol of the present invention.

FIG. 16, in general, depicts an example of a simplified functionality of the PMCM TRANSMITTER CHAIN using static data flow processes connected using I/O guards. FIG. 16 depicts three silage processes. As explained above, Silage Processes are conventionally a static data flow process. By adding a condition (called guard) at the input, if one block of process produces an output that is an input to another process, nonstatic data flow behavior is obtained by use of the guard. As depicted in FIG. 16, three silage processes 800, 802, 804 have three different input clocks 806, 808, 810. The silage process 800 is depicted as a static mono-rate process. The silage process 802 is depicted as a static multi-rate process having a static-rate output and the silage process 810 is depicted as a dynamic process. The IPC communication protocol between the silage process 800 and the silage process 802 is an unguarded, blocked read. The communication between the silage process 802 and the dynamic silage process 804 is a guarded blocked read communication. The circuitry within the static mutli-rate process 802 is a parallel to serial conversion circuit with the blocks 809 being delay blocks.

A guard is provided by the dynamic process 804. The guard is provided by the frame signal on the frame signal line 812. The frame signal is a Boolean signal that only provides an acknowledge in the IPC protocol between the process 802 and the process 804 every h cycles of the clock 810. As depicted in the Silage process 804, the frame signal is generated by the decrement and compare circuitry 813. More specifically, the value h-1 is maintained on an input 815 to the compare 817 and an initial value of zero selected by the multiplexer 819 and sent through the delay 821 is incremented by the increment function 823 with each cycle of the clock 810. Once the value from the increment function 823 propagates through the multiplexer 819 and the delay block 821 and equals the input 815 to the compare block 817, the frame signal 812 becomes true providing the frame signal which acknowledges the Silage process 802. As further depicted in the process block 804 the read value on the input line 825 is only selected to the output 814 via the multiplexer 827 with each frame signal 812. Between frame signals, the output 814 remains held via the delay block 829 cycled through the multiplexer 827 to hold the output 814 stable for h cycles of the clock.

Accordingly, an acknowledge signal 'ack' is only provided to the silage processor 802 once every h cycles of the clock for the silage process 804. For the reading processor 804, this means that the read is essentially repeated h times on the output line 814. In other words, the silage processor 804 acts as a hold processor to hold the previous read data through h clock cycles.

There is a built-in guard called INIT which is global for the whole Silage process, and is only true at frame zero (the initialize frame). This allows initialization of a signal via an IPC channel. This guard allows a blocked read to occur at start-up. For instance, in a loop of interconnected processes, where each process is blocked, no I/O will occur. The INIT guard would be used to allow one of the processes to start I/O.

The effect of an IPC system is that the corresponding I/O code in the generated C-code is one of the four I/O routines described above. In sum, the only change to the silage descriptions is the addition of the IPC I/O protocol which allows silage descriptions to operate non-SDF processes. The IPC protocol implemented in the silage descriptions, therefore, should greatly simplify interface design at the system level.

Signal types can be used freely in Silage code. Therefore, a good communication protocol should not require a designer to change the output type of one process description to match the input type of another process description. This would violate the modularity principle of defining IPC. Therefore, IPC allows connection of any I/O signal type to any other, and Silage types to C types, and so on. This is done by using a fixed, generic signal type in all channels. All Silage simulation executables cast their outputs automatically to this generic type before writing to a channel, and all inputs are assumed to have this type, and are cast automatically to the user-specified type before use. In C programs, the designer can call a library of type conversion functions. A fully parameterized hardware implementation library for these type cast functions is also possible.

Figure 17:
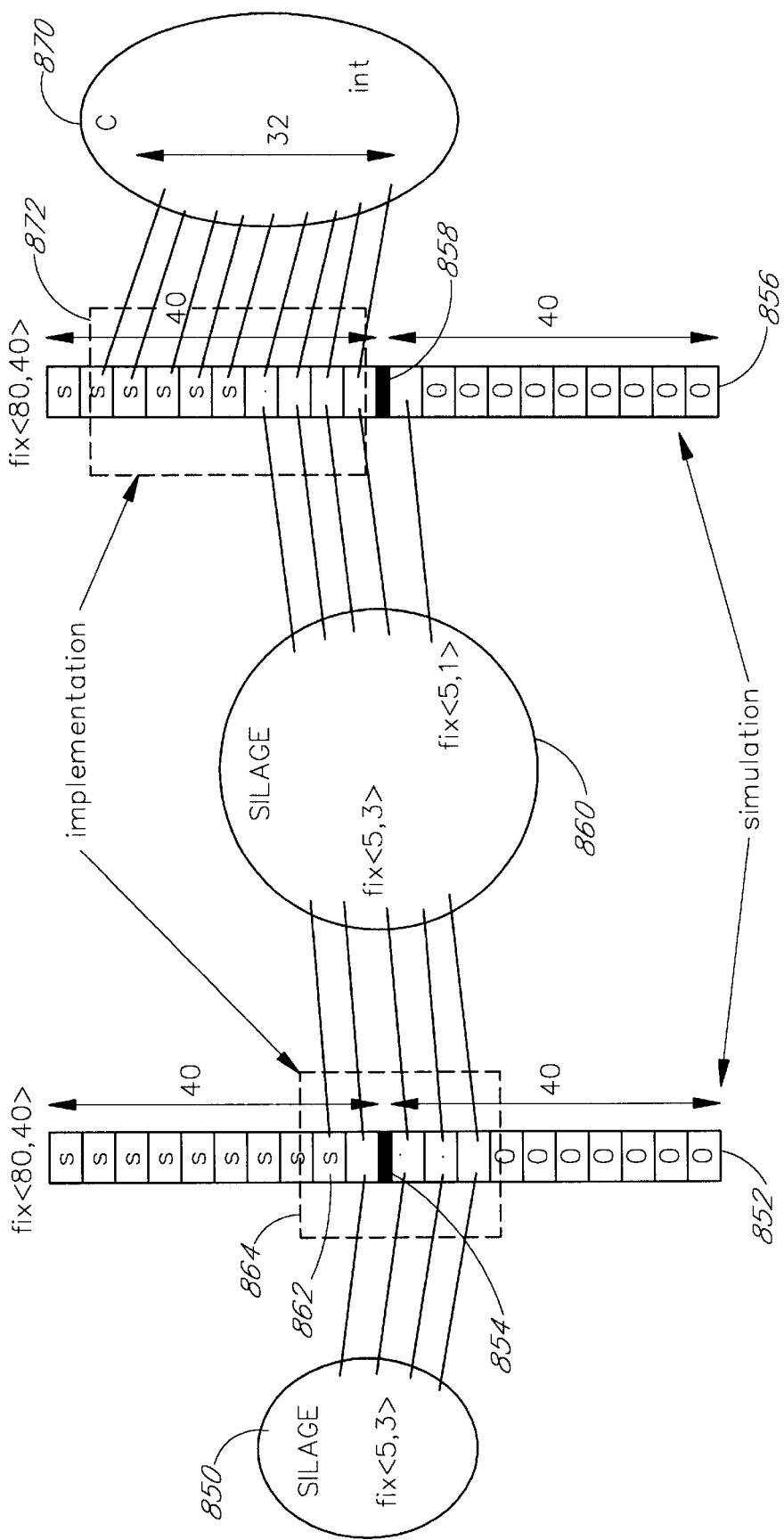
FIG. 17 depicts and implementation or simulation of a generic IPC protocol interconnection or channel between silage descriptions and between a silage description and a C-description.

An illustration of connections between descriptions having different output and input types for both simulated and hardware implemented IPC is shown in FIG. 17. More particularly, as depicted in FIG. 17, three process descriptions are illustrated. A first silage description 850, a second silage description 860 and C-process 870. As depicted in FIG. 17, the first silage description 850 has its I/O defined as an output with 4 bits of which three follow the decimal point. This is designated by the fix <4,3> designation. For simulation, a first simulation channel 852 is defined having 80 bits, with 40 before the decimal point and 40 after the decimal point. The decimal in the communication channel 852 was represented by the darkened black line 854. A similar communication channel 856 is defined in the same manner with its decimal point represented by the dark black line 858.

The second silage description has its input defined as a 5 bit input with 3 bits following the decimal point as represented by the fix <5,3> and has its output defined as a 5 bit output with one bit after the decimal point as represented by the fix <5,1> designation in the second silage description 860. Accordingly, for communication between the first silage description 850 and the second silage description 860, there is a difference between the output type of the first description 850 and the input type of the second description 860. In order to provide a channel which handles the various input and output types, the most significant bits are extended with a sign bit, represented by the 's' blocks in the channel 852; the least significant bits can be extended with zeros if further resolution bits are lacking. Accordingly, for communication between the silage description 850 and the second silage description 860, because the most significant bit for the second silage description input requires two bits before the decimal point, the most significant bit is extended by the sign bit 862. For hardware implementation of the channel, the shading 864 represents the total number of bits which would be implemented. For simulation, 40 bits prior to the decimal point and 40 bits subsequent to the decimal point are provided in the present embodiment. In theory, for simulation of process descriptions, the simulation can assume infinite resolution. If more than 40 bits of resolution are required, more bits can be added in the simulation code.

Similar principles hold true for the channel interfacing the second silage description 860 output and the C-process 870 inputs. As seen in FIG. 17, the C-process 870 is defined to have an input of 32 bits ahead of the decimal point 858. Yet, the second silage description 860 has an output type of 5 bits with one bit after the decimal point 858. Accordingly, in order to extend the most significant bits, sign bits of the channel 856 are used to provide the additional bits necessary to provide the input to the C-process 870.

In the transfer between the second silage description 860 and the C-process 870, the least significant bit from the second silage process 860 is lost in the transfer. As with the communication channel 852, the gray shaded area 872 is the number of bits implemented if hardware implementation such as in silicon, is realized; whereas a simulation assumes infinite bits, but is defined to have 80 bits in the embodiment in FIG. 17. Accordingly, FIG. 17 shows a definition of a generic channel type (channels 852, 856) two interconnect descriptions having differing input and output types.

VHDL Descriptions and IPC.

Any VHDL simulator featuring a C-language interface can be encapsulated to behave like an IPC process, by providing a VHDL description of the four IPC I/O functions, using the C-implementation listed above for simulation. The resulting VHDL simulator behaves as a separate IPC process and can be included in IPC simulations.

ARM Microcontroller Programs and IPC.

The ARM microcontroller core can be used to run embedded C programs. In a system context, such a C program can be simulated in a system context on two different abstraction levels:

as any other C program on a computer, making abstraction that it will be implemented on an ARM core microprocess; and compiled into AIF (ARM Image Format) and interpreted by the ARMulator.

Figure 18A:
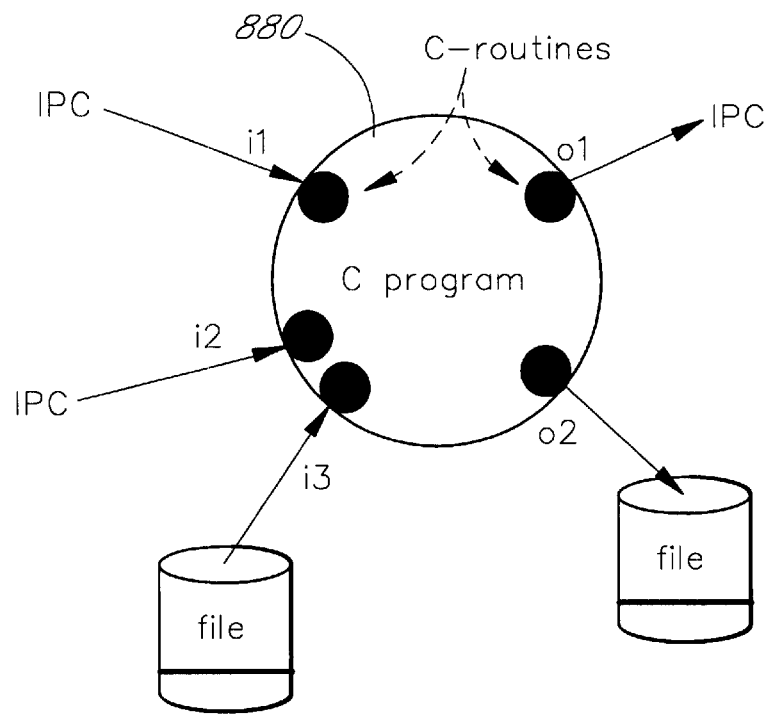
FIG. 18 illustrates two abstraction levels for C-software code implementation of the IPC protocol on the ARM processor.

The first method is depicted in FIG. 18A. As seen in FIG. 18A, a C-program 880 runs the IPC simulation listed above. For the purposes of the present discussion, the C program is running on the ARM core microprocessor. Therefore, for the first method of implementing IPC on the ARM processor, there is no distinction from the earlier described C-program.

Figure 18B:
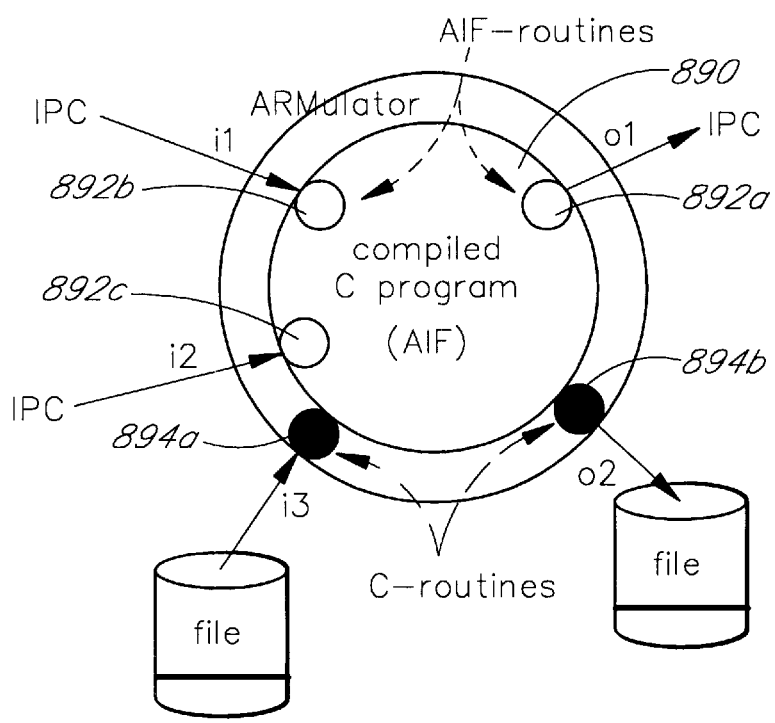

The second method of implementing IPC is depicted in FIG. 18B. As seen in FIG. 18B, a compiled C-program 890 has been compiled into AIF. AIF routines 892*a*–*c* provide IPC for I/O operations. In addition, the ARMulator (which is itself a C-program) has been upgraded to allow C programs 894*a*, 894*b* which contain IPC calls to be simulated on the host computer, as if they were regular C programs. It is, however, interpreted AIF assembly code that is executing. All the regular debug commands for the ARM remain available, and the user application program executes in an IPC context.

The ARM processor has only one data bus, so all conceptual channels are time-multiplexed over this bidirectional bus. A memory-mapped I/O technique is used to implement this. The I/O implementations thus read and write into specific ARM memory locations. The memory model inside the ARMulator, which is accessible to the user, is modified to link the memory mapped I/O of the four IPC I/O functions in order to allow for IPC communications directly on the host computer file system. This allows simulation of the AIF code in the ARMulator in a multi-process context. For each IPC channel that an I/O function is called upon, the memory model of the ARMulator opens an IPC channel on the host if it is not open yet, and reads or writes to it accordingly. Files that are not declared as IPC channels are still treated as host files. This allows use of files to store intermediate output in files for debugging.

A Library of Test-Bench Processes.

In order to support IPC simulations, an open library of auxiliary processes has been set up. This library contains processes to access data files, represent data graphically, introduce functional clocks, build user control panels, and step through the simulation under user control. They are all written in C, and they are not meant to be synthesized. They are just for simulation support. For some, such as dup, merge, adc and dac, an appropriate low-level library implementation is available, e.g., in VHDL or layout view. Users should be allowed to add processes to this library, as long as the processes conform to the IPC process definition.

The following list is indicative, and not exhaustive.

Probe Process.

Any channel can be probed at any time using the probe process. When this process is executed on a channel of a system, it continuously monitors the 'data,' 'str' and 'ack' values. This process does not slow down the complete system more than any other process. This process can be terminated at any time. This process does not affect any of the values in the channel. However, by pressing CTRL(C), an interactive mode is activated which allows the user to toggle the 'str' and the 'ack' signals, and to set data values. This is useful to repair a blocked channel for debugging.

Interactive and File I/O Processes.

The processes "fin" and "fout" connect a data file with an IPC connection. The processes "pii" and "pio" do the same, but are interactive: they provide a control panel for user control over the 'str' and 'ack' signals.

Interactive Graphical Output Processes.

The process "plot" provides continuous graphical output for up to 3 simultaneous channels. It scales the Y-axis automatically. On the X-axis, time evolves automatically, and is either scaled or scrolled automatically.

Dup and Merge Processes.

All channels are unidirectional point-to-point connections. In order to send data from one writing device to more than one reading device (broadcasting), the "dup" process is defined.

The "dup" process reads one message, and broadcasts it to as many output channels as indicated in the argument list. To avoid deadlocks, the incoming message is broadcasted in the order of the argument list, but the 'ack' signals can return in any order. The next input is requested only when all acknowledges have been received.

For the case where more than one process writes to the same input channel, a "merge" process is defined which continuously polls its inputs in a fixed sequence, and as soon as a 'str' goes 'high,' the merge process reads the data and writes it to the output channel.

Spectrum Analyzer Process.

A "spectrum analyzer process" provides a FFT to simulate a spectrum analyzer, (for each set of inputs, this process computes an FFT, and immediately updates the graphical display).

Slider and Button Processes.

The "slider" and "button" processes are used to construct user control panels. Each slider and button is modelled as a separate user process, that follow the same rules as all the other processes. The slider output can be blocked or unblocked.

Complex Channels: Fifo Process.

A FIFO is a parametrizable complex channel, (i.e., it is a model for a memory channel with a specific internal behavior). A FIFO is not a built-in primitive of the process model. In the present embodiment, the designer can edit the FIFO code (C or VHDL) to change the behavior or to add specific control.

EXAMPLE

The speech-code memory in a digital telephone answering machine is a specialized FIFO, with additional control: through the user interface process, the user can explicitly block and release the FIFO input and output. The REPLAY command releases the FIFO; the RECORD command releases the input into the FIFO. The FIFO reports its status to the user interface, such as FULL (which ends the recording by blocking the input), and EMPTY (which ends the PLAY by blocking the output).

The C model of the FIFO is an infinite loop, that performs an unblocked read and an unblocked write every iteration. In other words, it serializes the concurrent input, store/load and output threads by attempting to read and write sequentially, once per frame. This only works without checking the control signals when it runs very fast (with a high priority). In practice this is not guaranteed. Therefore, the 'str' and 'ack' signals are explicitly checked to maintain I/O and FIFO integrity.

ADC and DAC Processes.

Figure 19:
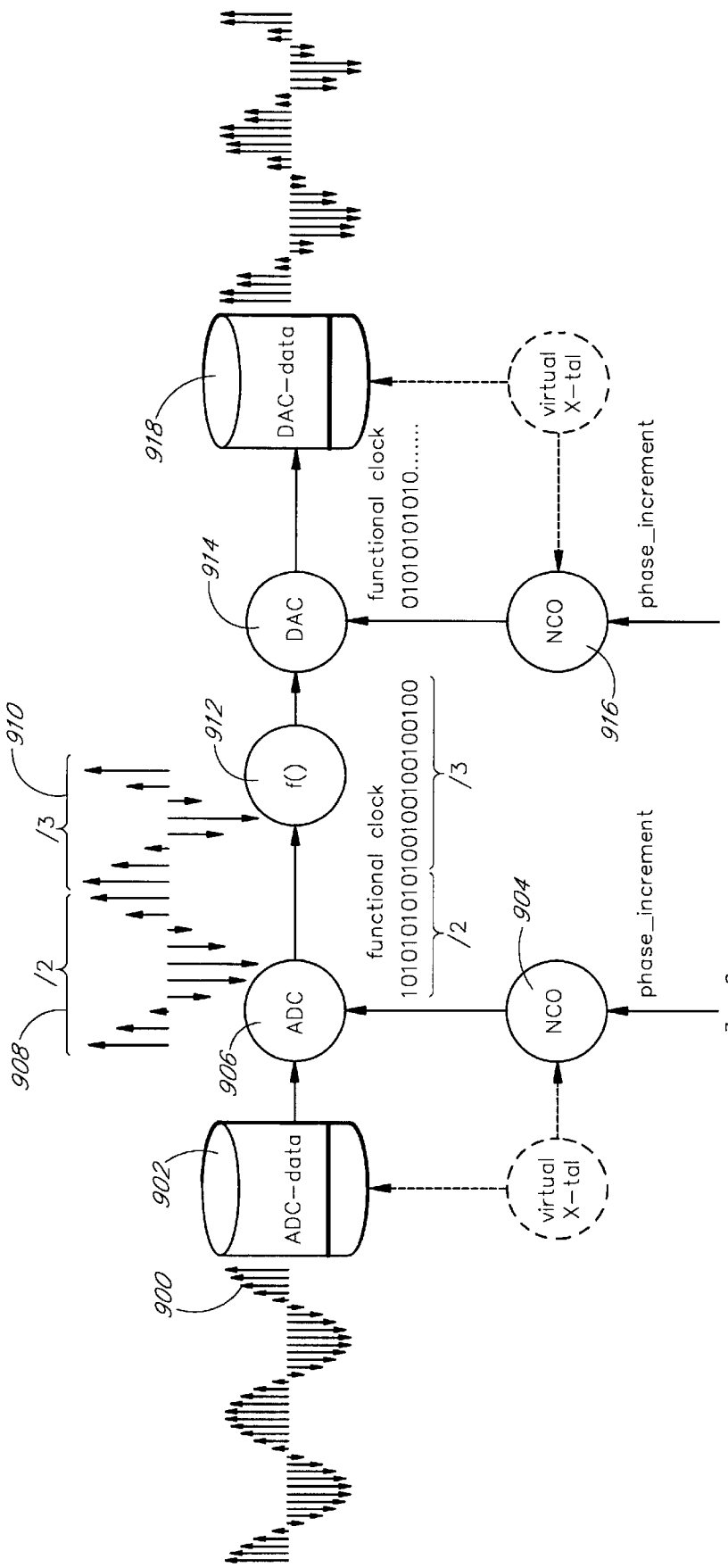
FIG. 19 illustrates implementation of a functional clock using analog-to-digital simulation and digital-to-analog simulation.

The processes so far described have been referenced without a clock input, since they are all on the functional level. A clock is an implementation issue. However, real-time systems also have at least one functional clock. A clock signal can be computed by a process, and can be used to close a PLL loop, for instance. Functional clocks are introduced into a system in accordance with the present invention by using an ADC or a DAC process, which both have a functional clock input. The assumption is that the "analog" input data of an ADC are sampled at least the clock rate which is also the implementation clock rate of the clock generator. This is illustrated in FIG. 19. The "analog" output of the DAC is interpreted in the same way. The DAC produces a staircase function, which corresponds to a 0-th order interpolation to the reference clock rate. It should be noted that no actual conversion from analog-to-digital domain is provided. The illustration in FIG. 19 is a way to simulate the impact of the conversion process, while maintaining process control in the digital domain.

More particularly, as depicted in FIG. 19, a sine wave input 900 which comprises a discrete sine wave with a very high sample rate is collected as ADC data 902 (data representing the analog sine wave). The input signal can be down-converted depending upon the phase increment of the numerically controlled oscillator 904 of the ADC 906. As represented in FIG. 19, depending upon the phase increment of the numerically controlled oscillator 904, a particular divide by factor can be attributed to the input signal. FIG. 19 depicts divide by 2 and divide by 3 factors and the resulting sine wave representations 908, 910. The input signal can then be processed by a process block 912. The conversion to analog is then represented by a digital up-converter 914 which is sampled by the numerically controlled oscillator 916. The resulting data is depicted as the DAC data 918. As depicted in FIG. 19, the output data is more of a step function than the discrete sine wave which is provided at the input due to the down-conversion and up-conversion.

This strategy relies on the presence of a common reference clock (X-tal clock). If this clock is not explicitly present in the system, a virtual common clock is defined, with an appropriate high frequency.

Figure 20A:
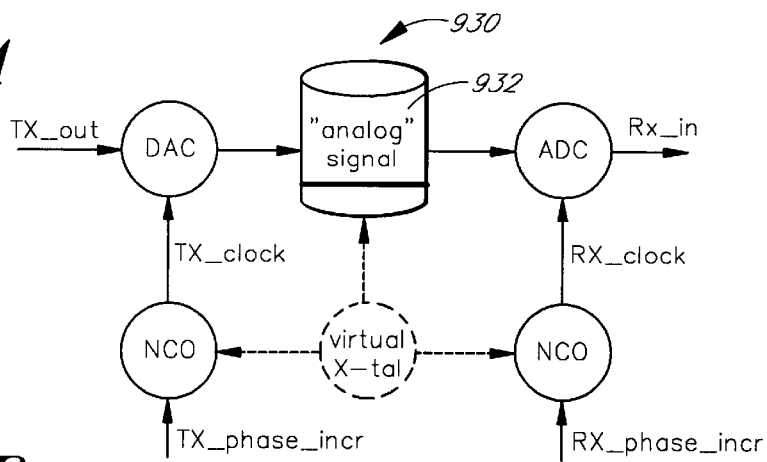
FIGS. 20A, 20B, and 20C illustrate a similar concept similar to FIG. 19, except they illustrate transition from a digital domain to an analog domain where processing of the signal is accomplished, followed by transition to the digital domain.
Figure 20B:
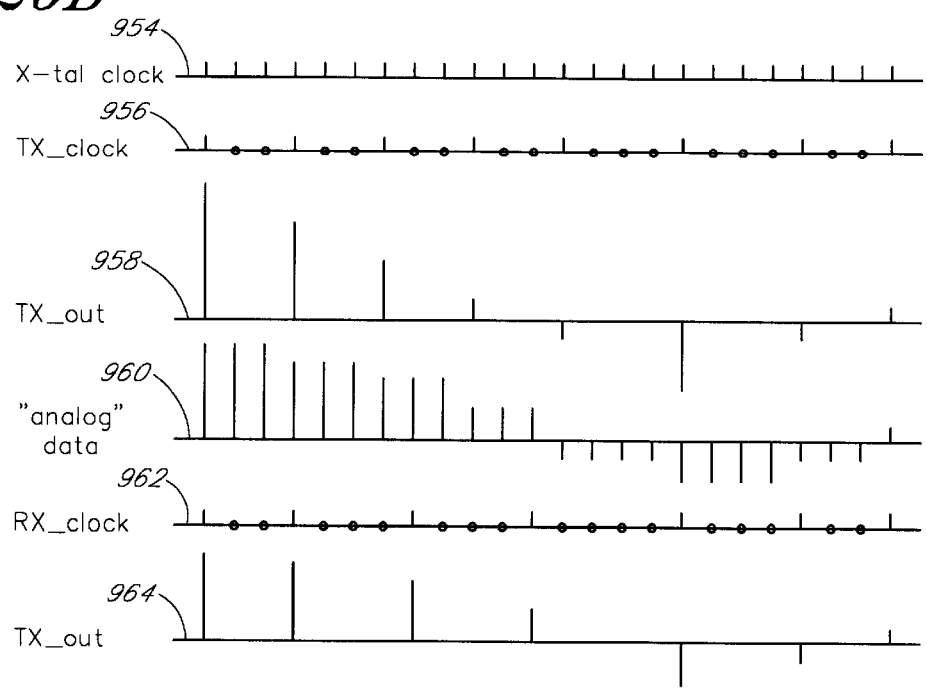
Figure 20C:
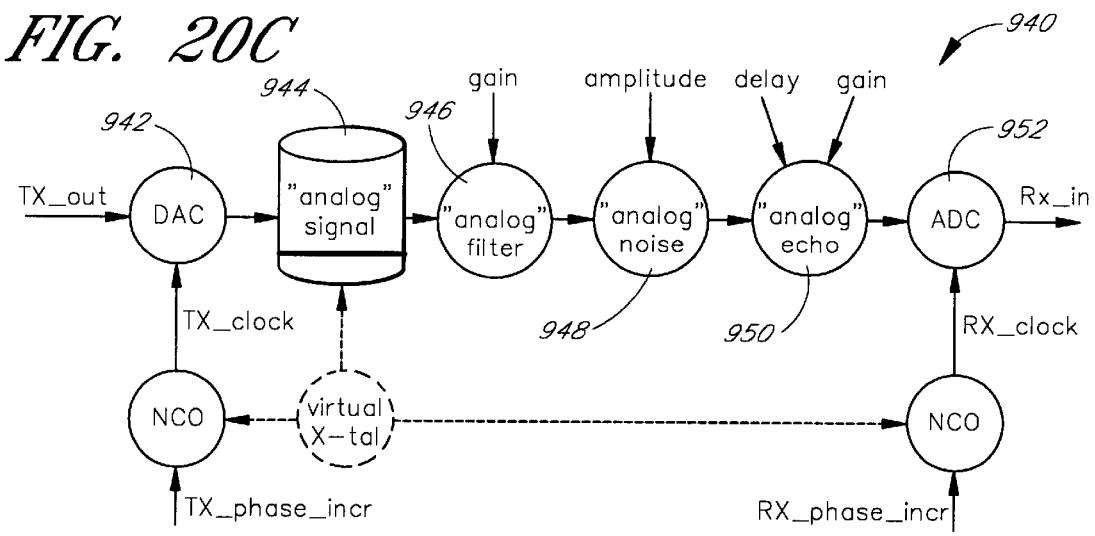

An example of simulating the DLL loop and channel effects is provided by creating a model of the channel is depicted in FIG. 20. A general model 930 is depicted at the top of FIG. 20. The model 930 involves accepting digital data and converting it into the simulated "analog" domain and then back to the digital domain. It should be noted in both examples, that all data remains digital as in FIG. 19. The digital to analog conversion process and the analog to digital conversion process are simulated processes rather than actual conversion. This is the reason for the designation in FIG. 20 with quotation marks around the "analog" signal 932. This simulation provides a model for the signal in the analog domain in order to simulate lop and channel effects.

As described above, the purpose may be to close a PLL loop or a DLL loop without having the analog channel present. As depicted in FIG. 20, a more detailed model 940 is provided at the bottom of the figure. As seen, the transmission data in the digital domain is processed through a simulated digital-to-analog conversion process 942 to provide the simulated "analog" signal 944. Then the gain, amplitude, delay and subsequent gain can be provided by the "analog" filter 946, the "analog" noise 948, and the "analog" echo 950. These processes provide a model for the channel and loop effects of the analog transmission. A down-conversion is provided in the "analog"-to-digital conversion process (which is not synchronous in the present embodiment) 952. In other words, the "analog"-to-digital conversion process 952 models a analog to digital converter without synchronization.

The signals resulting from the model 940 are depicted in FIG. 20 as the crystal clock 954, the transmission clock 956, the transmission output data 958, the "analog" data 960, the receiver clock 962, and the receiver input data 964. As explained above, it will be understood that this data remains in the digital domain, but simulates or models the analog channel.

IPC Silicon Implementation Issues.

Implementing a process into a dedicated or embedded silicon processor is completed with an appropriate compiler. In this application, these compilers are called host compilers. They are encapsulated to behave like IPC compilers.

The following description provides some examples of different host compiler slices that have been encapsulated. These include simulation implementations, Cathedral-III and the ARM microcontroller core processor.

Cathedral-III Implementation of IPC.

Cathedral-III is the Silage host compiler for fast hardware sub-systems. To connect two Cathedral-III processors, both an IPC-compatible processor controller and the IPC I/O interface hardware are used.

The processor is configured to warn the outside world that input data are needed in the next clock cycle and that output data are available in the current clock cycle.

For Cathedral-III processors that run on the same master clock (which is often the case), a simplifications of the generic 4-phase handshake IPC protocol are made. The synchronization of the asynchronous signal transitions is no longer needed, but all other IPC functions remain.

These IPC functions of the interfaces indicate whether or not a transfer can occur (strobe), should occur (guard), and whether or not it has actually occurred (ack). This is because the processors may be blocked from the input and/or the output by other processors in the system. In other words, the IPC interfaces on a Cathedral-III processor are used in order to fit IPC into a system context.

Compared to the generic four-phase handshake protocol, the simplification for Cathedral-III processors lies in the moment the transfer happens: all transfers happen on the rising clock edge of a common clock. In this sense, the data need no longer precede the strobe, as the strobe only indicates valid data in a particular clock cycle, and not at a particular moment in the clock cycle. Accordingly, the str and ack are decoupled. The ack indicates only whether the data have been accepted in a particular clock cycle, and not the moment the writing devices can release the 'data' and the 'str' signals.

The IPC interfaces avoid direct coupling and interaction between processors. Otherwise the design is no longer modular from a specification or an implementation point of view.

If a processor is blocked from its input, because it requires data on a particular port, and the strobe signal is low, the processor should block successor processors some time later. In order to avoid an asynchronous ripple path, of which the length depends on the number of successor processors, blocking takes a fall clock cycle of the common clock. The same holds for output blocking: if a processor blocks output because the output data have not been acknowledged, that processor blocks its predecessor processor in the next clock cycle.

The net effect is a pipeline of processors that run at maximum speed when no processor stalls. The transfer from one processor to the next takes a clock cycle, but this is pipelined. If one processor stalls, the stalling propagates through the chain (backwards or forwards), one processor per clock cycle. Only one intermediate storage buffer is needed to temporarily store the pipeline intermediate results. This is because it takes exactly one cycle to stop the preceding processor, so the blocking processor's results should be stored in order to prevent loss of data.

The input and output circuits (both blocked and unblocked), implementing this functionality are available as a library of VHDL IPC modules. Both rising and falling edges of the common clock have been used to implement the signal transitions in the IPC modules. The input and output circuits are depicted in FIGS. 22–25 for each of the four I/O protocols. The architecture of FIGS. 22–25 correspond to the general IPC communication buffer architecture depicted in FIG. 4 and explained above. Further detail of the interface architecture is provided in FIGS. 22–25 for IPC implementation for common-clock Cathedral-III processors.

An input block 1000 converts IPC signals (data_i, str_i and ack_i) into Cathedral-III input port signals (data, rd). The Cathedral-III input port signals are well understood in the art. The input port signal "rd" 1002 goes high one clock cycle before the Cathedral-III processor needs data on the "data" lines 1004.

The input block 1000 also has a data register 1006 for the data lines 1008. Normally, the input data transmits directly through the input data buffer 1006. However, if the processor 1010 cannot accept the data, the data buffer 1006 stores the data until the processor is ready to accept the data.

An output block 1020 converts Cathedral-III output port signals (data, wr) into IPC communication signals (data_o, str_o, and ack_o). The remaining logic in the input block 1000 and output block 1020 control the receive and transmit signals for the IPC communications and the enable reset and disable signals of a synchronization circuit 1030.

The synchronization circuit 1030 generates the clock for the Cathedral-III processor using 'phi' as the input reference clock. If the Cathedral-III processor is ready for input data, but no input data is provided, the input clock to the Cathedral-III processor is halted until data becomes available for the Cathedral-III processor. If the Cathedral-III processor 1010 is ready to write output data, but the output data are not accepted, the clock to the processor 1010 is stopped by the synchronization block 1030 until room is available in the accepting device buffer.

A reset 'rst' is provided for the IPC circuits 1000, 1020 and 130, and the Cathedral-III 1010. This is important in that the input and output blocks and the processor have internal states which are resettable. The input clock (phi) is a double clock. As seen in the FIGS. 22–25, some of the registers and devices are clocked by phi and others by phi bar.

A register 1032, which provides a register of the input of the processor reset 1011 for the processor 1010, is only necessary if the processor 1010 has no imbedded register at its reset input 1011. In addition, if the processor 1010 has input registers for numerous inputs, the multiplexer 1007 may be provided to select input from the delayed input data or the data directly on the input lines 1008. The data is thereby automatically preserved in the processor registers during non-read cycles until the next read. This prevents latency.

Figure 23:
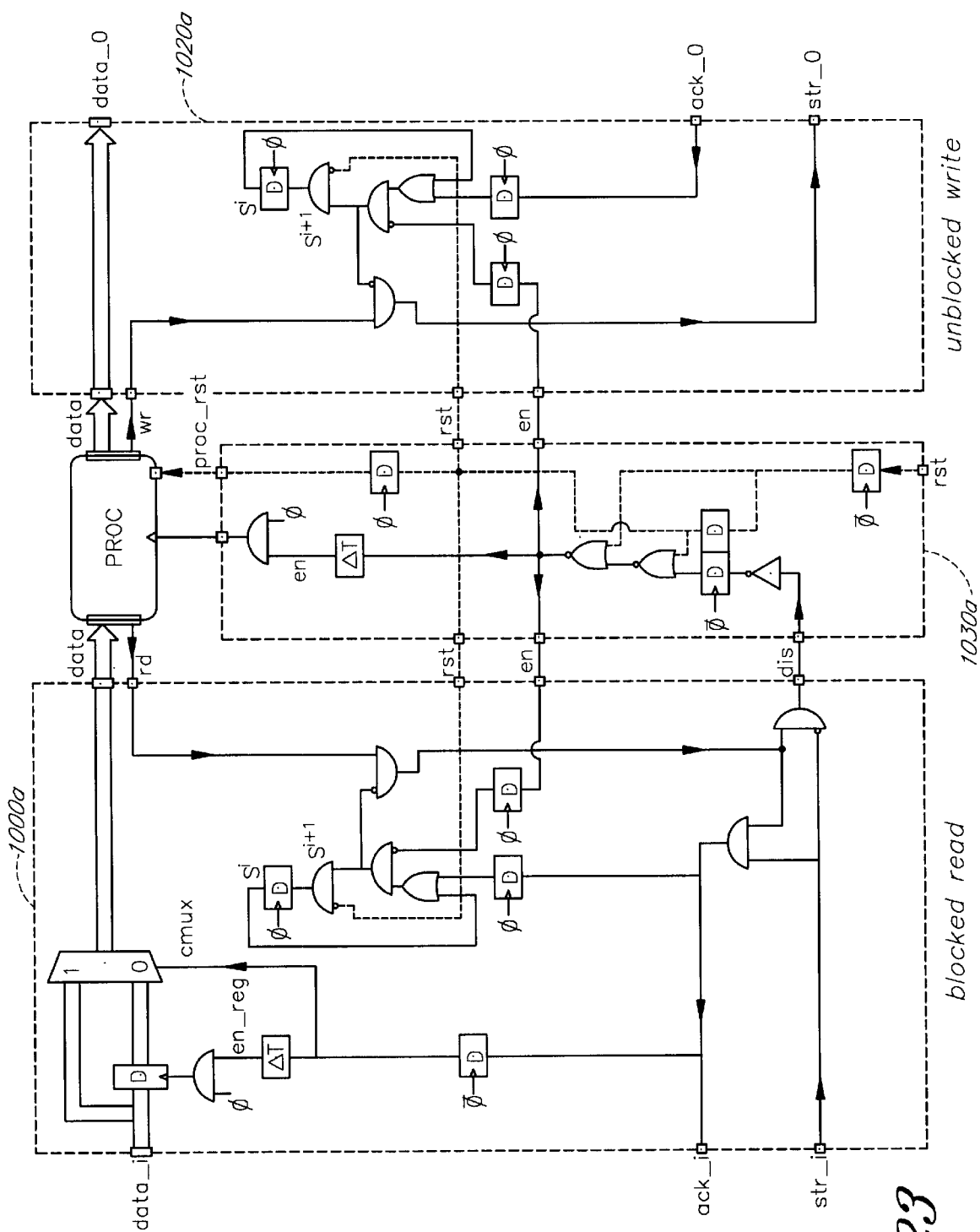
FIG. 23 illustrates a blocked write, blocked read IPC implementation for a common-clock Cathedral-III processor.

FIG. 23 depicts a blocked-write, unblocked-read IPC implementation for common-clock Cathedral-III. The blocked-read input block 1000*a* is the same as the blocked-read input block 1000 in FIG. 22. However, the unblocked-write output block 1020*a* differs. Because it is an unblocked-write, the output block 1020*a* has no disabling circuitry to disable the processor. Accordingly, the unblocked-write output block 1020*a* does not have the gate 1034 to provide the "bis" signal to the synchronization block 1030.

Figure 24:
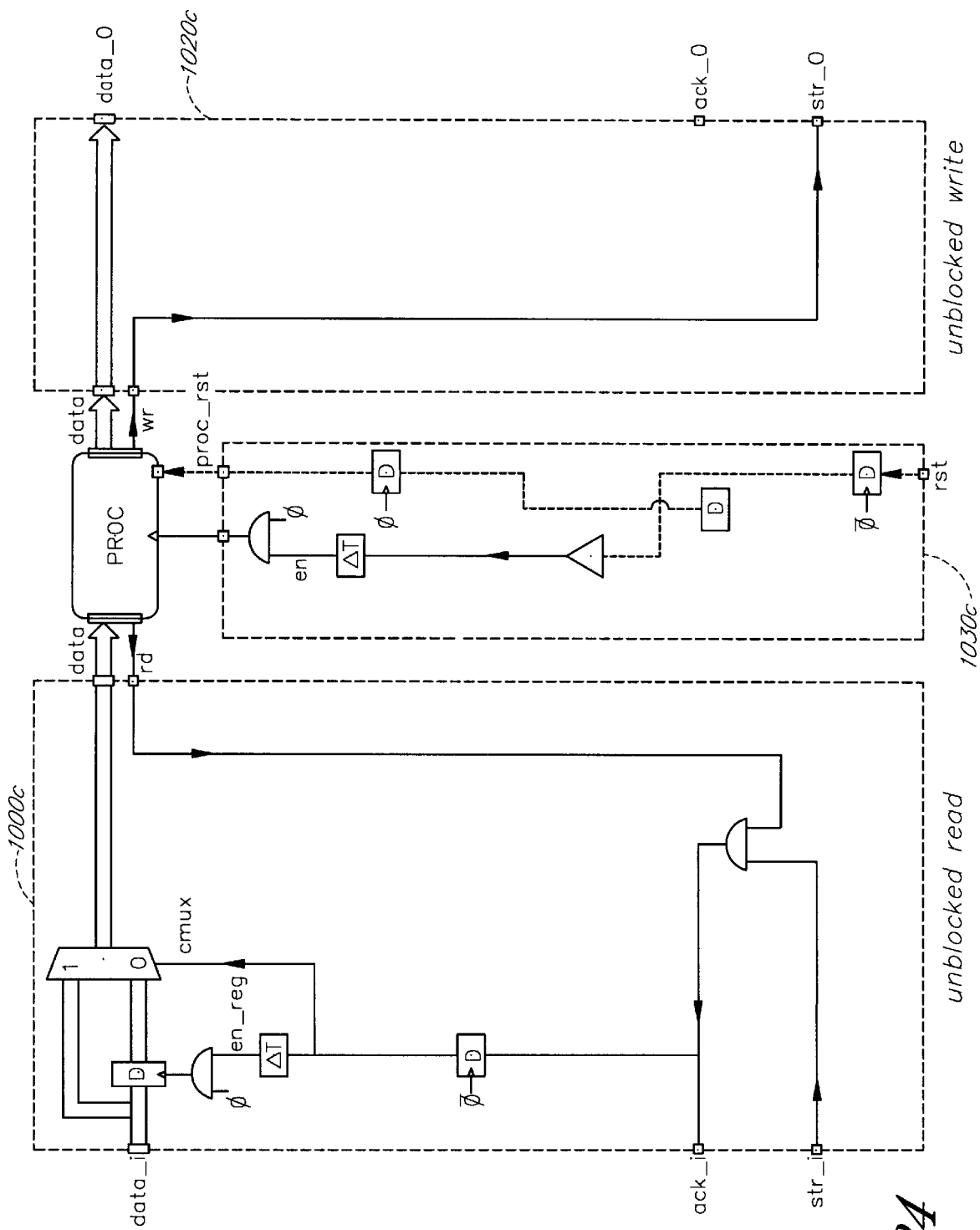
FIG. 24 depicts an unblocked write, blocked read IPC implementation for common-clock Cathedral-III processor.
Figure 25:
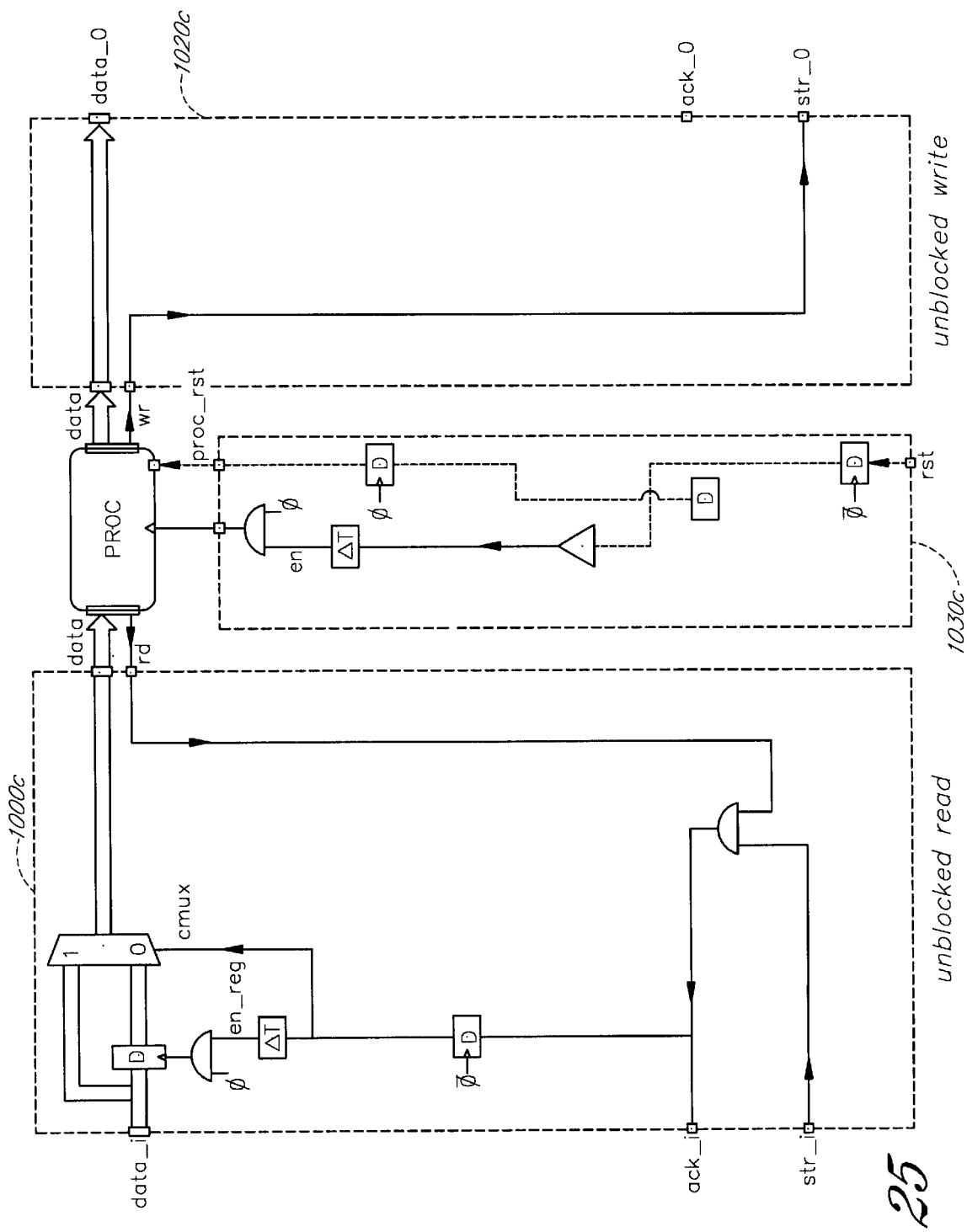
FIG. 25 depicts an unblocked write, unblocked read IPC implementation for common-clock Cathedral-III processor.

FIG. 24 depicts an unblocked-write, blocked-read IPC implementation for common-clock Cathedral-Ill. FIG. 24 is very similar to FIGS. 22 and 23; however, the input block 1000*b* provides an unblocked-read IPC communication. Therefore, no disable circuitry is provided for the input block 1000*b* to disable the processor 1010*b* via the synchronization circuit 1030*b*. FIG. 25 depicts an unblocked-write, unblocked-read IPC implementation for common-clock Cathedral-III architecture. For FIG. 25, no disable circuitry is provided for either the input or output blocks 1000*c*, 1020*c* because both operations are unblocked. Accordingly, no disabling circuitry is provided and the only reset to the synchronization block 1030*c* is an external reset which propagates through the synchronization block 1030*c*.

ARM Implementation and IPC.

The ARM can be used to run embedded assembly programs, C programs and Silage descriptions. S2C can be used to generate C-code from a Silage specification, and that C-code can be compiled on the ARM processor.

The interface between a Cathedral-III processor and an ARM consists of 2 parts:
  interface hardware to convert the physical I/O protocol of the ARM to the generic IPC protocol signals (data, strobe and ack); and
  software drivers for the interface hardware, that can be linked with any C program.
  ARM I/O Drivers.

The four I/O functions (blocked and unblocked read and write) are implemented as assembly functions, that can be linked with any C program. A file ipcio.h is provided to replace the file stdio.h for inclusion in the C programs. These I/O functions use the pins of the ARM processor, which are interfaced in hardware to the generic IPC protocol. The ARM processor and interface then behave as an IPC processor as defined above.

Next follows a possible implementation of the "ipcio.h" include file.

```
#define ARMWORD int
              extern void BW(ARMWORD, ARMWORD    );
              extern int UBW(ARMWORD, ARMWORD    );
__value_in_regs  extern void BR(ARMWORD, ARMWORD   *);
__value_in_regs  extern int UBR(ARMWORD, ARMWORD   *);
```

The ARM processor has only one data bus, so all conceptual channels are time-multiplexed over the bidirectional bus. There are two distinct options to implement this: memory-mapped I/O and coprocessor I/O. Memory-mapped I/O is a more general applicable technique, and the details are disclosed in the following text. Memory-mapped I/O is used on the ARM processor, and a dedicated Cathedral-III interface is used for the Cathedral-III processor. This interface has the following functions:

- address decoders to multiplex and demultiplex the various IPC channels over the ARM bus
- read/write data direction detection
- concatenation of 32-bit words into longer I/O signals
- input and output registers to temporarily buffer the I/O signals
- synchronization of the physical ARM protocol to the physical Cathedral-III protocol
- decoding of the blocked/unblocked parameter bit
- status return for unblocked I/O via the ABORT pin of the ARM In the hardware of the IPC-interface, there is no difference between a blocked and an unblocked port. A port could be both blocked or unblocked. This depends on what kind of instruction is sent. Reading from address 0x000 means a blocked read from port 0, reading from address 0x400 means a unblocked read from port 0. The IPC-interface looks at bit 10 and bit 11 of the address as operation codes.

For low-level simulation, execution of the low-level ASM code for I/O is desired, but a non-interfering correction to the host operating system to do co-simulation is also desired. Therefore, the memory C-model is adapted as follows:

ASM implementations for BW( ), BR( ), UBW( ), UBR( ) are available that access particular fixed memory locations. The unblocking routines return a status.

Also GetBIOPort( ) is implemented in ASM (assembly code), to set up a table linking the keys to port numbers (0,1,2, . . . ), which can be mapped onto the physical I/O addresses.

| key | port | addresses |
|---|---|---|
| key1 | 0 | 6000/6400 |
| key2 | 1 | 6004/6404 |
| key3 | 2 | 6008/6408 |
| .... | ... | ... |

The ports are assigned in the order of the incoming keys (GetBIOPort( ) calls). Ports are not closed. If the designer ensures that the keys are valid ports, GetBIOPort( ) simply passes the key to the port.

In each memory cycle, the address is decoded, and if the address is an I/O address, a host IPC I/O command is executed along with the memory access.

Note also that for host connections, the memory interface can dynamically allocate new host ports as they are needed.

The ASM implementation for minimal functionality is shown below.

```
;;;;;;;;;;;;;;;;;;;;;;;;;;;;;;;;;;
;;;
;;; ARM library for the IMEC B/UB protocols
;;;
;;;;;;;;;;;;;;;;;;;;;;;;;;;;;;;;;;
;;; BW(WORD port, WORD data)
;;;
;;; port      a1
;;; data      a2
;;;
;;; base_address a3
;;;
;;;
;;; Assume &9000-&93FC to be 256 blocked channels (1 channel is one word of 4 bytes)
;;; and the range &9400-&94FC to be unblocked channels
;;;; The 2 LSB bits are not used (internal 4-bytes-in-1-word addressing)
;;;; so these channels completely occupy the ranges &9000-&93FF and &9400-&97FF
;;;
;;;;;;;;;;;;;;;;;;;;;;;;;;;;;;;;;;
        AREA Channels, DATA
;;; reserve 2 tables of 256 channels (blocked and unblocked)
;;; B_IO_BASE *       &6000
;;; UB_IO_BASE *      B_IO_BASE + &400
 &6000
IO_BASE         # &512
B_IO_BASE EQU IO_BASE
UB_IO_BASE EQU B_IO_BASE + &400
;;;;;;;;;;;;;;;;;;;;;;;;;;;;;;;;;;
        AREA GetBIOPort ( ), CODE, READONLY
        EXPORT BW
GetBIOPort
;;; Simply pass argument a1 back as return value in a1.
        MOV pc, lr      ; return
;;;;;;;;;;;;;;;;;;;;;;;;;;;;;;;;;;
```

```
        AREA BW(W), CODE, READONLY
        EXPORT BW
BW
        MOV a3,#B_IO_BASE        ; load the I/O base address
        STR a2, [a3,a1,LSL #2]   ; interface hardware responsible for blocking here!
        MOV pc, lr               ; return
;;;;;;;;;;;;;;;;;;;;;;;;;;;;;;;;;;;;;;;;
        AREA UBW ( ), CODE, READONLY
        EXPORT UBW
UBW
        MOV a3, #UB_IO_BASE      ; load the I/O base address
        MOV a4, #1               ; default return successful status result
        STR a2, [a3,a1,LSL #2)   ; interface hardware responsible for blocking here!
        MOV a1,a4                ; return value
        MOV pc, lr               ; return
;;;;;;;;;;;;;;;;;;;;;;;;;;;;;;;;;;;;;;;;
;;;; BR(WORD port, WORD* data)
;;;
;;;; a1 port
;;;; a2 pointer to data
;;;; a3 temp register
;;;
        AREA BR( ), CODE, READONLY
        EXPORT BR
BR
        MOV a3, #B_IO_BASE       ; load the I/O base address
        LDR a3, [a3,a1,LSL #2]   ; interface hardware responsible for blocking here!
        STR a3, [a2,#0]          ; annotate result in C-variable via pointer in a2
        MOV pc, lr               ; return
;;;;;;;;;;;;;;;;;;;;;;;;;;;;;;;;;;;;
        AREA UBR( ), CODE, READONLY
        EXPORT UBR
UBR
        MOV a3, #UB_IO_BASE      ; load the I/O base address
        MOV a4, #1               ; default return successful status result
        LDR a3, [a3,a1,LSL #2]   ; interface hardware responsible for data ABORT here!
        STR a3, [a2,#0]          ; annotate result in C-variable via pointer in a2
        MOV a1, a4               ; return value
        MOV pc, lr               ; return
;;;;;;;;;;;;;;;;;;;;;;;;;;;;;;;;;;
        END
```

The unblocked I/O functions return a status indicating whether or not a handshake has actually been executed during the call.

The memory abort input pin (ABORT) of the ARM is used to signal the status from the interface. If the ABORT signal goes high, the ARM6 processor switches to Abort32 mode. This means changing the Current Program Status Register (CPSR) for the ARM and forcing the PC to fetch the next instruction from address 0x10, the data abort vector. Since the abort always occurs during a data fetch, the abort is always a data abort, never a prefetch abort. In the data abort vector, a jump to the data abort exception handler is stored. The handler itself is located at address bc0, and is shown below.

```
;;;;;;;;;;;;;;;;;;;;;;;;;;;;;;;;;;;;;;;;;;;;;
;;;
;;;; ARM IPC data abort handler
;;;
;;;;;;;;;;;;;;;;;;;;;;;;;;;;;;;;;;;;;;;;;;;;;
;;;
;;;; InitIO( ) is the exception handler for IPC interface data aborts,
;;;; signaling unsuccessful unblocked I/O
;;;
;;;; It uses a4 as a temp register. Fill it up with default status (success = #1)
;;;; In case of data abort, use exception handler to replace with
;;;; status unsuccessful #0
;;;
        AREA InitIO( ), CODE, READONLY
        EXPORT InitIO
InitIO
        MOV a4,#&0               ; overwrite default with unsuccessful status #0 in a4
        SUBS PC,R14,#&4          ; return from data abort exception handler, but do NOT
                                 ; retry the aborted instruction, rather skip it (therefore
                                 ; subtract 4 iso 8 from the restored PC (as if it was a
                                 ; prefetch abort . . .
;;;;;;;;;;;;;;;;;;;;;;;;;;;;;;;;;;;;;;
        END
```

This exception handler passes a status bit to register a4, which is copied to register al of the ARM at the end of the unblocked driver routine, since al is used by the ARM Procedure Call Standard (APCS) to return the integer of the C-function.

So, if an unblocked I/O has been successfully completed, nothing else occurs, like a normal read/write operation. If the unblocked I/O is, however, unsuccessful, the IPC-interface activates an ABORT output. The exception handler overwrites the default OK status by a fail status and restores the program counter. At the time the processor switches to Abort32 mode, the Program Counter (PC) is stored in register 14 in the abort mode (R14abt). For a data abort, the PC contains the address of the aborted instruction +8. The exception handler, therefore, does not restore the PC to the original instruction by substracting 8 from R14 and storing the address in the PC (SUBS R14, 8, PC) as expected for a normal data abort wrap-up, but restores the PC to the address of the instruction following the failed instruction by substracting 4 (four bytes being one instruction) from R14 and storing the value in the PC (SUBS R14, 4, PC). This skips the unblocked read which should be skipped, not retried, on failure. This is illustrated with an unblocked read below.

|          | MOV a3, #UB_IO_BASE | ; load the I/O base address |
|----------|---------------------|------------------------------|
|          | MOV a4,#1           | ; default return successful status result |
| PC-8 -> | LDR a3, [a3,a1,LSL#2] | ; interface hardware responsible for data ABORT here! |
| PC-4 -> | STR a3, [a2, #0]    | ; annotate result in C-variable via pointer in a2 |
| PC ---> | MOV a1, a4          | ; return value |
|          | MOV pc,1r           | ; return |

IPC and Interrupt-based I/O on the ARM.

Assume two processes, P1 and P2, that communicate. However, P1 writes equidistant samples, while P2 requires input bursts.

A direct coupling via the generic IPC interface (blocked read, blocked write) is behaviorally correct, but P2 wastes time waiting for input samples.

Figure 26:
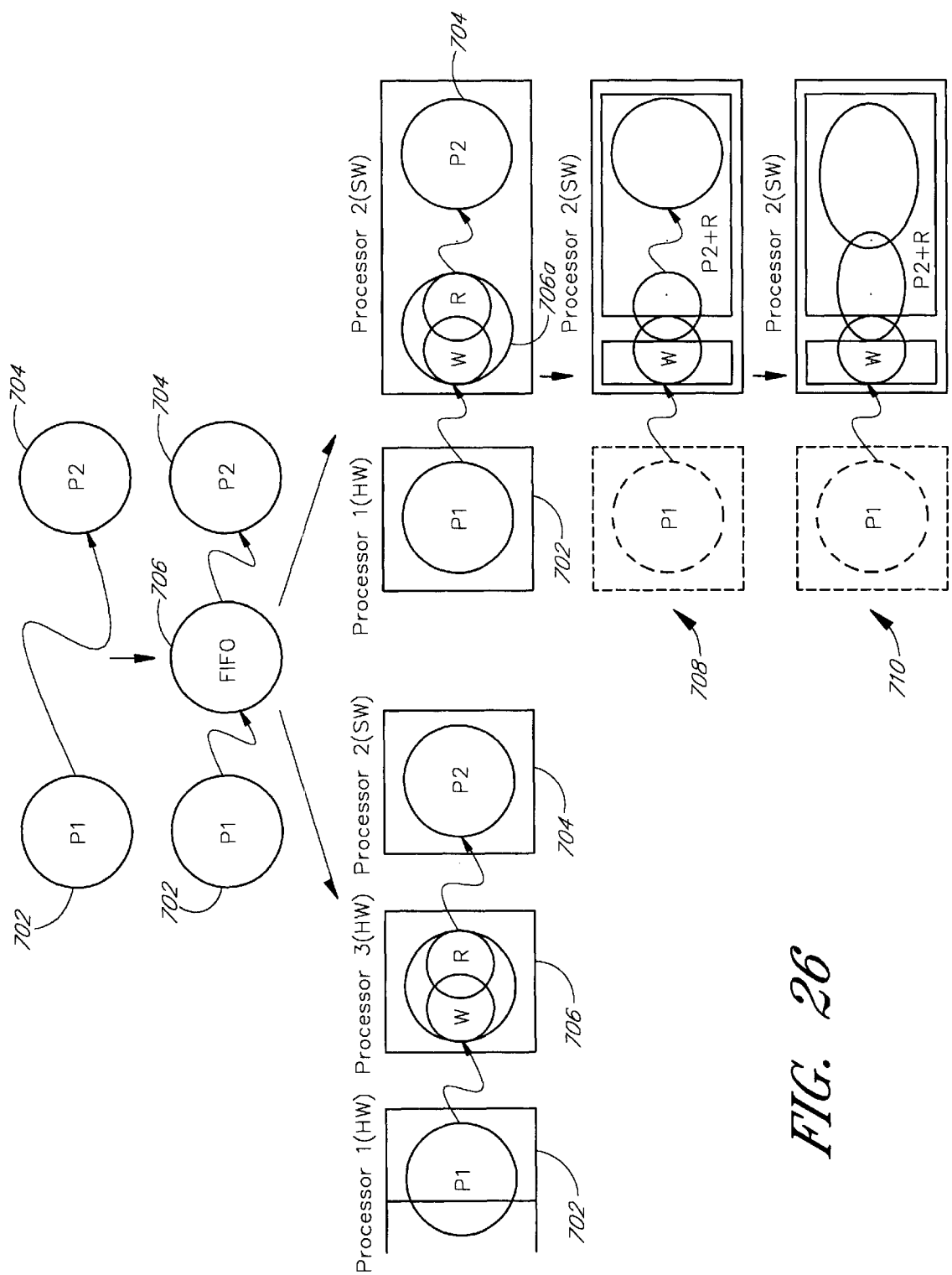
FIG. 26 illustrates the implementation of a defined FIFO memory channel in order to prevent blocked reads and writes in the IPC protocol of the present invention.

If a FIFO channel process is provided between P1 and P2, the overall behavior is not changed. The I/O timing constraints are elapsed because it introduces two new process control threads: a FIFO-write and a FIFO-read thread. Provided the FIFO is sufficiently long, the FIFO-write prevents P1 from blocking on its output. The FIFO-read prevents P2 from blocking on its input. The general concept of providing the FIFO between processor P1 and processor P2 is shown at the top of FIG. 26 with the FIFO 700 interposed between processor P1 702 and processor P2 704.

If P1 and the FIFO are implemented in hardware, and P2 is implemented in software, three processes P1, FIFO and P2 can be readily interconnected by IPC implementations. This is depicted in the illustration 705 in FIG. 26 with P1 702, P2 704 and the FIFO (P3) 706.

If the FIFO is implemented in software, one of the processors P1 or P2 can also be used to provide the FIFO. For instance, P2 704 could be chosen as the processor which also provides a software FIFO 706a. This is particularly useful if processor P2 is not utilizing all of its processing time. In such case, memory for P2 can be used for the FIFO 706a. In such a situation, the two FIFO threads communicate via a shared memory in P2 704; P2 704 executes the FIFO code.

As the FIFO introduces two new threads, three threads execute in parallel on P2:P2, the FIFO-read and the FIFO-write. As the FIFO-read is "in phase" with the functional thread of P2, the FIFO read and functional thread of P2 can be interleaved in P2. As a separate processor, P1 has its own thread.

The FIFO-write thread can be implemented as an interrupt server on the processor P2. Physically, the strobe 'str' of P1 is connected to the IRQ of P2 in order to cause an interrupt for the write FIFO thread. This is further represented in FIG. 26 by the processor configuration blocks 708 and 710 of FIG. 26.

For the simulation and the implementation of the above specification, an interrupt server should be installed from a C program, and to a "fast interrupt request" FIQ (e.g., interrupt raises a signal interrupt (SIGINT) to activate the server. An example of such a C program, where a main program P2 reads from a software FIFO, and an interrupt server "irq" writes to it, is shown below.

```
#include <signal.h>
#include <stdio.h>
#define N 10
int fifo [N];
int rp = 0;
int wp = 0;
/********************************/
int writeFifo (int data)
{
int full;
        full = 0;
        fifo[wp] = data;
        wp = (wp >=(N-1))? 0:(wp++);
        return(full) ;
}
/********************************/
int readFifo(int *data)
{
int empty;
        empty = 0;
        *data = fifo[rp];
        if (rp >= (N-1)) {
            rp = 0;
        } else {
            rp = rp + 1;
        }
        return(empty);
}
```

-continued

```
/********************************/
void irq(int sig)
{
int data;
char ctrl,nl;
int full;
            signal (SIGINT, irq);    /* handler is by default unloaded on HP */
            ctrl = getc(stdin);
            printf("Input: "); scanf ("%d", &data);
            ctrl = getc(stdin);
            full = writeFifo(data);
}
/********************************/
main( )
{
int cycle = 0;
int empty;
int data;
            signal (SIGINT,irq);
            do {
                empty = readFifo(&data);
                cycle ++;
            } while (data >= 0);
}
```

Although the preferred embodiments of this invention have been disclosed herein, the inventions may be embodied in other specific forms without department from the essential characteristics described in herein. The embodiments described above are to be considered in all respects as illustrative and not restrictive in any manner. Any and all changes which come within the meaning and range of equivalency of the appended claims are to be considered within their scope.

What is claimed:

1. A signal receiving system comprising:
   a receiver chain with a down-converter, a receiver filter, and a gain control;
   a receiver chain clock generator coupled to said receiver chain;
   means for programming said receiver chain and said clock generator; and
   a processor programmed to selectively complete pilot demodulation, traffic demodulation and noise estimation on signals received from the receiver chain.

2. The system of claim 1, wherein said system is realized as an integrated circuit.

3. The system of claim 1, further comprising supporting circuitry connected to the signal receiving system to form a position determination device.

4. The system of claim 3, wherein said position determination device is a Global Position Determination terminal.

5. The system of claim 1, wherein the down-converter is configured to operate at a programmable frequency.

6. The system of claim 5, wherein said means for programming said receiver chain and said clock generator act as a feedback control system by providing said programmable frequency.

7. The system of claim 1, wherein said pilot and traffic demodulations are independent of each other.

8. The system of claim 1, wherein the pilot demodulation is performed on a pilot channel, and wherein the pilot channel is used for synchronization purposes and network management.

9. The system of claim 1, wherein the pilot demodulation is performed on a pilot channel, or wherein the pilot channel is selectively discarded depending on the demodulation scheme.

10. The system of claim 9, wherein the pilot channel is discarded for synchronous code division multiple access (CDMA) or non-CDMA operation.

11. The system of claim 1, wherein the results of the pilot demodulation are not directly applied to the results of the traffic demodulation.

12. A customizable signal receiving system comprising:
    a programmable receiver chain with a down-converter, a receiver filter, and a gain control;
    a programmable receiver chain clock generator coupled to said receiver chain; and
    a programmable processor configured to selectively complete at least one of pilot demodulation, traffic demodulation and noise estimation on signals received from the receiver chain.

13. The signal receiving system of claim 12, further comprising a programming module configured to program said receiver chain and said clock generator.

14. The signal receiving system of claim 12, further comprising a terminal configured to program said receiver chain and said receiver chain clock generator.

15. The signal receiving system of claim 14, wherein the terminal comprises a computer and user interface.

16. The signal receiving system of claim 12, wherein the programmable processor is configured to program said receiver chain and said clock generator.

17. The signal receiving system of claim 12, wherein the programmable processor performs application specific digital functions.

18. The signal receiving system of claim 17, wherein the application specific functions include at least one of final demodulation and deformatting, error correction, or voice processing.

19. The signal receiving system of claim 12, wherein the pilot demodulation is performed on a pilot channel, and wherein the pilot channel is used for synchronization purposes and network management.

20. The signal receiving system of claim 12, wherein the pilot demodulation is performed on a pilot channel, or wherein the pilot channel is selectively discarded depending on the demodulation scheme.

21. The signal receiving system of claim 20, wherein the pilot channel is discarded for synchronous code division multiple access (CDMA) or non-CDMA operation.

22. A customizable signal receiving system comprising:
a receiver chain with a down-converter, a receiver filter, and a gain control;
a receiver chain clock generator coupled to said receiver chain;
means for programming said receiver chain and said clock generator; and
a processor programmed to selectively complete pilot demodulation, traffic demodulation and noise estimation on signals received from the receiver chain, wherein pilot information resulting from the pilot demodulation is selectively discarded.

23. A customizable signal receiving system comprising:
a receiver chain with a down-converter, a receiver filter, and a gain control;
a receiver chain clock generator coupled to said receiver chain;
means for programming said receiver chain and said clock generator; and
a processor programmed to selectively complete pilot demodulation, traffic demodulation and noise estimation on signals received from the receiver chain, wherein pilot information resulting from the pilot demodulation is used for synchronization purposes.

24. A customizable signal receiving system comprising:
a receiver chain with a down-converter, a receiver filter, and a gain control;
a receiver chain clock generator coupled to said receiver chain;
means for programming said receiver chain and said clock generator having a clock frequency memory; and
a processor programmed to selectively synchronize pilot demodulation, traffic demodulation and noise estimation of signals received from the receiver chain by calculating control values for the clock frequency memory.

25. The system of claim 24, further comprising supporting circuitry connected to the signal receiving system to form a position determination device.

26. The system of claim 25, wherein the position determination device is a Global Positioning system device.

27. The system of claim 24, wherein the means for programming said receiver chain and said clock generator further comprises a gain control memory configured to store a gain control factor, a down-converter frequency storage memory configured to maintain a down-converter frequency, a demodulation procedure selection memory configured to control a receiver demodulation protocol, and a decimation factor storage memory configured to store a decimating filter factor.

* * * * *